US010777571B2

(12) United States Patent
Jung et al.

(10) Patent No.: US 10,777,571 B2
(45) Date of Patent: Sep. 15, 2020

(54) THREE-DIMENSIONAL SEMICONDUCTOR DEVICE HAVING A PERIPHERAL CONNECTION PLUG IN A THROUGH REGION BELOW A GATE STACK STRUCTURE

(71) Applicant: SAMSUNG ELECTRONICS CO., LTD., Suwon-si, Gyeonggi-Do (KR)

(72) Inventors: Eun Taek Jung, Seongnam-si (KR); Sung Hun Lee, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/137,079

(22) Filed: Sep. 20, 2018

(65) Prior Publication Data

US 2019/0237475 A1 Aug. 1, 2019

(30) Foreign Application Priority Data

Jan. 31, 2018 (KR) .................. 10-2018-0011990

(51) Int. Cl.
*H01L 27/11582* (2017.01)
*H01L 27/11573* (2017.01)
(Continued)

(52) U.S. Cl.
CPC .. *H01L 27/11582* (2013.01); *H01L 27/11573* (2013.01); *H01L 29/4234* (2013.01);
(Continued)

(58) Field of Classification Search
CPC ......... H01L 27/11556; H01L 27/11582; H01L 27/11529; H01L 27/11548;
(Continued)

(56) References Cited

U.S. PATENT DOCUMENTS 8,044,448 B2 * 10/2011 Kamigaichi ........... G11C 5/025
257/296
8,395,206 B2 3/2013 Lee et al.
(Continued)

FOREIGN PATENT DOCUMENTS

JP 2011-014817 1/2011
KR 10-2016-0029236 3/2016

*Primary Examiner* — Younes Boulghassoul
(74) *Attorney, Agent, or Firm* — F. Chau & Associates, LLC

(57) ABSTRACT

A three-dimensional semiconductor device including: a peripheral circuit structure disposed between first and second substrates and including a plurality of peripheral interconnections; a gate-stack structure disposed on the second substrate and including a plurality of gate electrodes stacked and spaced apart from each other in a direction perpendicular to an upper surface of the second substrate, wherein the plurality of gate electrodes include a lower gate electrode, a plurality of intermediate gate electrodes disposed on the lower gate electrode, and an upper gate electrode disposed on the plurality of intermediate gate electrodes; a first through region passing through the second substrate and disposed below the gate-stack structure; a second through region passing through the second substrate and the gate-stack structure; and a first peripheral connection plug passing through the first through region and electrically connecting the lower gate electrode to a first peripheral interconnection of the peripheral interconnections.

14 Claims, 56 Drawing Sheets

(51) Int. Cl.
   *H01L 27/11565* (2017.01)
   *H01L 27/11575* (2017.01)
   *H01L 29/423* (2006.01)
   *G11C 5/06* (2006.01)

(52) U.S. Cl.
   CPC .......... *G11C 5/06* (2013.01); *H01L 27/11565* (2013.01); *H01L 27/11575* (2013.01)

(58) Field of Classification Search
   CPC ......... H01L 27/11573; H01L 27/11575; H01L 27/11526–11529
   See application file for complete search history.

(56) References Cited

U.S. PATENT DOCUMENTS

| | | |
|---|---|---|
| 8,956,968 B2 | 2/2015 | Higashitani et al. |
| 9,064,724 B2 | 6/2015 | Oh et al. |
| 9,202,536 B2 | 12/2015 | Helm et al. |
| 9,953,992 B1 * | 4/2018 | Ogawa .............. H01L 27/11556 |
| 2011/0002172 A1 | 1/2011 | Kito et al. |
| 2015/0206587 A1 | 7/2015 | Hasegawa et al. |
| 2016/0071877 A1 | 3/2016 | Kim et al. |
| 2017/0179154 A1 * | 6/2017 | Furihata ............ H01L 27/11524 |
| 2018/0277477 A1 * | 9/2018 | Ishihara ............ H01L 27/11582 |
| 2019/0229125 A1 * | 7/2019 | Zhou ................ H01L 21/76816 |

\* cited by examiner

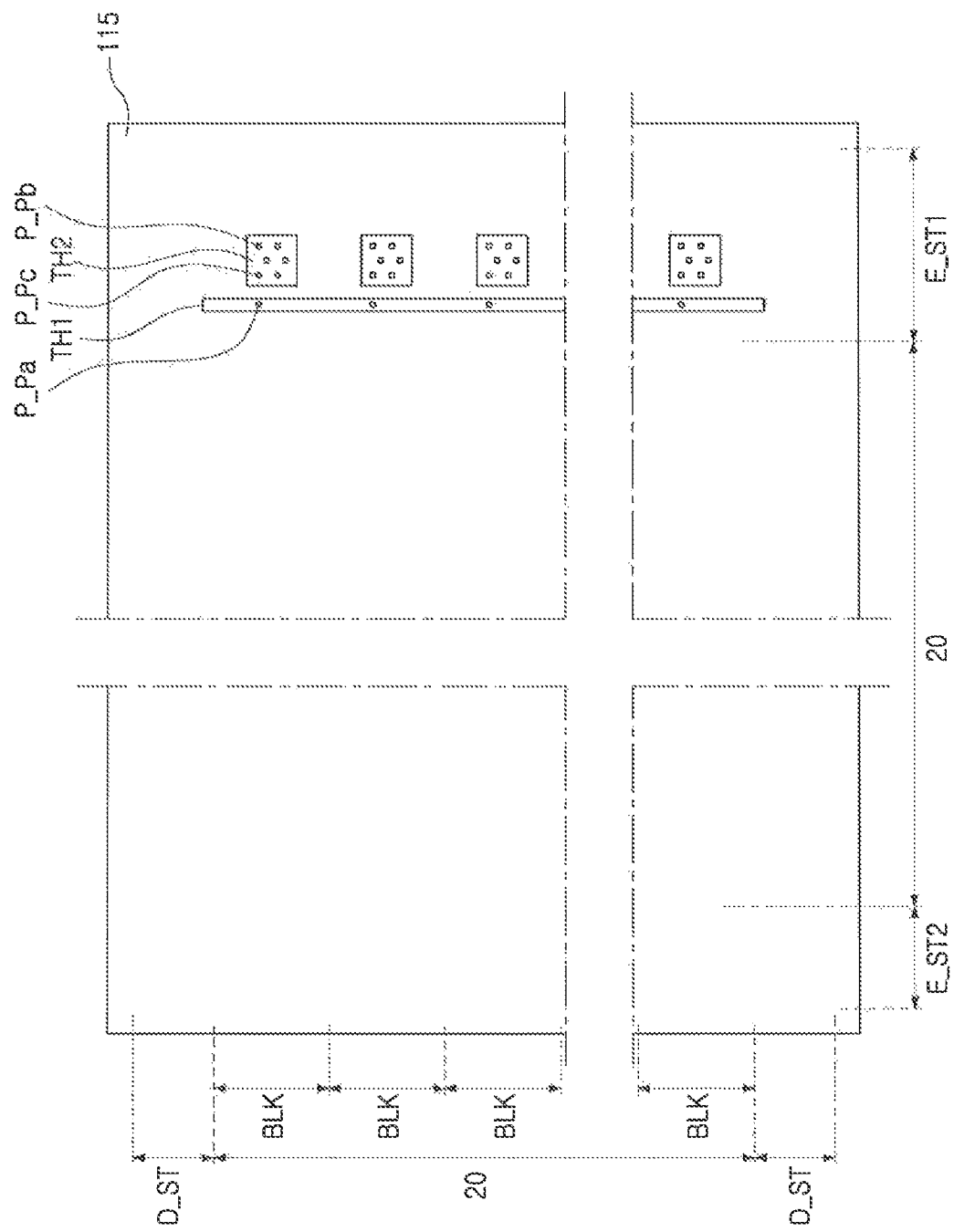

THREE-DIMENSIONAL SEMICONDUCTOR DEVICE HAVING A PERIPHERAL CONNECTION PLUG IN A THROUGH REGION BELOW A GATE STACK STRUCTURE

CROSS-REFERENCE TO RELATED APPLICATION(S)

This application claims priority under 35 U.S.C. § 119 to Korean Patent Application No. 10-2018-0011990 filed on Jan. 31, 2018 in the Korean Intellectual Property Office, the disclosure of which is incorporated by reference herein in its entirety.

TECHNICAL FIELD

The present inventive concept relates to a semiconductor device, and more particularly, to a three-dimensional semiconductor device including a gate-stack structure disposed on a peripheral circuit structure.

DESCRIPTION OF RELATED ART

A semiconductor device including gate electrodes stacked in a direction perpendicular to a surface of a semiconductor substrate has been developed. In an effort to increase the degree of integration of a semiconductor device, the number of stacked gate electrodes is increased. However, as the number of gate electrodes stacked in a direction perpendicular to a surface of a semiconductor substrate increases, it may be difficult to electrically connect the gate electrodes to peripheral circuits.

SUMMARY

According to an exemplary embodiment of the present inventive concept, a three-dimensional semiconductor device includes a peripheral circuit structure disposed between a first substrate and a second substrate and including a plurality of peripheral interconnections; a gate-stack structure disposed on the second substrate and including a plurality of gate electrodes stacked and spaced apart from each other in a direction perpendicular to an upper surface of the second substrate, wherein the plurality of gate electrodes include a lower gate electrode, a plurality of intermediate gate electrodes disposed on the lower gate electrode, and an upper gate electrode disposed on the plurality of intermediate gate electrodes; a first through region passing through the second substrate and disposed below the gate-stack structure; a second through region passing through the second substrate and the gate-stack structure; and a first peripheral connection plug passing through the first through region and electrically connecting the lower gate electrode to a first peripheral interconnection of the peripheral interconnections.

According to an exemplary embodiment of the present inventive concept, a three-dimensional semiconductor device includes a peripheral circuit structure disposed on a first substrate; a second substrate disposed on the peripheral circuit structure; a gate-stack structure disposed on the second substrate; a plurality of main separation structures crossing the gate-stack structure in a first direction, separating the gate-stack structure in a second direction, and passing through the gate-stack structure in a third direction, wherein the first direction and the second direction intersect each other and are parallel to an upper surface of the second substrate, and the third direction is perpendicular to the upper surface of the second substrate; a first through region passing through the second substrate and disposed below the gate-stack structure; a second through region passing through the second substrate and the gate-stack structure; a first peripheral connection plug disposed in the first through region; and a second peripheral connection plug disposed in the second through region.

According to an exemplary embodiment of the present inventive concept, a three-dimensional semiconductor device includes a peripheral circuit structure disposed on a first substrate; a second substrate disposed on the peripheral circuit structure; a gate-stack structure disposed on the second substrate; and a plurality of first peripheral connection plugs passing through the second substrate to extend into the peripheral circuit structure and to be spaced apart from the second substrate, wherein the gate-stack structure includes a plurality of lower gate electrodes disposed on the same plane and spaced apart from each other in a direction parallel to an upper surface of the second substrate, an intermediate gate electrode disposed on the plurality of lower gate electrodes, and a plurality of upper gate electrodes disposed on the intermediate gate electrode and spaced apart from each other in the direction parallel to the upper surface of the second substrate, and the plurality of lower gate electrodes are electrically connected to the plurality of first peripheral connection plugs.

According to an exemplary embodiment of the present inventive concept, a three-dimensional semiconductor device includes a peripheral circuit structure disposed on a first substrate and including a plurality of peripheral interconnections; a second substrate disposed on the peripheral circuit structure; a memory cell array region disposed on the second substrate; a first extension area and a second extension area disposed on the second substrate, wherein the memory cell array region is arranged between the first extension area and the second extension area; a gate-stack structure disposed on the second substrate, wherein the gate-stack structure includes a plurality of gate electrodes disposed in the memory cell array region and extending into the first extension area and the second extension area; a first through region passing through the second substrate and disposed below the gate-stack structure; a second through region passing through the second substrate and the gate-stack structure; a first peripheral connection plug disposed in the first through region; and a second peripheral connection plug disposed in the second through region.

According to an exemplary embodiment of the present inventive concept a three-dimensional semiconductor device includes: a peripheral circuit structure disposed on a first substrate, wherein the peripheral circuit structure includes a plurality of peripheral interconnections; a second substrate disposed on the peripheral circuit structure; a gate stack structure disposed on the second substrate and including a plurality of gate electrodes stacked in a direction perpendicular to an upper surface of the second substrate; a first through region provided in the second substrate and located between the gate stack structure and the first substrate; a second through region provided in second substrate and the gate stack structure and located between the peripheral circuit structure and a gate interconnect; and a first peripheral connection plug disposed in the first through region and connecting the gate stack structure to a first peripheral interconnection of the peripheral interconnections.

BRIEF DESCRIPTION OF THE DRAWINGS

The above and other features of the present inventive concept will be more clearly understood by describing in detail exemplary embodiments thereof with reference to the accompanying drawings, in which:

FIGS. 5A, 5B, 5C and 5D are plan views respectively illustrating parts of the plan view of FIG. 4, according to an exemplary embodiment of the present inventive concept;

DETAILED DESCRIPTION OF THE EMBODIMENTS

Figure 1:
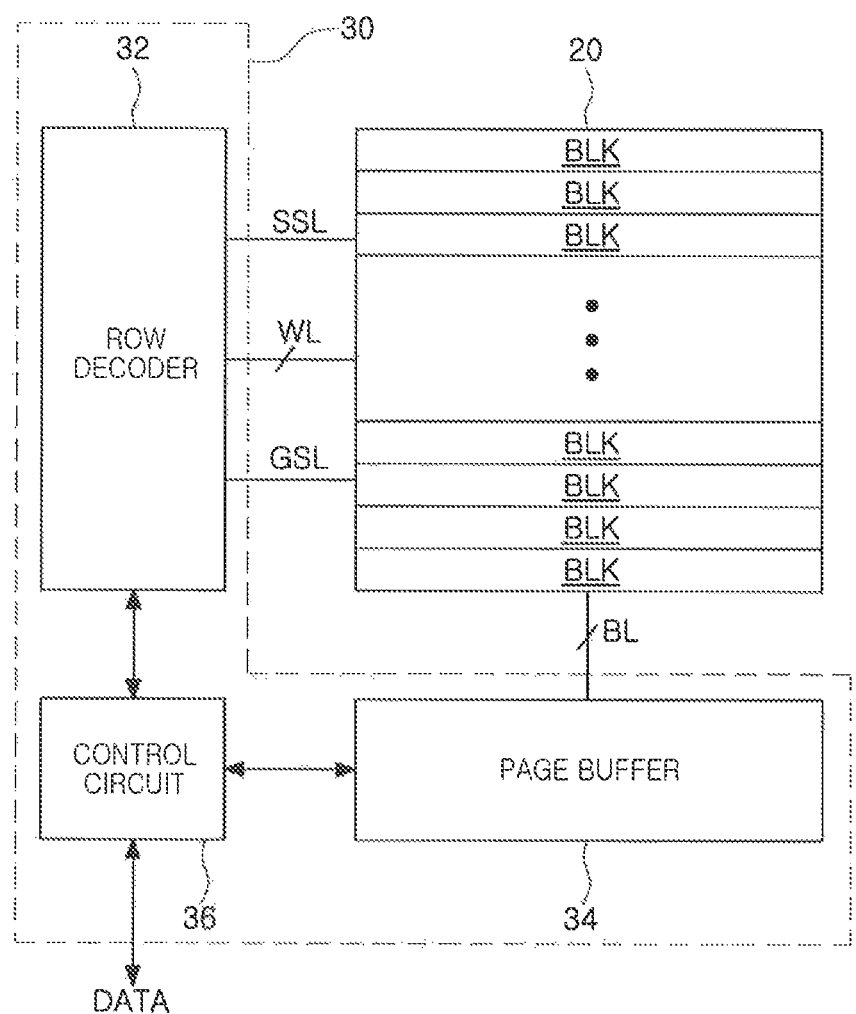
FIG. 1 is a block diagram illustrating a three-dimensional semiconductor device according to an exemplary embodiment of the present inventive concept.

Hereinafter, a three-dimensional semiconductor device according to an exemplary embodiment of the present inventive concept will be described with reference to FIG. 1. FIG. 1 is a block diagram illustrating a three-dimensional semiconductor device according to an exemplary embodiment of the present inventive concept.

Referring to FIG. 1, a three-dimensional semiconductor device 10 according to an exemplary embodiment of the present inventive concept may include a memory cell array region 20 and a peripheral circuit region 30. The memory cell array region 20 may include a plurality of memory blocks BLKs, and each memory block BLK may include a plurality of memory cells. The peripheral circuit region 30 may include a row decoder 32, a page buffer 34, and a control circuit 36.

The plurality of memory cells in the memory blocks BLKs of the memory cell array region 20 may be connected to the row decoder 32 via a string select line SSL, a word line WL, and a ground select line GSL, and to the page buffer 34 via a bit line BL.

In exemplary embodiments of the present inventive concept, a plurality of memory cells arranged in the same row may be connected to the same word line WL, and a plurality of memory cells arranged in the same column may be connected to the same bit line BL.

The row decoder 32 may decode an input address, and generate and transmit driving signals to the word lines WL. The row decoder 32 may supply a word line voltage generated in a voltage generation circuit included in the control circuit 36 to a selected word line WL and unselected word lines WLs, in response to a control of the control circuit 36.

The page buffer 34 may be connected to the memory cell array region 20 via the bit line BL to read information stored in the memory cells. For example, the page buffer 34 may temporarily store data to be stored in a first memory cell or may sense the data stored in the first memory cell, depending on an operation mode. The page buffer 34 may include a column decoder and a sensing amplifier.

The column decoder may selectively activate a bit line BL of the memory cell array region 20. The sensing amplifier may sense a voltage of the bit line BL selected by the column decoder to read data stored in the selected memory cell, during a reading operation. The control circuit 36 may control operations of the row decoder 32 and the page buffer 34. The control circuit 36 may receive an external control signal and an external voltage and operate according to the received control signal. The external control signal may be provided from a host. The control circuit 36 may include the voltage generation circuit for generating voltages, such as a programming voltage, a reading voltage, and an erasing voltage, using the external voltage. The control circuit 36 may control reading, writing, and/or erasing operations in response to the control signals. In addition, the control circuit 36 may include an input/output circuit. The input/output circuit may receive data DATA to be transmitted to the page buffer 34 during a programming operation, and output data DATA received from the page buffer 34 during a reading operation.

Figure 2:
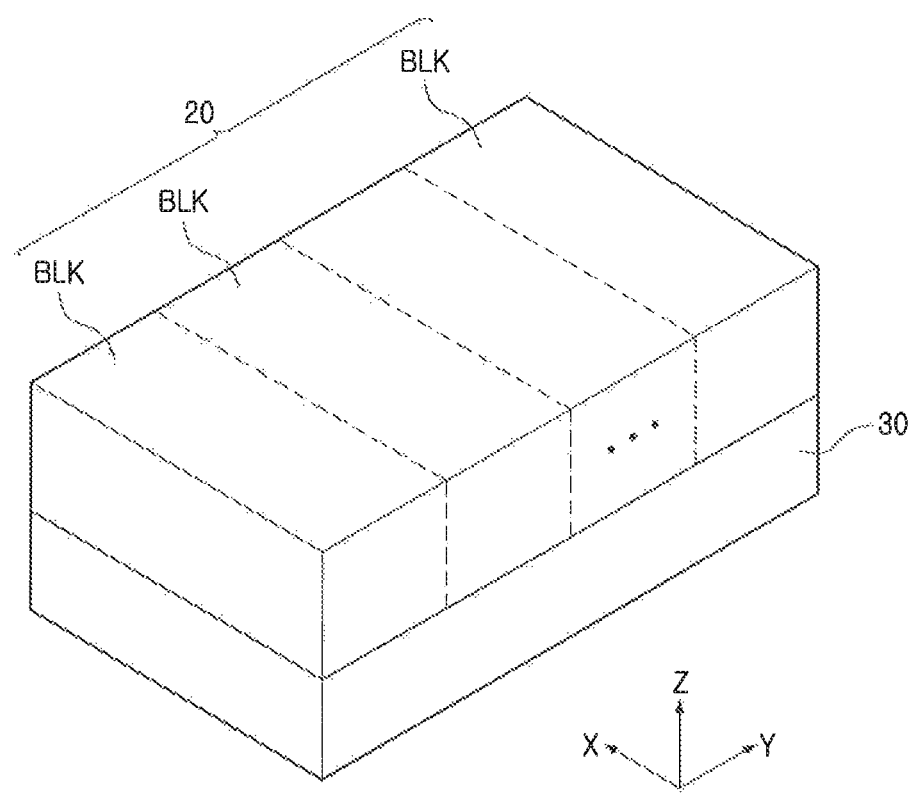
FIG. 2 is a block diagram illustrating a three-dimensional semiconductor device according to an exemplary embodiment of the present inventive concept.

FIG. 2 is a block diagram illustrating a memory cell array region and a peripheral circuit region of a three-dimensional semiconductor device according to an exemplary embodiment of the present inventive concept.

Referring to FIG. 2, the plurality of memory blocks BLKs in the memory cell array region 20 described with reference to FIG. 1 may extend in a first direction X to be sequentially arranged in a second direction Y intersecting the first direction X. The memory cell array region 20 including the memory blocks BLKs may be arranged on the peripheral circuit region 30 described with reference to FIG. 1. The memory cell array region 20 may include a gate-stack structure including a plurality of gate electrodes stacked in a third direction Z, perpendicular to the first and second directions X and Y. The gate-stack structure may be combined with a plurality of memory cell vertical structures passing through the gate-stack structure to form the three-dimensionally arranged memory cells.

Figure 3A:
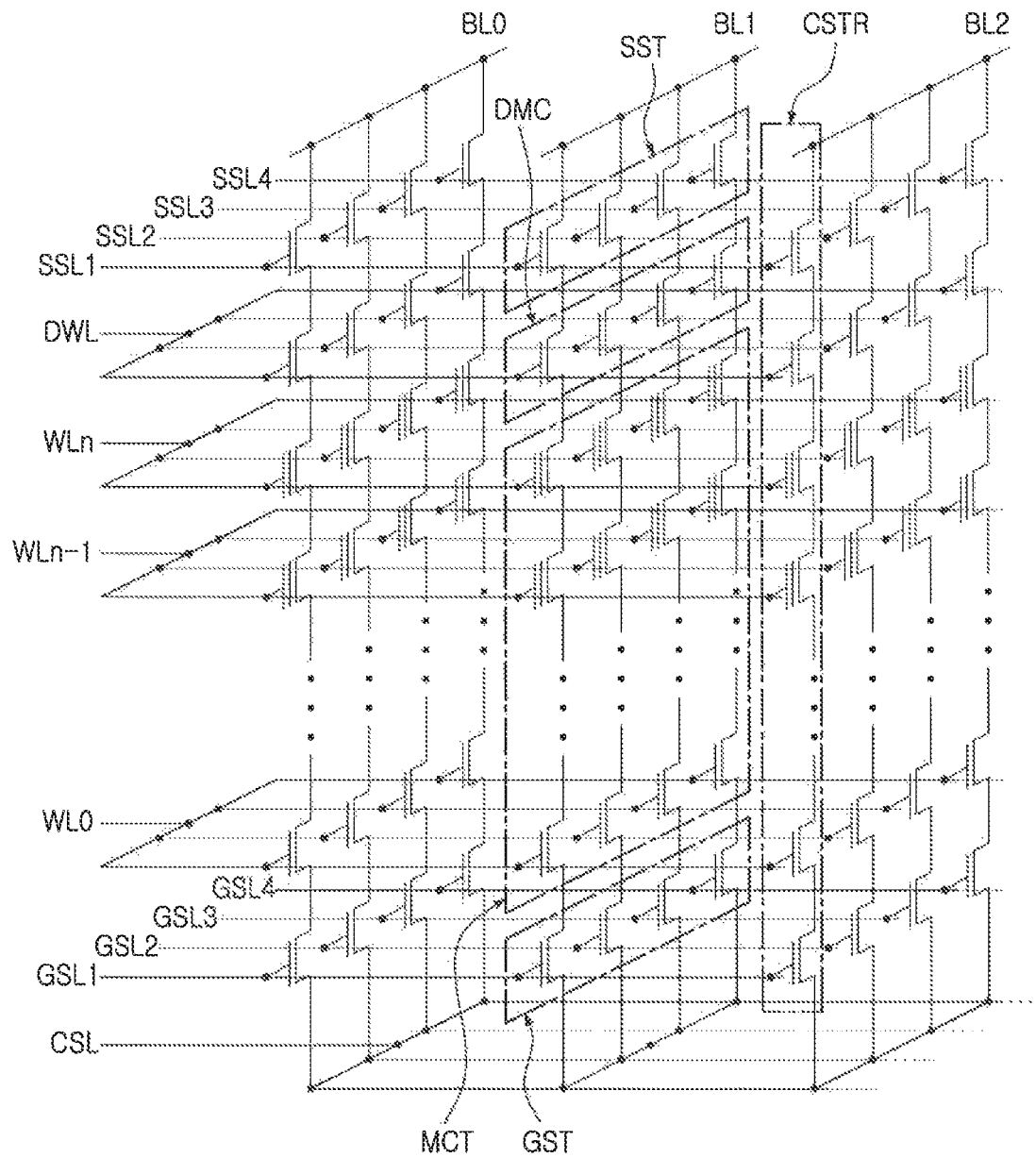
FIG. 3A is a circuit diagram illustrating a three-dimensional semiconductor device according to an exemplary embodiment of the present inventive concept.
Figure 3B:
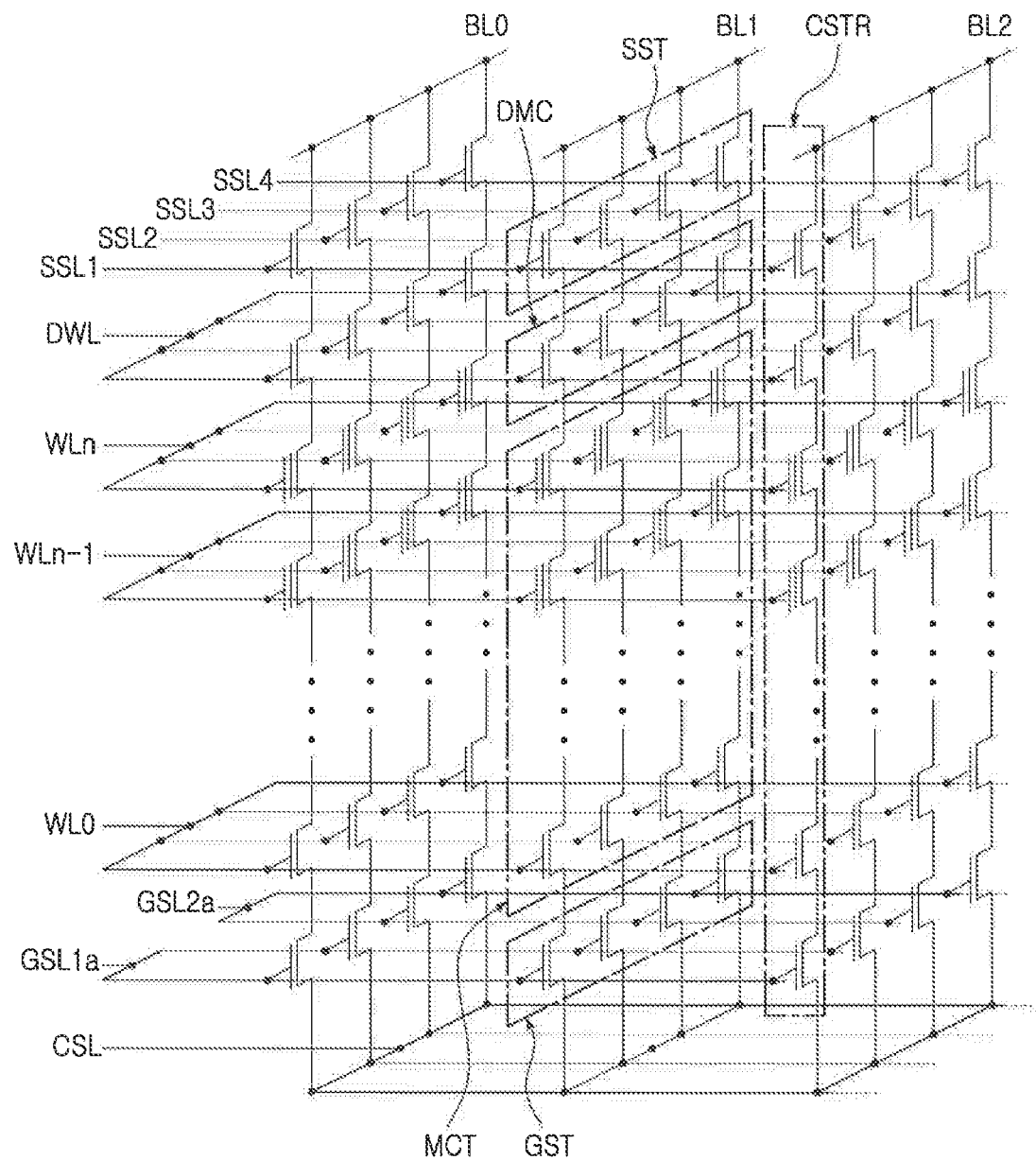
FIG. 3B is a circuit diagram illustrating a three-dimensional semiconductor device according to an exemplary embodiment of the present inventive concept.

An exemplary embodiment of a circuit of the memory cell array region 20 of the three-dimensional semiconductor device illustrated in FIGS. 1 and 2 will be described with reference to FIG. 3A. FIG. 3A is a circuit diagram illustrating an example of the memory cell array region 20, according to an exemplary embodiment of the present inventive concept, and FIG. 3B is a circuit diagram illustrating a modified example of the memory cell array region 20, according to an exemplary embodiment of the present inventive concept.

First, referring to FIG. 3A, a three-dimensional semiconductor device according to an exemplary embodiment of the present inventive concept may include a common source line CSL, a plurality of bit lines BL0, BL1 and BL2, and a plurality of cell strings CSTR disposed between the common source line CSL and the plurality of bit lines BL0 to BL2. The plurality of cell strings CSTR may be respectively connected to the plurality of bit lines BL0 to BL2 in parallel. The plurality of cell strings CSTR may be commonly connected to the common source line CSL. Each of the plurality of cell strings CSTR may include a lower select transistor GST, a memory cell MCT, and an upper select transistor SST, connected in series.

A plurality of memory cells MCT may be arranged and connected in series between the lower select transistor GST and the upper select transistor SST. Each memory cell MCT may include an information storage element in which information is stored.

Each of the plurality of cell strings CSTR may include a dummy cell DMC disposed between the upper select transistor SST and the plurality of memory cells MCT. The upper select transistor SST may be electrically connected to the bit lines BL0 to BL2, and the lower select transistor GST may be electrically connected to the common source line CSL.

A plurality of upper select transistors SST may be arranged and controlled by a plurality of upper select lines SSL1, SSL2, SSL3 and SSL4. The memory cell MCT may be controlled by a plurality of word lines WL0 to WLn. The dummy cell DMC may be connected to a dummy word line DWL. A plurality of lower select transistors GST may be arranged and controlled by a plurality of lower select lines GSL1, GSL2, GSL3 and GSL4. The common source line CSL may be commonly connected to a source of the lower select transistor GST.

For example, the upper select transistor SST may be a string select transistor, and the upper select lines SSL1 to SSL4 may be string select lines. The lower select transistor GST may be a ground select transistor, and the lower select lines GSL1 to GSL4 may be ground select lines.

For example, the plurality of ground select lines GSL1 to GSL4 may be arranged to correspond one-to-one to the plurality of upper select lines SSL1 to SSL4. However, the present inventive concept is not limited thereto. For example, each of ground select lines GSL1*a* and GSL2*b* may be arranged to correspond to two or more of the upper select lines SSL1 to SSL4, as illustrated in FIG. 3B. For example, one ground select line GSL1*a* may correspond to two upper select lines SSL1 and SSL2 among the upper select lines SSL1 to SSL4, as illustrated in FIG. 3B.

Figure 4:
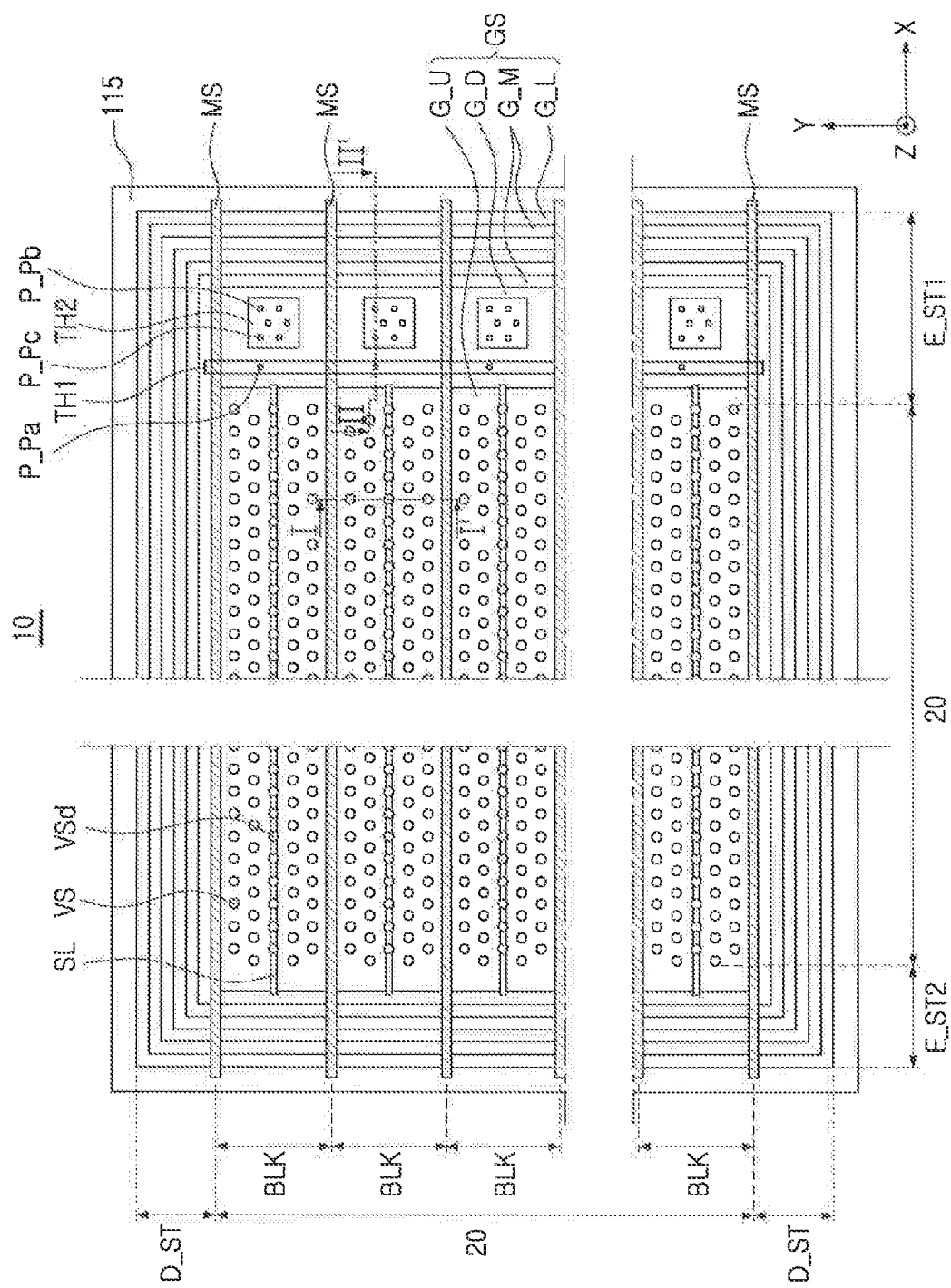
FIG. 4 is a plan view illustrating a three-dimensional semiconductor device according to an exemplary embodiment of the present inventive concept.
Figure 5B:
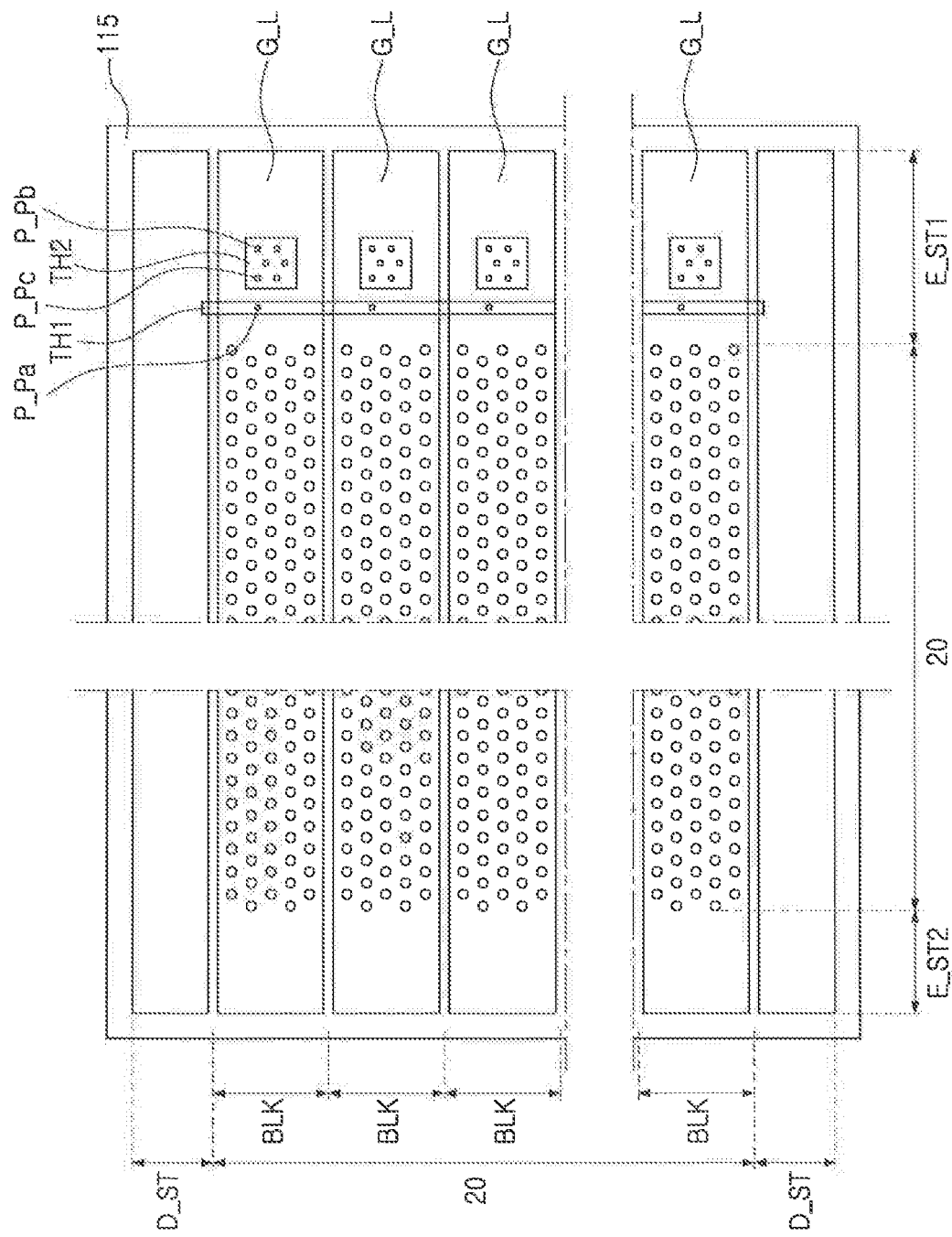
Figure 5C:
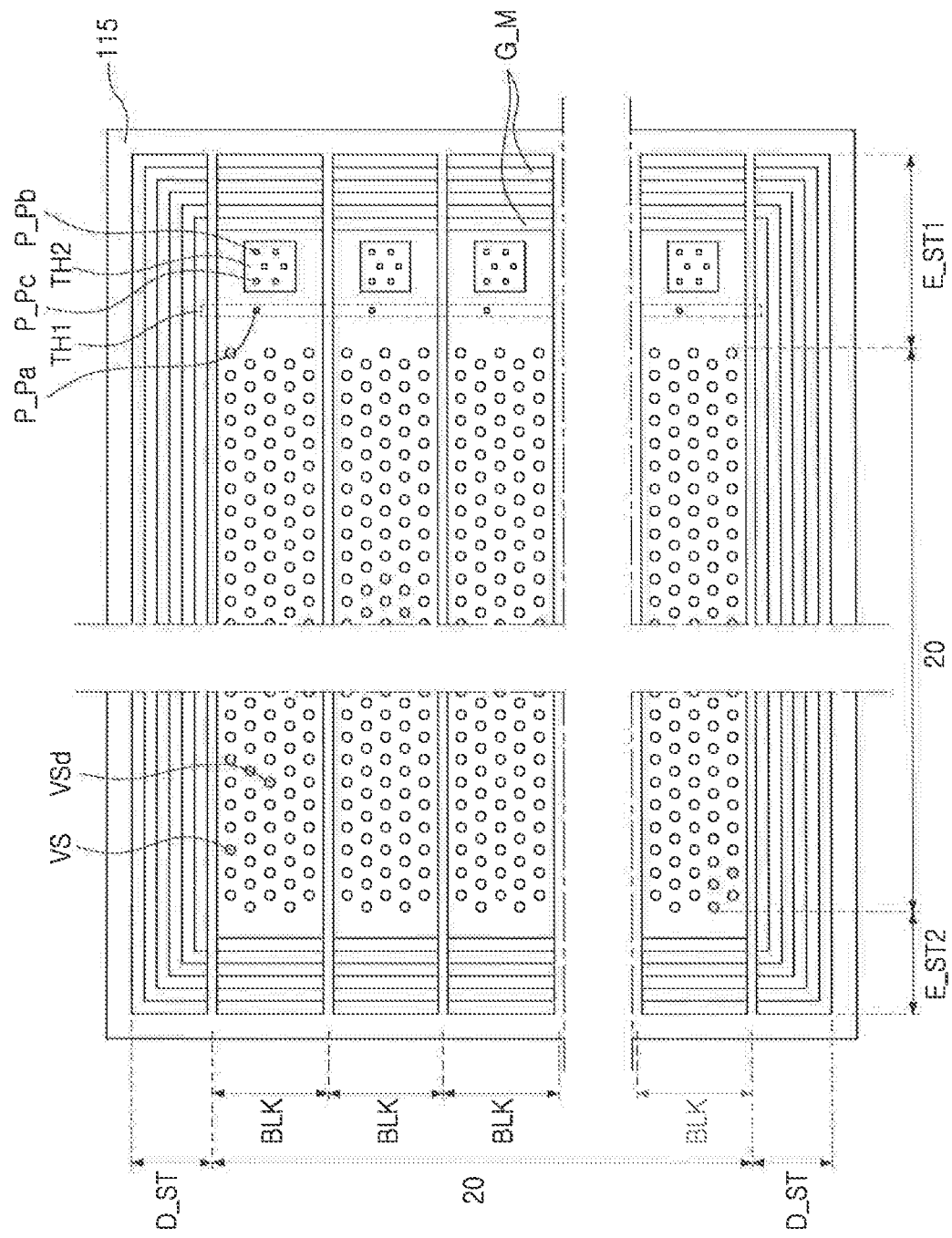
Figure 5D:
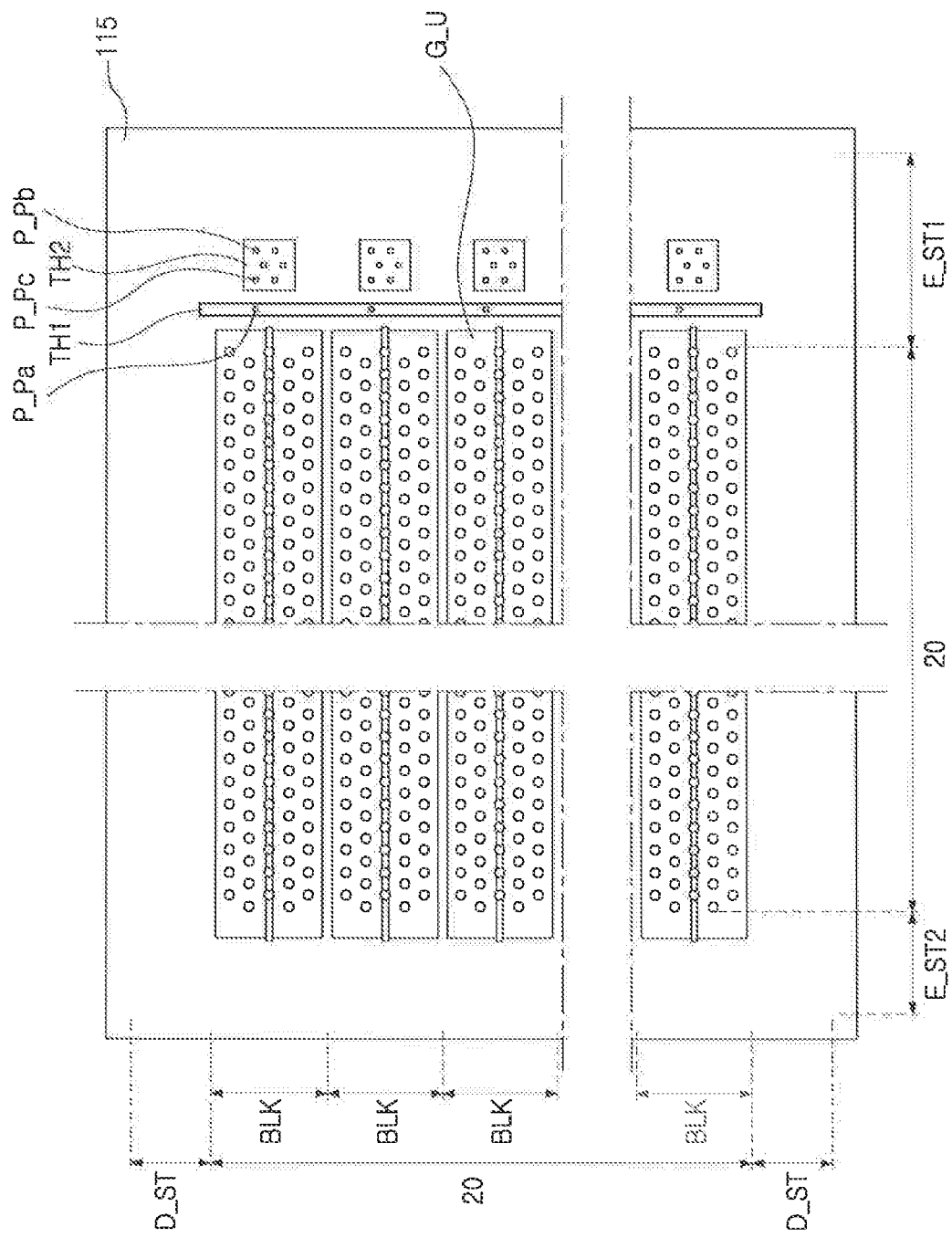
Figure 6:
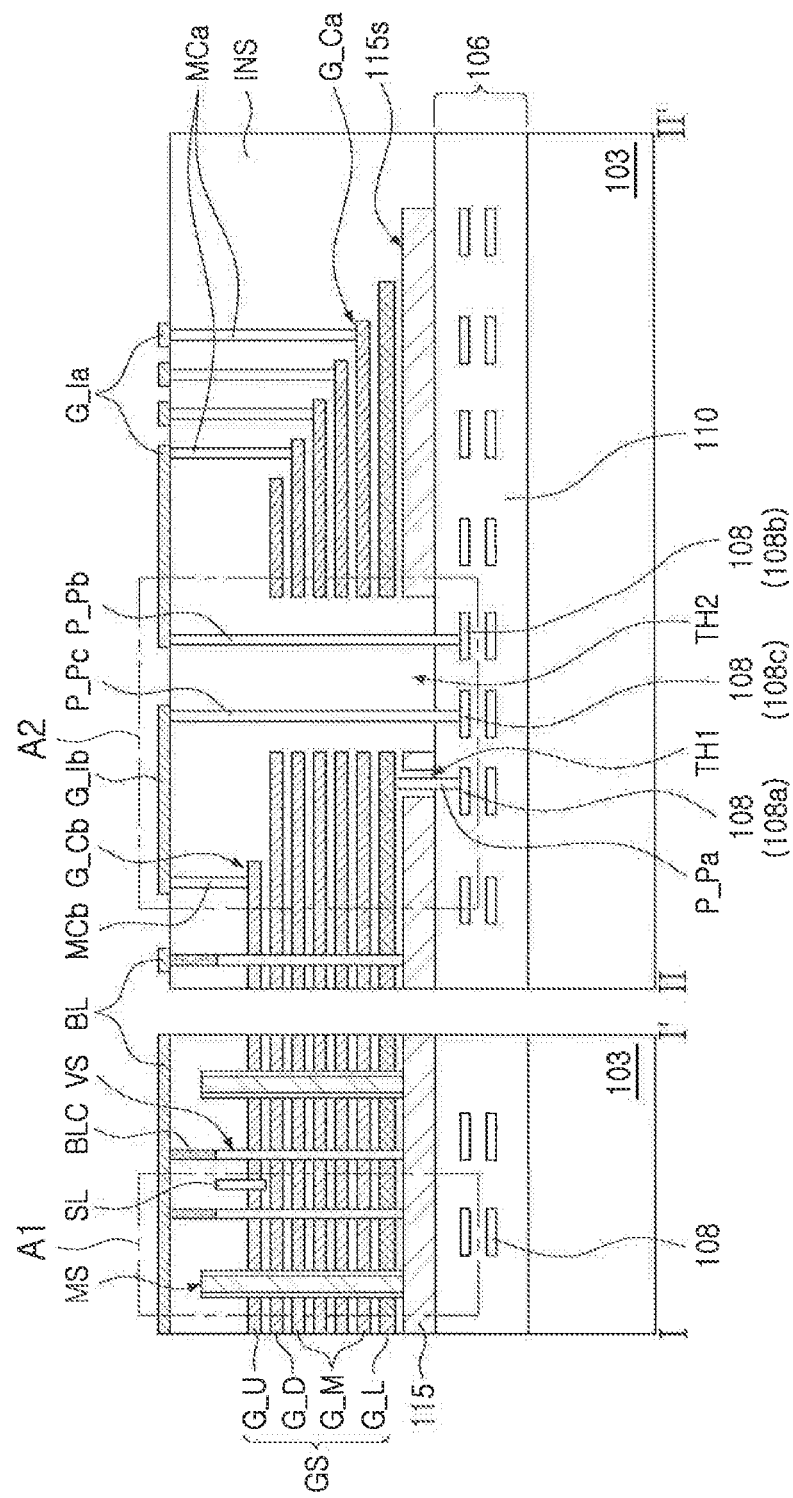
FIG. 6 is a schematic cross-sectional view illustrating areas taken along lines I-I' and II-II' of FIG. 4, according to an exemplary embodiment of the present inventive concept.

Next, examples of a three-dimensional semiconductor device according to an exemplary embodiment of the present inventive concept will be described with reference to FIGS. 4 to 6. FIG. 4 is a plan view illustrating a three-dimensional semiconductor device 10 according to an exemplary embodiment of the present inventive concept. FIGS. 5A to 5D are plan views respectively illustrating parts of the plan view of FIG. 4, and FIG. 6 is a schematic cross-sectional view illustrating areas taken along lines I-I' and II-II' of FIG. 4. For example, in FIGS. 5A to 5D parts of the plan view of FIG. 4 are removed for ease of viewing.

Referring to FIGS. 4 to 6, a peripheral circuit structure 106 may be arranged on a lower substrate 103. The lower substrate 103 may be a lower semiconductor substrate. For example, the lower substrate 103 may be a single crystal semiconductor substrate formed of a semiconductor material such as silicon. The peripheral circuit structure 106 may include the peripheral circuit region (reference numeral 30 in FIGS. 1 and 2). For example, the peripheral circuit structure 106 may include peripheral circuits, such as the row decoder (reference numeral 32 in FIG. 1), the page buffer (reference numeral 34 in FIG. 1), and the control circuit (reference numeral 36 in FIG. 1). The peripheral circuit structure 106 may include a plurality of peripheral interconnections 108 for electrically connecting the peripheral circuits in the peripheral circuit region (reference numeral 30 in FIGS. 1 and 2), and a lower insulating layer 110 covering the plurality of peripheral interconnections 108. The plurality of peripheral interconnections 108 may include a first peripheral interconnection 108*a*, a second peripheral interconnection 108*b*, and a third peripheral interconnection 108*c*.

An upper substrate 115 may be disposed on the peripheral circuit structure 106. The upper substrate 115 may be a semiconductor substrate. For example, the upper substrate 115 may be a polycrystalline semiconductor substrate formed of a semiconductor material such as silicon. For example, the upper substrate 115 may be formed of polysilicon.

The memory cell array region 20 described with reference to FIGS. 1 and 2 may also be arranged on the upper substrate 115. The memory cell array region 20 may include the plurality of memory blocks BLKs described with reference to FIG. 2.

Each of the plurality of memory blocks BLKs may extend in the first direction X parallel to a surface of the upper substrate 115. The plurality of memory blocks BLKs may be sequentially arranged in the second direction Y parallel to the surface of the upper substrate 115 and intersecting the first direction X. A first extension area E_ST1 and a second extension area E_ST2 may be arranged in the first direction X with the memory cell array region 20 therebetween, in a plan view, a dummy staircase area D_ST may be arranged in the second direction V with the memory cell array region 20 therebetween.

A gate-stack structure GS may be arranged on the upper substrate 115. The gate-stack structure GS may be arranged in the memory cell array region 20 and extend to the first and second extension areas E_ST1 and E_ST2.

The gate-stack structure GS may include a lower gate electrode G_L, a plurality of intermediate gate electrodes G_M disposed on the lower gate electrode G_L and an upper gate electrode G_U disposed on the plurality of intermediate gate electrodes G_M. The gate-stack structure GS may include a dummy gate electrode G_D disposed between the plurality of intermediate gate electrodes G_M and the upper gate electrode G_U.

The plurality of intermediate gate electrodes G_M may include a plurality of intermediate gate contact areas G_Ca arranged in a staircase form in the first and second extension areas E_ST1 and E_ST2. In addition, the upper gate electrode G_U may include an upper gate contact area G_Cb disposed closer to the memory cell array region 20 than the plurality of intermediate gate contact areas G_Ca. An insulating structure INS is provided to fill spaces between the lower, intermediate, dummy and upper gate electrodes G_L, G_M, G_D, and G_U of the gate-stack structure GS and cover the gate-stack structure GS.

A plurality of main separation structures MS may be arranged to cross the gate-stack structure GS in the first direction X, separate the gate-stack structure GS in the second direction Y, and pass through the gate-stack, structure GS in the third direction Z. The first direction X and the second direction Y may intersect each other and may be parallel to an upper surface 115*s* of the upper substrate 115. The third direction Z may be perpendicular to the upper surface 115*s* of the upper substrate 115.

An insulating separation line SL may be arranged to separate the upper gate electrode G_U in the second direction V between the plurality of main separation structures MS. The insulating separation line SL may be disposed on the plurality of intermediate gates electrodes G_M.

A plurality of vertical channel structures VS passing through the gate-stack structure GS may be arranged. The plurality of vertical channel structures VS may be disposed in the memory cell array region 20.

The plurality of bit lines BLs may be disposed on the plurality of vertical channel structures VS. A plurality of bit-line contact plugs BLCs electrically connecting the plurality of bit lines BLs and the plurality of vertical channel structures VS may be disposed between the plurality of bit lines BLs and the plurality of vertical channel structures VS.

A dummy vertical structure VSd may be disposed to pass through the insulating separation line SL and the gate-stack structure GS disposed below the insulating separation line SL. The dummy vertical structure VSd may have the same structure as the vertical channel structure VS, and may be electrically isolated from the bit lines BLs.

A plurality of intermediate gate contact plugs MCa may be disposed on the plurality of intermediate gate contact areas G_Ca. An upper gate contact plug MCb may be disposed on the upper gate contact area G_Cb.

A first through region TH1 passing through the upper substrate 115 may be provided. For example, the first through region TH1 may be covered by the lower gate electrode G_L. A second through region TH2 passing through the upper substrate 115 and extending upward to pass through the gate-stack structure GS may be provided.

In exemplary embodiments of the present inventive concept, the first through region TH1 may overlap the first extension area E_ST1. The first through region TH1 may have a line shape extending in the second direction Y.

In exemplary embodiments of the present inventive concept, the second through region TH2 may pass through the gate-stack structure GS in the first extension area E_ST1. A plurality of second through regions TH2 may be provided. The plurality of second through regions TH2 may be spaced apart from each other in the second direction Y.

In a plan view the second through region TH2 may be disposed between the plurality of intermediate gate contact areas G_Ca and the upper gate contact area G_Cb.

In exemplary embodiments of the present inventive concept, the first through region TH1 may be disposed between the memory cell array region 20 and the second through region TH2 in a plan view. The first through region TH1 may be disposed between the vertical channel structure VS and the second through region TH2 in a plan view.

At least a portion of the first peripheral interconnection 108*a* may be disposed below the first through region TH1, at least a portion of the second peripheral interconnection 108*b* may be disposed below the second through region TH2, and at least a portion of the third peripheral interconnection 108*c* may be disposed below the second through region TH2. The first through region TH1 may be covered by the gate-stack structure GS.

A first peripheral connection plug P_Pa passing through the first through region TH1 may be provided. The first peripheral connection plug P_Pa may be disposed on the first peripheral interconnection 108*a*, and may extend in the third direction Z and pass through the first through region TH1 to be electrically connected to the lower gate electrode G_L. The first peripheral connection plug P_Pa may be covered by the gate-stack structure GS and may electrically connect the first peripheral interconnection 108*a* to the lower gate electrode G_L. The first peripheral connection plug P_Pa may be interposed between an upper surface of the first peripheral interconnection 108a and a lower surface of the lower gate electrode G_L.

A second peripheral connection plug P_Pb and a third peripheral connection plug P_Pc may pass through the second through region TH2. A plurality of second peripheral connection plugs P_Pb may be provided. A plurality of intermediate gate interconnections G_Ia may electrically connect the plurality of second peripheral connection plugs P_Pb to the plurality of intermediate gate contact plugs MCa. For example, one of the plurality of intermediate gate interconnections G_Ia may electrically connect one of the plurality of second peripheral connection plugs P_Pb to one of the plurality of intermediate gate contact plugs MCa. The plurality of intermediate gate interconnections G_Ia may be arranged on a same level as the bit line BL. An upper gate interconnection G_Ib may be arranged to electrically connect the third peripheral connection plug P_Pc to the upper gate contact plug MCb.

Figure 7:
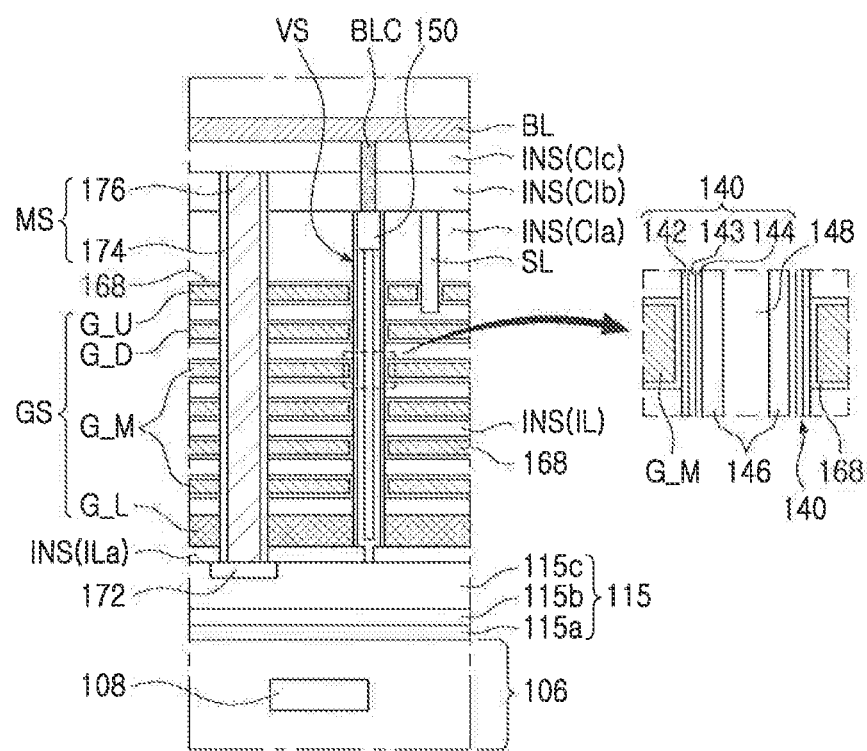
FIG. 7 is a partially enlarged view schematically illustrating 'A1' of FIG. 6, according to an exemplary embodiment of the present inventive concept.
Figure 8:
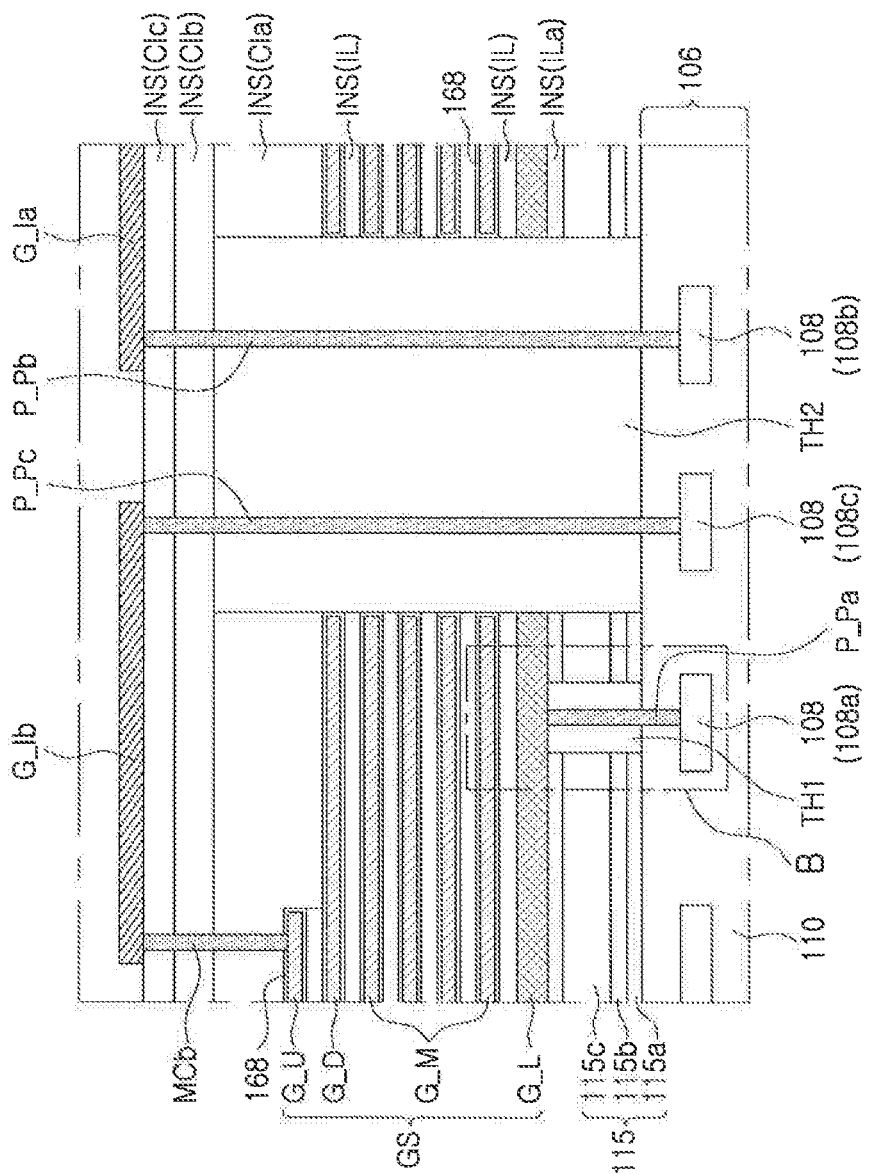
FIG. 8 is a partially enlarged view schematically illustrating 'A2' of FIG. 6, according to an exemplary embodiment of the present inventive concept.

Next, exemplary embodiments of some components illustrated in FIGS. 4 to 6 will be described with reference to FIGS. 7 and 8. In FIGS. 7 and 8, FIG. 7 is a partially enlarged view illustrating 'A1' of FIG. 6, and FIG. 8 is a partially enlarged view illustrating 'A2' of FIG. 6.

Referring to FIGS. 7 and 8 together with FIGS. 4 to 6, the upper substrate 115 may include a first area 115a, a second area 115b disposed on the first area 115a, and a third area 115c disposed on the second area 115b. The second area 115b may include a greater amount of carbon than the third area 115c. The first area 115a may have a higher impurity concentration than the third area 115c. For example, the first area 115a may have a higher p-type impurity concentration than the third area 115c. The upper substrate 115 may be formed of polysilicon.

The insulating structure INS may include an interlayer insulating layer IL interposed between the lower, intermediate, dummy and upper gate electrodes G_L, G_M, G_D, and G_U of the gate-stack structure GS, a lowest interlayer insulating layer ILa interposed between the gate-stack structure GS and the upper substrate 115, a first capping insulating layer CIa covering the gate-stack structure GS, a second capping insulating layer CIb disposed on the first capping insulating layer CIa, and a third capping insulating layer CIc disposed on the second capping insulating layer CIb.

The vertical channel structure VS may pass through the gate-stack structure GS and extend to pass through the interlayer insulating layer IL, the lowest interlayer insulating layer ILa, and the first capping insulating layer CIa of the insulating structure INS.

The vertical channel structure VS may include an insulating core layer 148 extending in the direction Z, perpendicular to a surface of the upper substrate 115 and passing through the gate-stack structure GS, a channel semiconductor layer 146 covering side and bottom surfaces of the insulating core layer 148 and in contact with the upper substrate 115, a first gate dielectric material 140 surrounding an outer surface of the channel semiconductor layer 146, and a pad layer 150 disposed on the insulating core layer 148 and electrically connected to the channel semiconductor layer 146.

The channel semiconductor layer 146 may be electrically connected to the upper substrate 115. The channel semiconductor layer 146 may be formed of a semiconductor material such as silicon. The pad layer 150 may be formed of doped polysilicon having n-type conductivity. The insulating core layer 148 may be formed of an insulating material such as silicon oxide.

A second gate dielectric material 168 disposed between the intermediate, dummy, and upper gate electrodes G_M, G_D, and G_U and the vertical channel structure VS is provided. The second gate dielectric material 168 further extends onto upper and lower surfaces of the intermediate, dummy, and upper gate electrodes G_M, G_D, and G_U and is interposed between the intermediate, dummy, and upper gate electrodes G_M, G_D, and G_U and the insulating structure INS. The second gate dielectric material 168 may extend to spaces between the intermediate, dummy, and upper gate electrodes G_M, G_D, and G_U and the second through region TH2.

In exemplary embodiments of the present inventive concept, the intermediate, dummy, and upper gate electrodes G_M, G_D, and G_U may be spaced apart from the insulating structure INS by the second gate dielectric material 168, and the lower gate electrode G_L may be in contact with the insulating structure INS.

In exemplary embodiments of the present inventive concept, the lower gate electrode G_L may be formed of a material having a different conductivity type from the intermediate, dummy, and upper gate electrodes G_M, G_D, and G_U. For example, the lower gate electrode G_L may be formed of a first conductivity-type material (e.g., polysilicon), and the intermediate, dummy, and upper gate electrodes G_M, G_D, and G_U may be formed of a second conductivity-type material (e.g., Ti, W, TiN, or TaN).

In exemplary embodiments of the present inventive concept, the lower gate electrode G_L may be thicker than each of the intermediate, dummy, and upper gate electrodes G_M, G_D, and G_U.

The first gate dielectric material 140 may include a layer configured to store data. For example, the first gate dielectric material 140 may include a tunnel dielectric layer 144, a data storage layer 143, and a blocking dielectric layer 142. The data storage layer 143 may be disposed between the tunnel dielectric layer 144 and the blocking dielectric layer 142. The tunnel dielectric layer 144 may be adjacent to the channel semiconductor layer 146, and the blocking dielectric layer 142 may be adjacent to the gate-stack structure GS.

The tunnel dielectric layer 144 may include silicon oxide and/or impurity-doped silicon oxide. The blocking dielectric layer 142 may include silicon oxide and/or a high-k material. The data storage layer 143 may be a layer configured to store data between the channel semiconductor layer 146 and the intermediate gate electrode G_M. For example, the data storage layer 143 may be formed of a material, such as silicon nitride, which traps and retains electrons injected through the tunnel dielectric layer 144 from the channel semiconductor layer 146 or erases electrons trapped in the data storage layer 143, depending on operating conditions of a non-volatile memory device such as a flash memory device. The second gate dielectric material 168 may include a high-k material such as AlO.

The data storage layer 143 may store data in areas facing the intermediate gate electrodes G_M corresponding to the word lines WLs, e.g., WL0 to WLn, described with reference to FIG. 1 and FIGS. 3A and 3B, in the gate-stack structure GS.

The main separation structure MS may include a conductive pattern 176 and a spacer 174 covering side surfaces of the conductive pattern 176. The spacer 174 may be formed of an insulating material such as silicon oxide or silicon nitride. The spacer 174 may separate the conductive pattern 176 from the gate-stack structure GS. The conductive pattern 176 may be formed of a conductive material including at least one of doped polysilicon, a metal nitride such as titanium nitride, and a metal such as tungsten. In exemplary embodiments of the present inventive concept, the conductive pattern 176 may be a source contact plug.

An impurity area 172 may be disposed in the upper substrate 115 below the main separation structures MS. The impurity area 172 may have n-type conductivity, and may be a common source line, e.g., the common source line CSL of FIG. 3A.

The first through region TH1 may be formed of an insulating material, such as silicon oxide, filling a hole or opening passing through the upper substrate 115. The second through region TH2 may be formed of an insulating material, such as silicon oxide, filling a hole or opening passing through the upper substrate 115 and extending to pass through the gate-stack structure GS. The second through region TH2 may pass through the gate-stack structure GS, the interlayer insulating layer IL, and the first capping insulating layer CIa.

The upper gate contact plug MCb may pass through the first to third capping insulating layers CIa, CIb, and CIc to be electrically connected to the upper gate contact area G_Cb of the upper gate electrode G_U. For example, the upper gate contact plug MCb may be disposed between the upper gate electrode G_U and the upper gate interconnection G_Ib.

The second and third peripheral connection plugs P_Pb and P_Pc may pass through the second and third capping insulating layers CIb and CIc and the second through region TH2 and extend downwardly to be electrically connected to the second peripheral interconnection 108b and the third peripheral interconnection 108c, respectively.

In exemplary embodiments of the present inventive concept, the first through region TH1 may pass through the upper substrate 115 and the lowest interlayer insulating layer ILa, and the first peripheral connection plug P_Pa may upwardly extend from the first peripheral interconnection 108a to be in contact with a lower surface of the lower gate electrode G_L via the first through region TH1.

Next, various modified examples of part 'B' including the first through region TH1, the upper substrate 115, the lower gate electrode G_L, the lowest interlayer insulating layer ILa, the first peripheral connection plug P_Pa, and the first peripheral interconnection 108a illustrated in FIG. 8 will be described with reference to FIGS. 9A to 9D. FIGS. 9A to 9D are partially enlarged views illustrating the modified examples of part 'B' in FIG. 8, according to an exemplary embodiment of the present inventive concept.

Figure 9A:
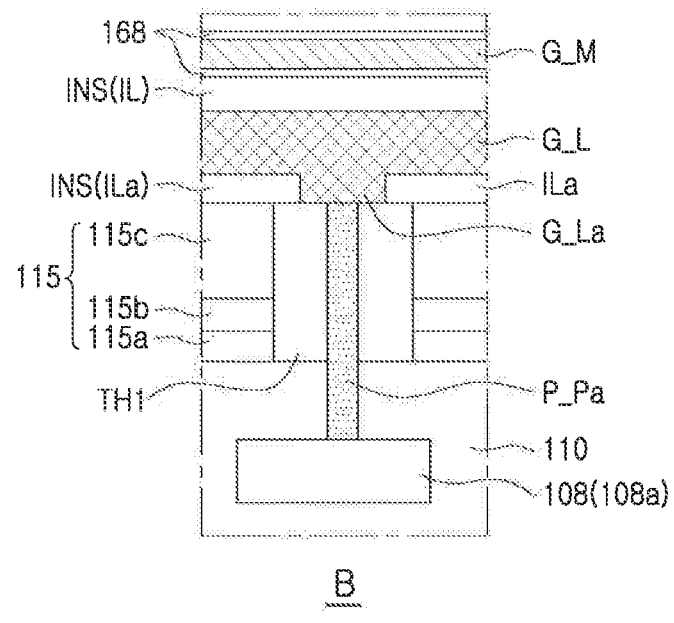
FIGS. 9A, 9B, 9C and 9D are partially enlarged views illustrating modified examples of part 'B' in FIG. 8, according to an exemplary embodiment of the present inventive concept.

In a modified example, referring to FIG. 9A, the first through region TH1 may pass through the upper substrate 115 to be disposed below the lowest interlayer insulating layer ILa. The first peripheral connection plug P_Pa may upwardly extend from the first peripheral interconnection 108a, pass through the first through region TH1, and have an upper surface coplanar with an upper surface of the upper substrate 115. The lower gate electrode may include a lower protrusion G_La extending downward and passing through the lowest interlayer insulating layer ILa to be in contact with the first peripheral connection plug P_Pa. For example, the lower protrusion G_La may be disposed in an opening in the lowest insulating layer ILa.

Figure 9B:
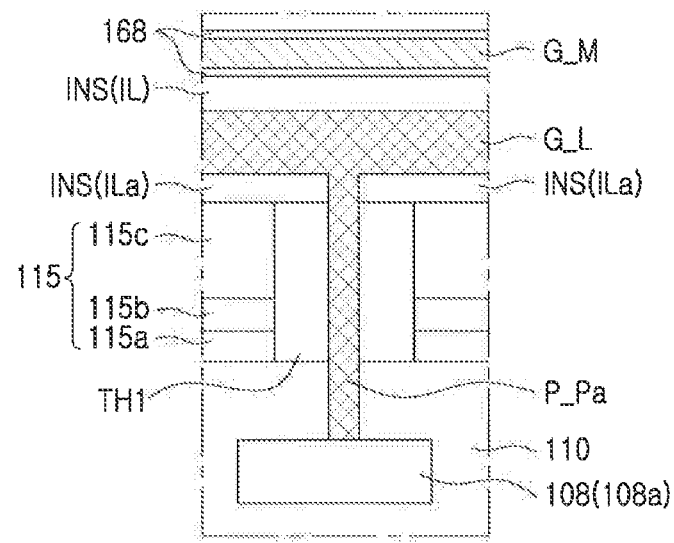

In another modified example, referring to FIG. 9B, the first through region TH1 may pass through the upper substrate 115 to be disposed below the lowest interlayer insulating layer ILa. The first peripheral connection plug P_Pa may extend upward from the first peripheral interconnection 108a and sequentially pass through the first through region TH1 and the lowest interlayer insulating layer ILa to be in contact with the lower gate electrode G_L. The first peripheral connection plug P_Pa may be formed integrally with the lower gate electrode G_L. Accordingly, the first peripheral connection plug P_Pa and the lower gate electrode G_L may be formed of the same material, such as polysilicon. Accordingly, the first peripheral connection plug P_Pa may be formed of a different conductive material from the second and third peripheral connection plugs (P_Pb and P_Pc in FIG. 8). For example, the first peripheral connection plug P_Pa may be formed of polysilicon, and the second and third peripheral connection plugs (P_Pb and P_Pc in FIG. 8) may be formed of a metal, such as Ti or W, or a metal nitride such as TiN.

Figure 9C:
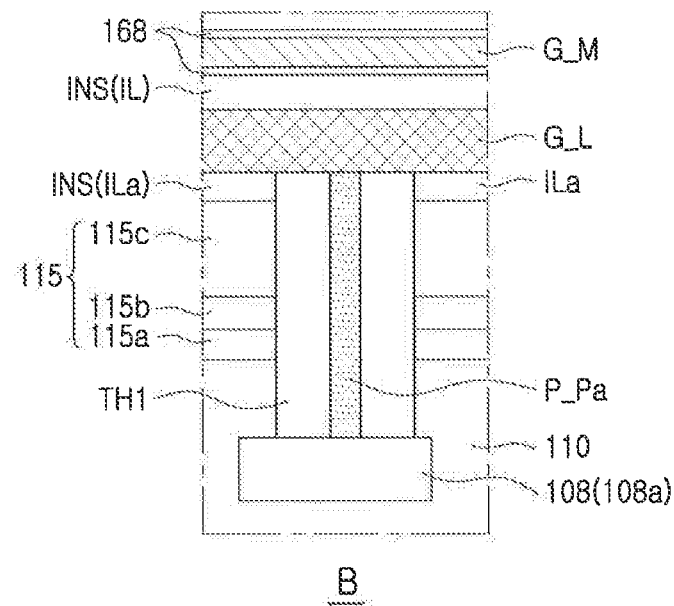

In another modified example, referring to FIG. 9C, the first through region TH1 may extend upward from the first peripheral interconnection 108a and pass through the upper substrate 115 and the lowest interlayer insulating layer ILa. The first peripheral connection plug P_Pa may pass through the first through region TH1 to electrically connect the first peripheral interconnection 108a to the lower gate electrode G_L.

Figure 9D:
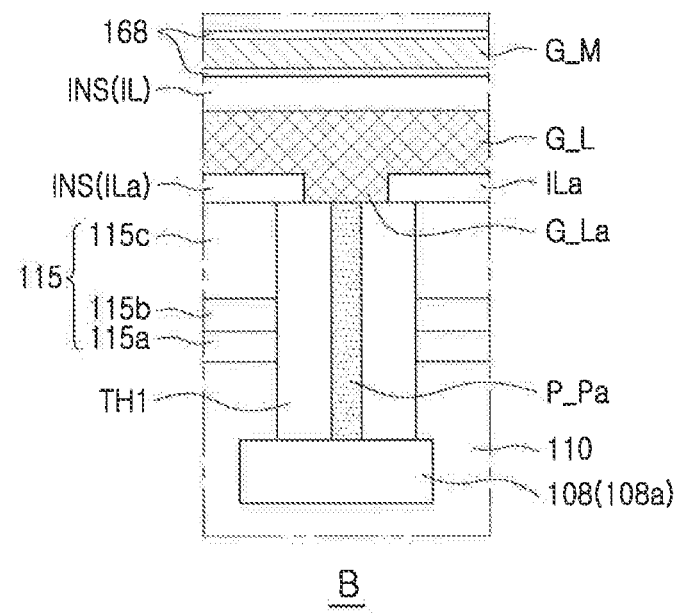

In another modified example, referring to FIG. 9D, the first through region TH1 may extend upward from the first peripheral interconnection 108a and pass through the upper substrate 115 to be disposed below the lowest interlayer insulating layer ILa. The first peripheral connection plug P_Pa may pass through the first through region TH1. The lower gate electrode G_L may include a lower protrusion G_La extending downward and passing through the lowest interlayer insulating layer ILa to be in contact with the first peripheral connection plug P_Pa. For example, the lower protrusion G_La may be disposed in an opening in the lowest insulating layer ILa.

Figure 10:
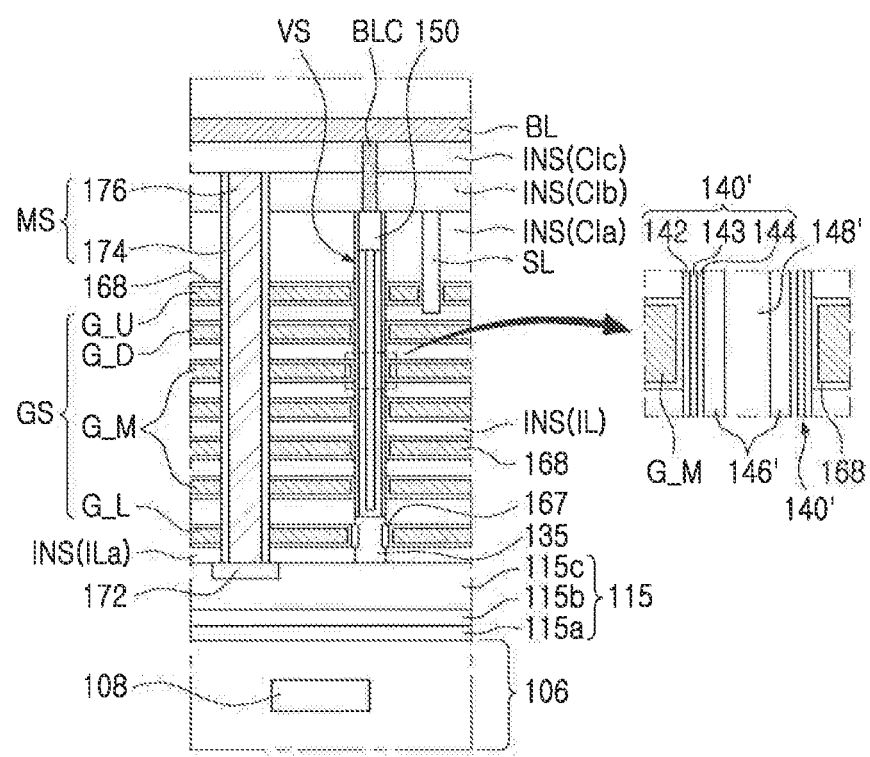
FIG. 10 is a partially enlarged view schematically illustrating a modified example of part 'A1' in FIG. 6, according to an exemplary embodiment of the present inventive concept.
Figure 11:
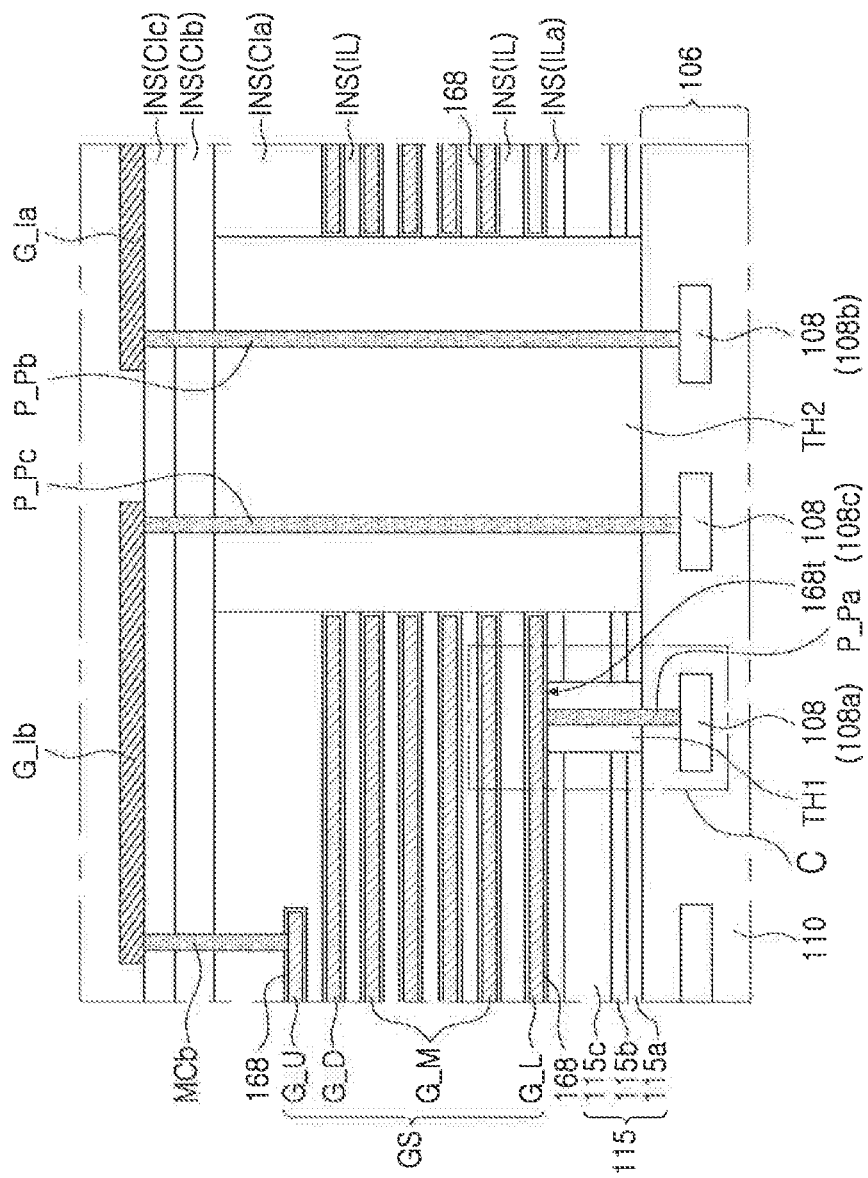
FIG. 11 is a partially enlarged view schematically illustrating a modified example of part 'A2' in FIG. 6, according to an exemplary embodiment of the present inventive concept.

Referring again to FIGS. 7 and 8, the lower gate electrode G_L may be formed of a different conductive material from the intermediate, dummy, and upper gate electrodes G_M, G_D, and G_U, but the present inventive concept is not limited thereto. For example, the lower gate electrode G_L may be formed of the same conductive material as the intermediate, dummy, and upper gate electrodes G_M, G_D, and G_U. A modified example of components in a case in which the lower gate electrode G_L is formed of the same conductive material as the intermediate, dummy, and upper gate electrodes G_M, G_D, and G_U will be described with reference to FIGS. 10 and 11. FIG. 10 is a partially enlarged view of part 'A1' in FIG. 6, and FIG. 11 is a partially enlarged view of part 'A2' in FIG. 6. Hereinafter, detailed descriptions of the components described with reference to FIGS. 7 and 8 may be omitted, and modified portions among the components described with reference to FIGS. 7 and 8 will be mainly described.

Referring to FIGS. 10 and 11 together with FIGS. 4 to 6, the lower gate electrode G_L may be formed of the same conductive material as the intermediate, dummy, and upper gate electrodes G_M, G_D, and G_U and have the same thickness as the intermediate, dummy, and upper gate electrodes G_M, G_D, and G_U. The vertical channel structure VS may include a lower channel semiconductor layer 135 passing through the lower gate electrode G_L to be in contact with the upper substrate 115, an insulating core layer 148' disposed on the lower channel semiconductor layer 135 and extending in the direction Z, perpendicular to a surface of the upper substrate 115 to pass through the intermediate, dummy, and upper gate electrodes G_M, G_D, and G_U, an upper channel semiconductor layer 146' covering side and bottom surfaces of the insulating core layer 148' and in contact with the lower channel semiconductor layer 135, a first gate dielectric material 140' surrounding outer side surfaces of the upper channel semiconductor layer 146', and a pad layer 150 disposed on the insulating core layer 148' and electrically connected to the upper channel semiconductor layer 146'.

The lower channel semiconductor layer 135 may be an epitaxial layer grown from the upper substrate 115. For example, the lower channel semiconductor layer 135 may be a silicon epitaxial layer. The upper channel semiconductor layer 146', the insulating core layer 148', the first gate dielectric material 140', and the pad layer 150 may include the same material as the channel semiconductor layer 146, the insulating core layer 148, the first gate dielectric material 140, and the pad layer 150, described with reference to FIGS. 7 and 8.

As described with reference to FIGS. 7 and 8, the second gate dielectric material 168 may be disposed between the intermediate, dummy, and upper gate electrodes G_M, G_D, and G_U and the vertical channel structure VS to extend to upper and lower surfaces of the intermediate, dummy, and upper gate electrodes G_M, G_D, and G_U. In addition, the second gate dielectric material 168 may be disposed between the lower gate electrode G_L and the vertical channel structure VS to extend on upper and lower surfaces of the lower gate electrode G_L.

A lower gate dielectric material 167 may be disposed between the lower channel semiconductor layer 135 and the lower gate electrode G_L. The lower gate dielectric material 167 may be formed by thermally oxidizing the lower channel semiconductor layer 135. For example, the lower channel semiconductor layer 135 may include silicon oxide. A portion of the second gate dielectric, material 168 may be disposed between the lower gate dielectric material 167 and the lower gate electrode G_L.

As illustrated in FIGS. 7 and 8, the first through region TH1 may pass through the upper substrate 115 and the lowest interlayer insulating layer ILa. The first peripheral connection plug P_Pa may extend upward from the first peripheral interconnection 108a to pass through the first through region TH1. The second gate dielectric material 168 covering the lower surface of the lower gate electrode G_L may cover the upper surface of the first through region TH1 and the upper surface of the first peripheral connection plug P_Pa. Accordingly, as shown in FIG. 11, a portion 168t of the second gate dielectric material 168 may be interposed between the lower surface of the lower gate electrode G_L and the upper surface of the first through region TH1, and between the lower surface of the lower gate electrode G_L and the upper surface of the first peripheral connection plug P_Pa. The portion of 168t of the second gate dielectric material 168 disposed between the lower gate electrode G_L and the first peripheral connection plug P_Pa may not insulate the lower gate electrode G_L and the first peripheral connection plug P_Pa, and thus, charges may tunnel therethrough. In this case, the portion of 168t of the second gate dielectric material 168 disposed between the lower gate electrode G_L and the first peripheral connection plug P_Pa may be a 'tunnel dielectric layer'. Accordingly, the first peripheral connection plug P_Pa and the lower gate electrode G_L may be electrically connected via the tunnel dielectric layer 168t.

Figure 12A:
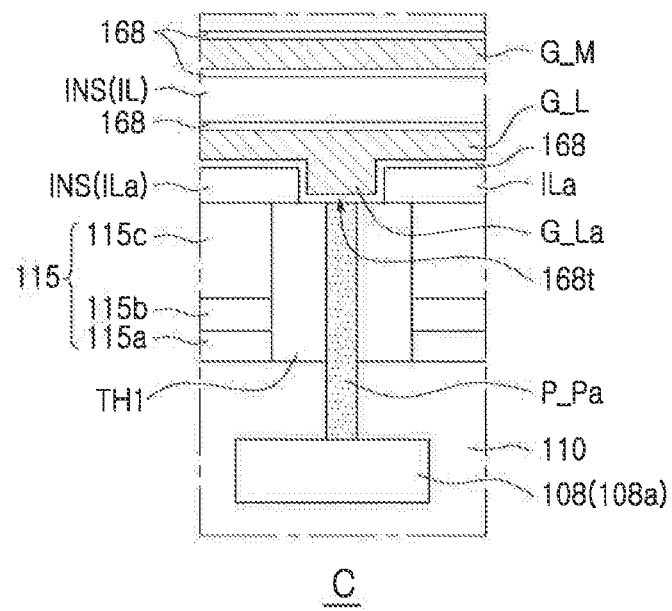
FIGS. 12A and 12B are partially enlarged views illustrating modified examples of part 'C' in FIG. 11, according to an exemplary embodiment of the present inventive concept.
Figure 12B:
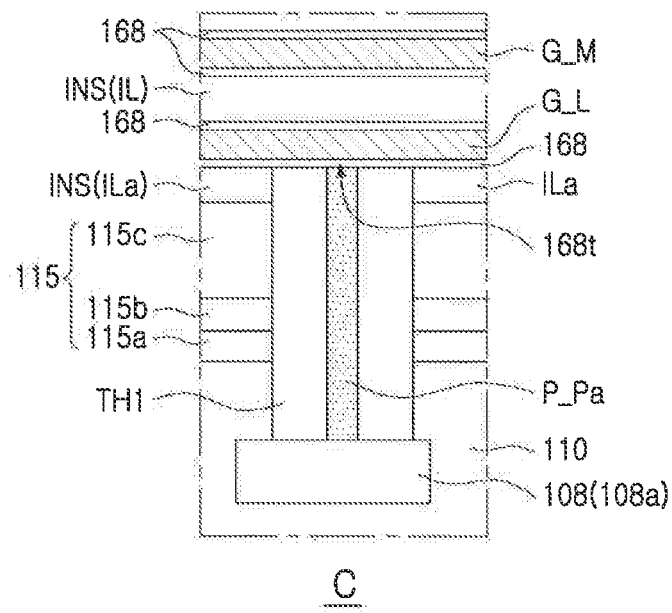

Next, modified examples of part 'C' including the first through region TH1, the upper substrate 115, the lower gate electrode G_L, the lowest interlayer insulating layer ILa, the first peripheral connection plug P_Pa, and the first peripheral interconnection 108a in FIG. 10 will be described with reference to FIGS. 12A and 12B. FIGS. 12A and 12B are partially enlarged views illustrating the modified examples of part 'C' in FIG. 11, according to an exemplary embodiment of the present inventive concept.

In a modified example, referring to FIG. 12A, the first through region TH1 may pass through the upper substrate 115 to be disposed below the lowest interlayer insulating layer ILa. The first peripheral connection plug P_Pa may extend upward from the first peripheral interconnection 108a, pass through the first through region TH1, and have an upper surface coplanar with the upper surface of the upper substrate 115. The lower gate electrode G_L may include the lower protrusion G_La extending downward into the lowest interlayer insulating layer ILa. The second gate dielectric material 168 disposed on the lower surface of the lower gate electrode G_L may extend to a side surface of the lower protrusion G_La and a space between the lower protrusion G_La and the first peripheral connection plug P_Pa. A portion of the second gate dielectric material 168 disposed between the lower protrusion G_La and the first peripheral connection plug P_Pa may be the tunnel dielectric layer 168t. For example, the tunnel dielectric layer 168t may contact an upper surface of the first through region TH1. The tunnel dielectric layer 168t may also contact the first peripheral connection plug P_Pa.

In another modified example, referring to FIG. 12B, the first through region TH1 may extend upward from the first peripheral interconnection 108a and pass through the upper substrate 115 and the lowest interlayer insulating layer ILa. The second gate dielectric material 168 disposed on the lower surface of the lower gate electrode G_L may extend to a space between the lower gate electrode G_L and the first through region TH1 and a space between the lower gate electrode G_L and the first peripheral connection plug P_Pa. A portion of the second gate dielectric material 168 disposed between the lower gate electrode G_L and the first peripheral connection plug P_Pa may be the tunnel dielectric layer 168t. For example, the tunnel dielectric layer 168t may contact both the first peripheral connection plug P_Pa and the lower gate electrode G_L.

Referring again to FIGS. 4 to 6, as described above, the first through region TH1 and the first peripheral connection plug P_Pa passing through the first through region TH1 may be disposed in the first extension area E_ST1 to be closer to the memory cell array region 20 than the second through region TH2. In addition, the first through region TH1 may have a line shape extending in the second direction Y. However, the present inventive concept is not limited thereto. Hereinafter, modified examples regarding the arrangement of the first through region TH1 will be described. Hereinafter, the first peripheral connection plug P_Pa may be pass through the first through region TH1, although this may not specifically described. In other words, detailed descriptions of the arrangement of the first peripheral connection plug P_Pa may be omitted.

Figure 13A:
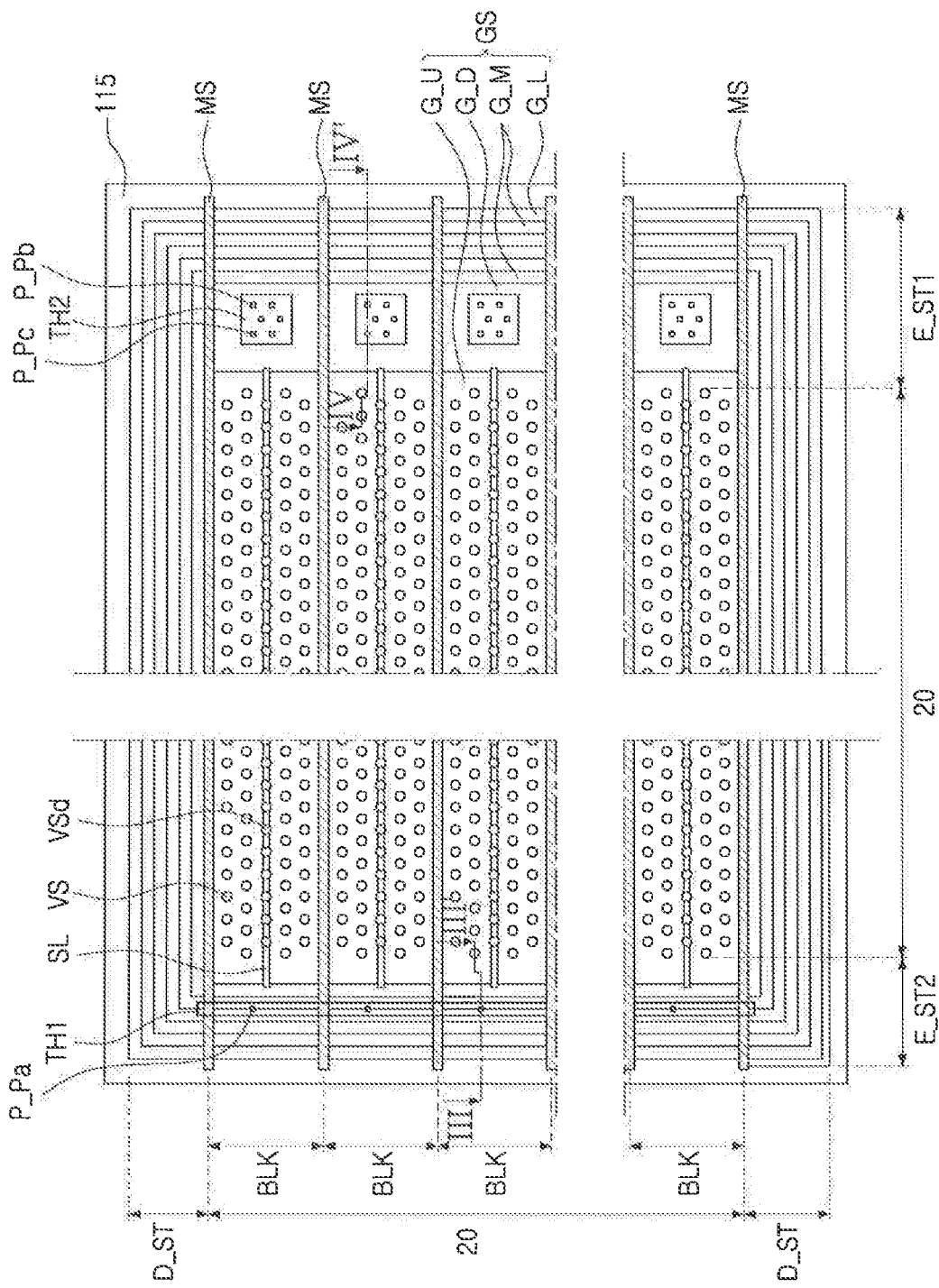
FIGS. 13A and 13B and FIG. 14 are diagrams illustrating a modified example of a three-dimensional semiconductor device according to an exemplary embodiment of the present inventive concept.
Figure 13B:
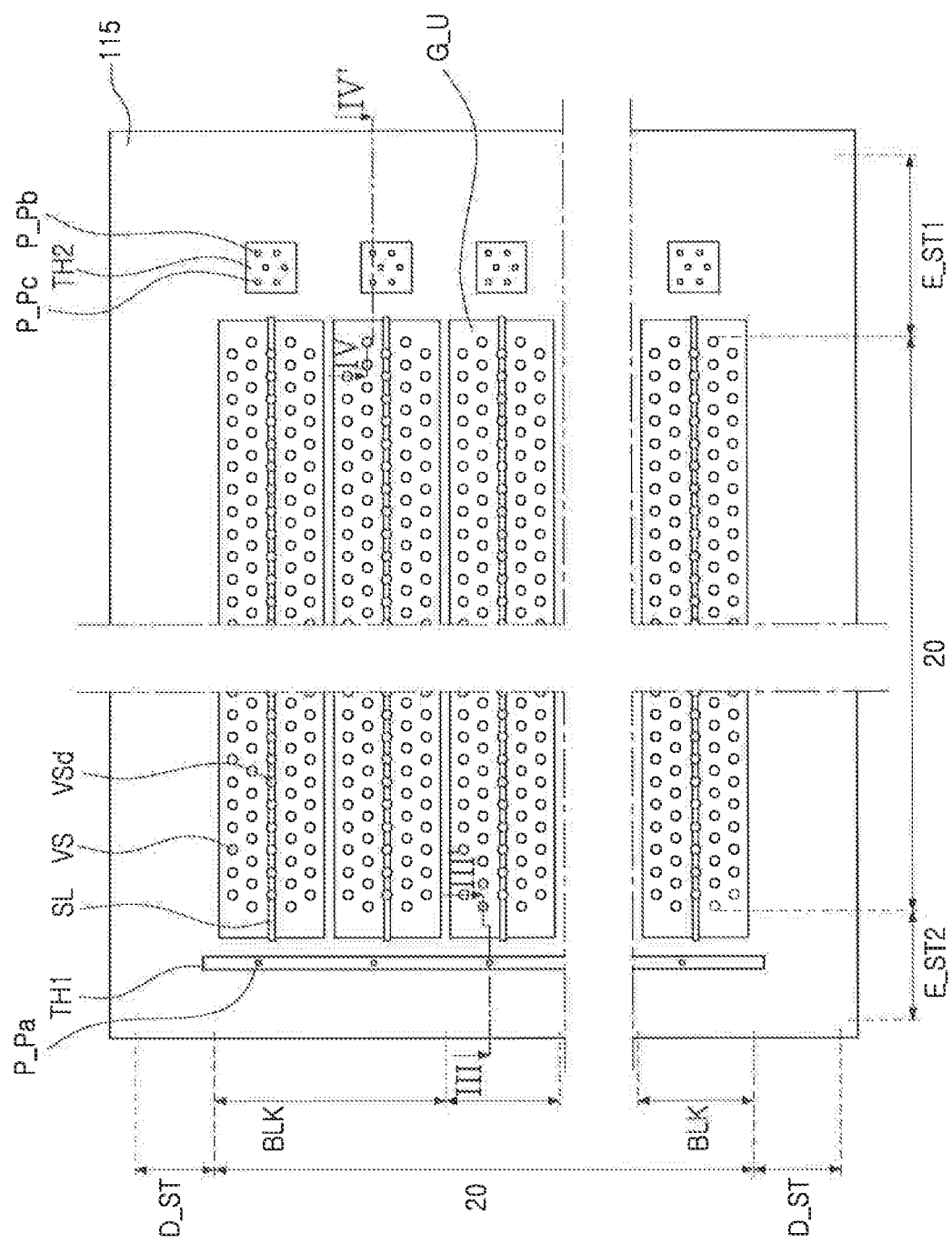
Figure 14:
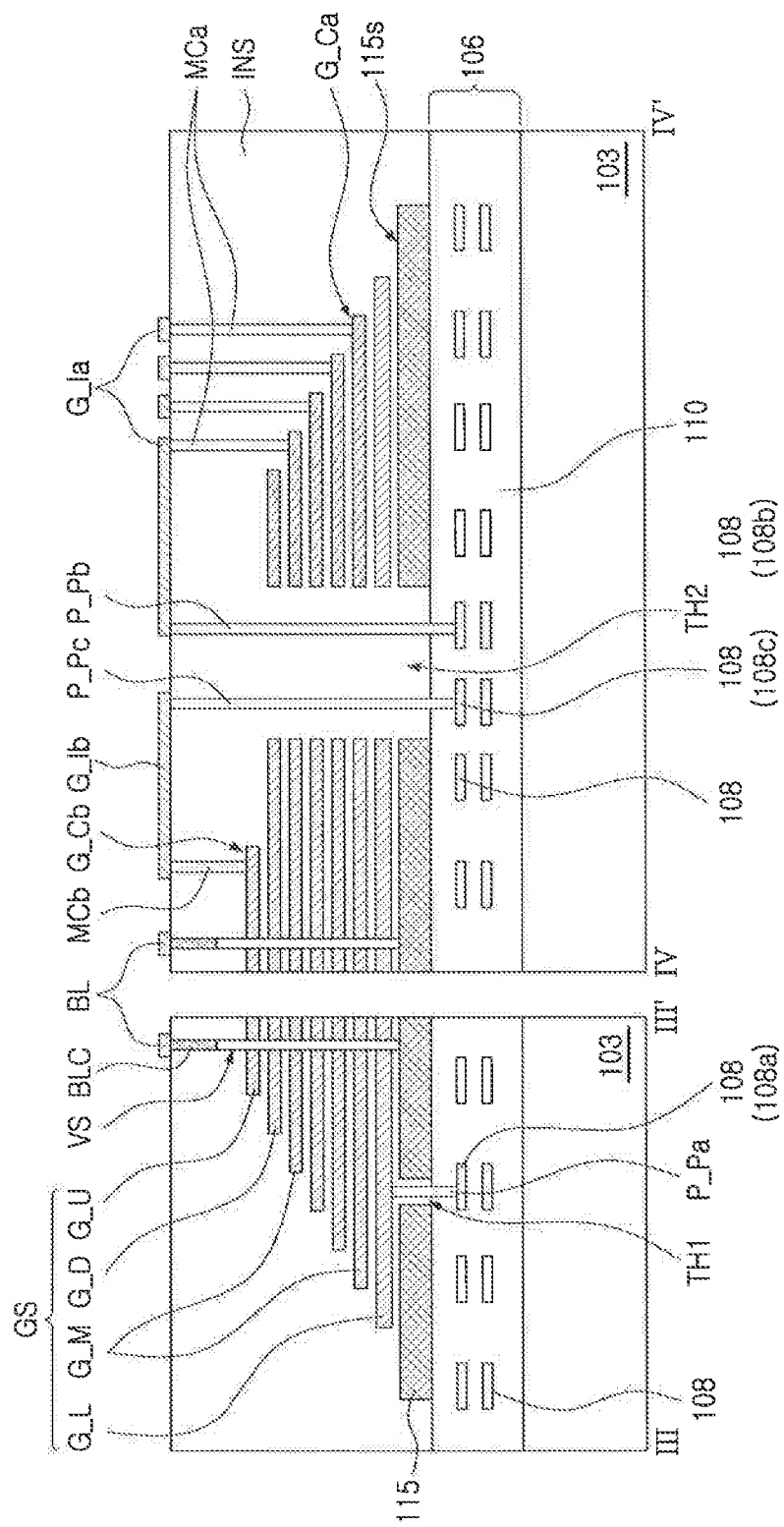
Figure 15A:
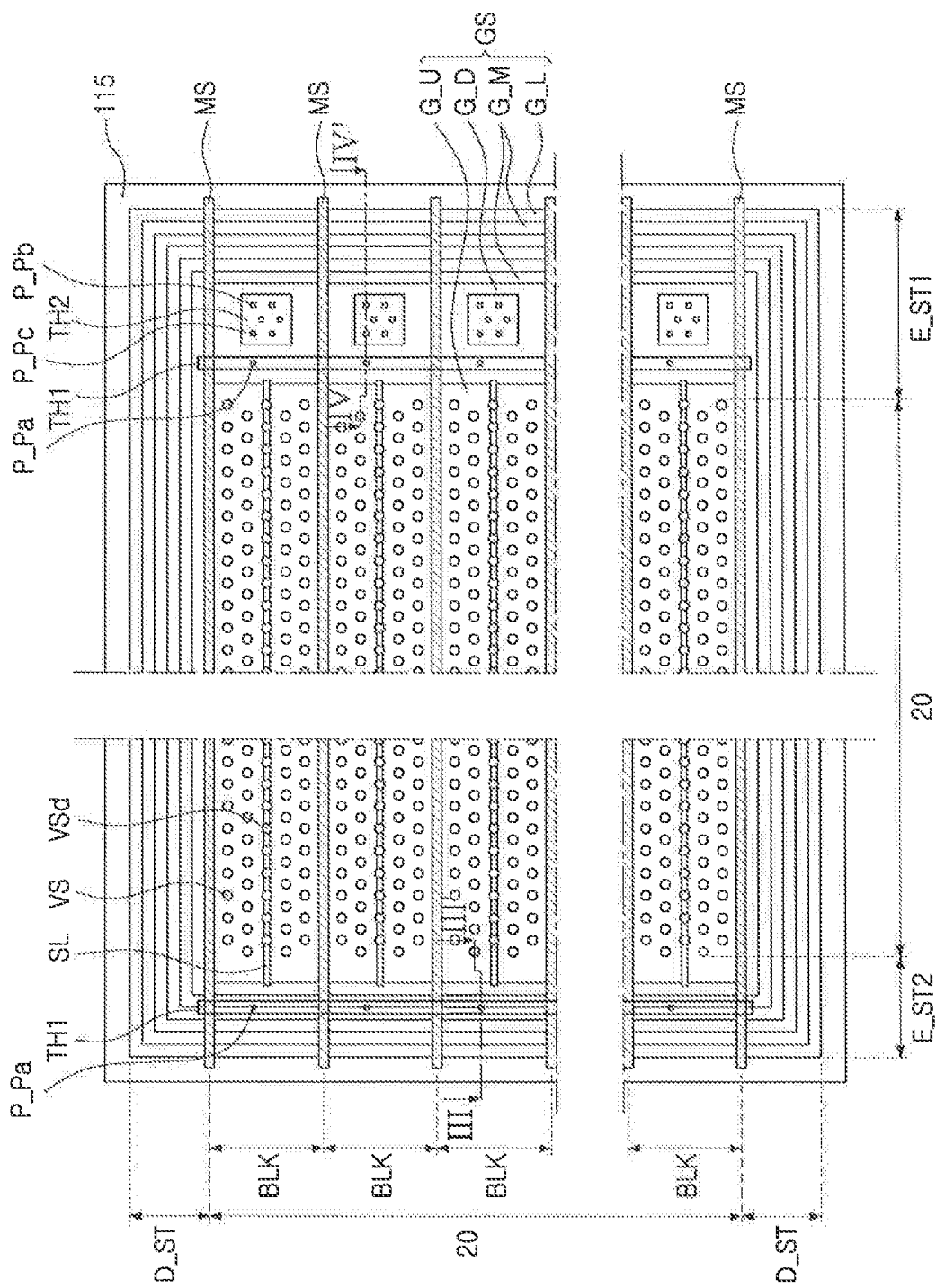
FIGS. 15A and 15B and FIG. 16 are diagrams illustrating a modified example of a three-dimensional semiconductor device according to an exemplary embodiment of the present inventive concept.
Figure 15B:
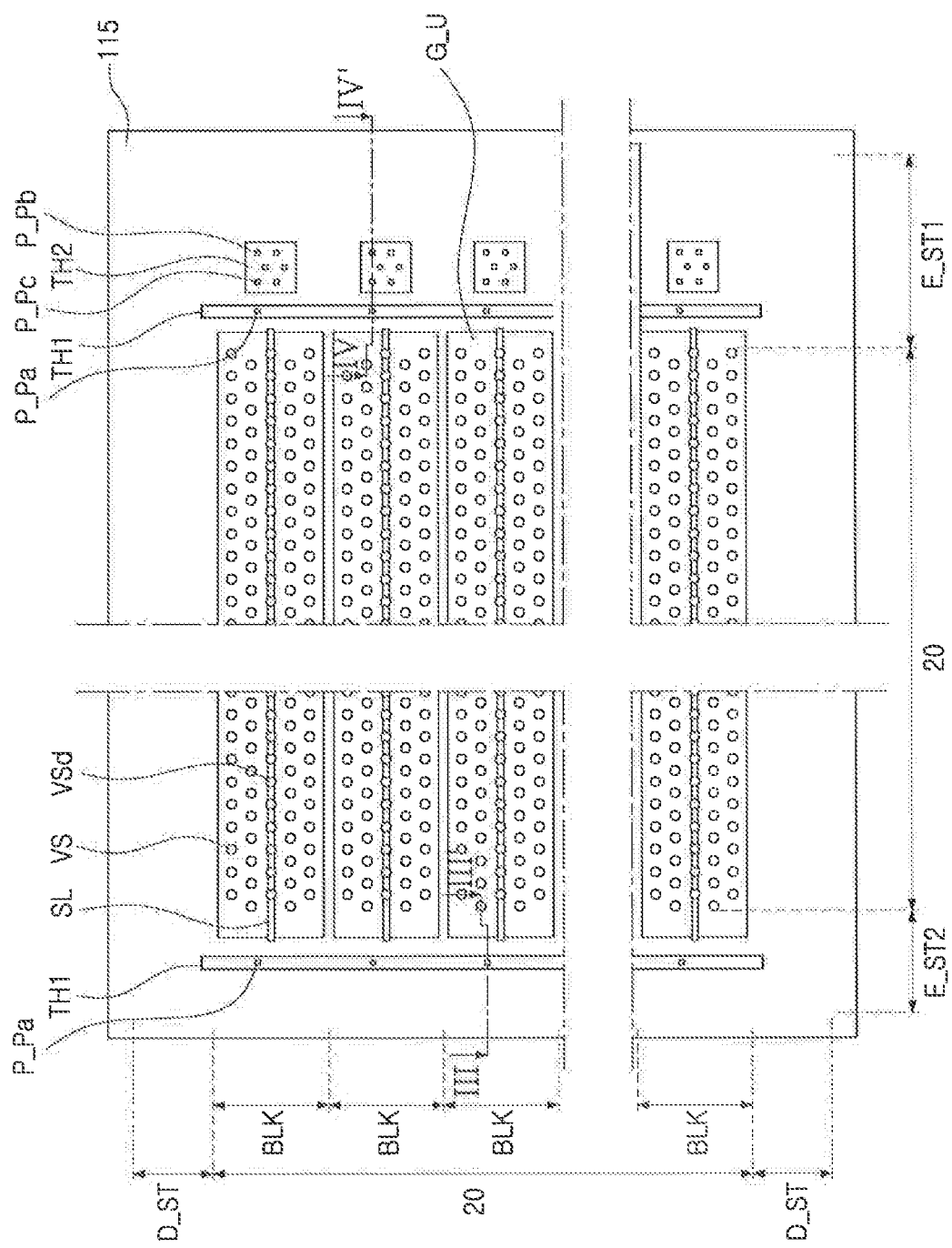
Figure 16:
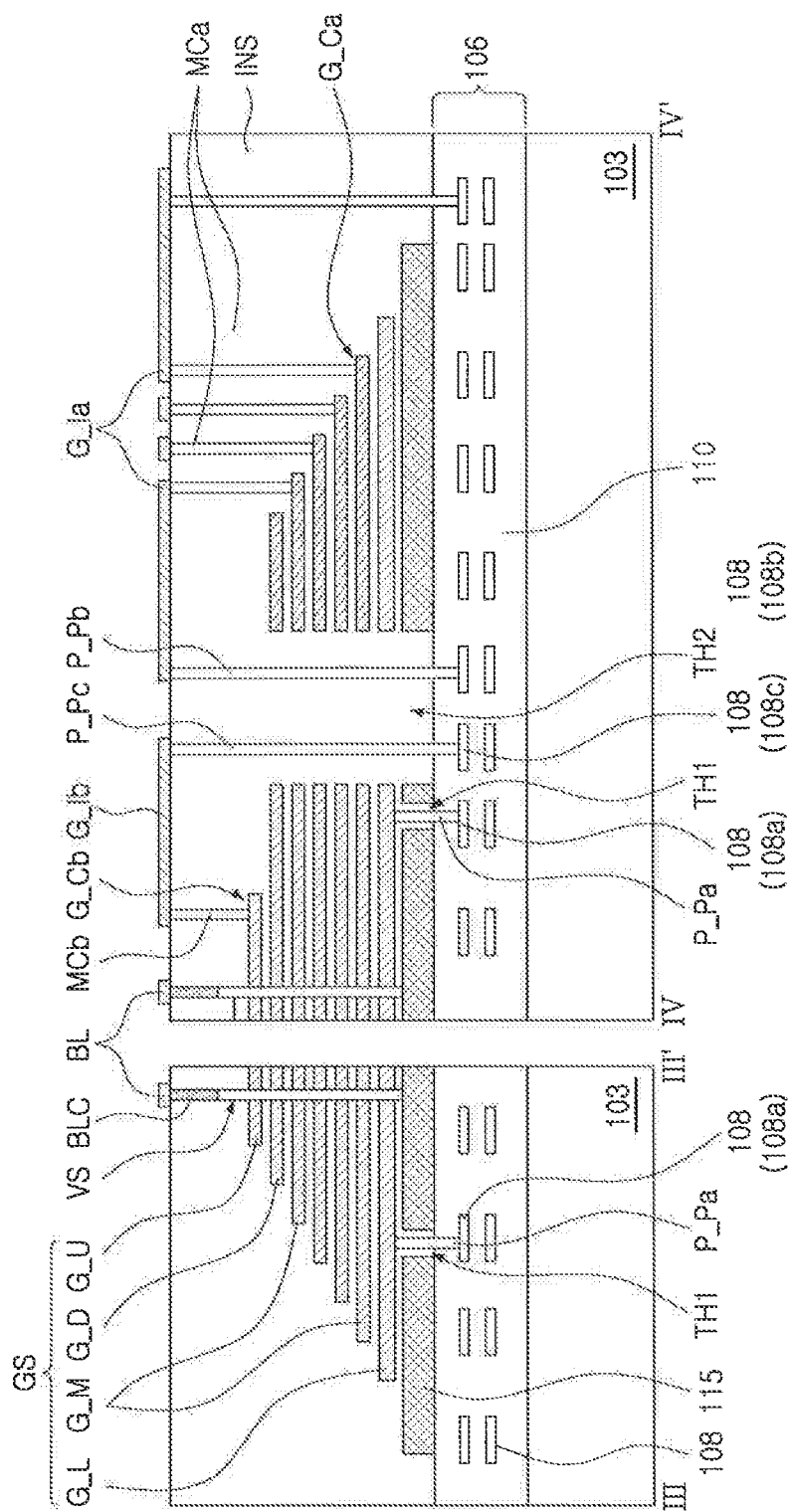

FIGS. 13A and 13B and FIG. 14 are diagrams illustrating a modified example of the arrangement of the first through region TH1, according to an exemplary embodiment of the present inventive concept, and FIGS. 15A and 15B and FIG. 16 are diagrams illustrating another modified example of the arrangement of the first through region TH1 and the first peripheral connection plug P_Pa, according to an exemplary embodiment of the present inventive concept. In addition, FIG. 17 is a plan view illustrating another modified example of the arrangement of the first through region TH1 and the first peripheral connection plug P_Pa, according to an exemplary embodiment of the present inventive concept, and FIG. 18 is a plan view illustrating another modified example of the arrangement of the first through region TH1 and the first peripheral connection plug P_Pa, according to an exemplary embodiment of the present inventive concept.

In a modified example, referring to FIGS. 13A and 13B and FIG. 14, the first through region TH1 may be disposed in the second extension area E_ST2. Accordingly, the second through region TH2 may be disposed in the first extension area E_ST1, and the first through region TH1 may be disposed in the second extension area E_ST2. FIG. 13B shows a version of FIG. 13A with elements removed for ease of viewing. FIG. 15B shows a version of FIG. 15A with elements removed for ease of viewing.

In another modified example, referring to FIGS. 15A and 15B and FIG. 16, the first through region TH1 may include a portion disposed in the first extension area E_ST1 and a portion disposed in the second extension area E_ST2. The second through region TH2 may be disposed in the first extension area E_ST1. The portion of the first through region TH1, disposed in the first extension area E_ST1, may be disposed between the second through region TH2 and the memory cell array region 20.

Figure 17:
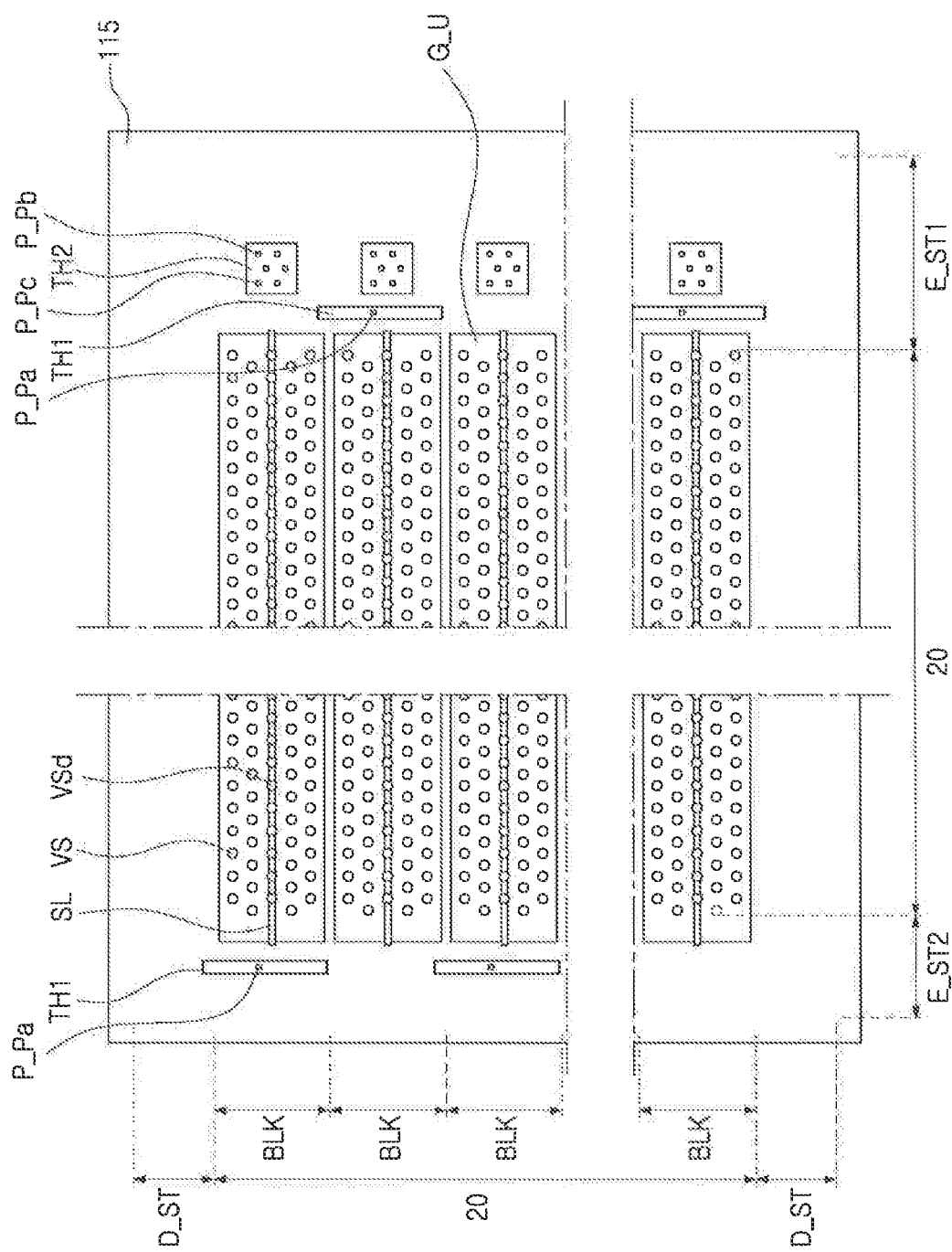
FIG. 17 is a plan view illustrating a modified example of a three-dimensional semiconductor device according to an exemplary embodiment of the present inventive concept.
Figure 18:
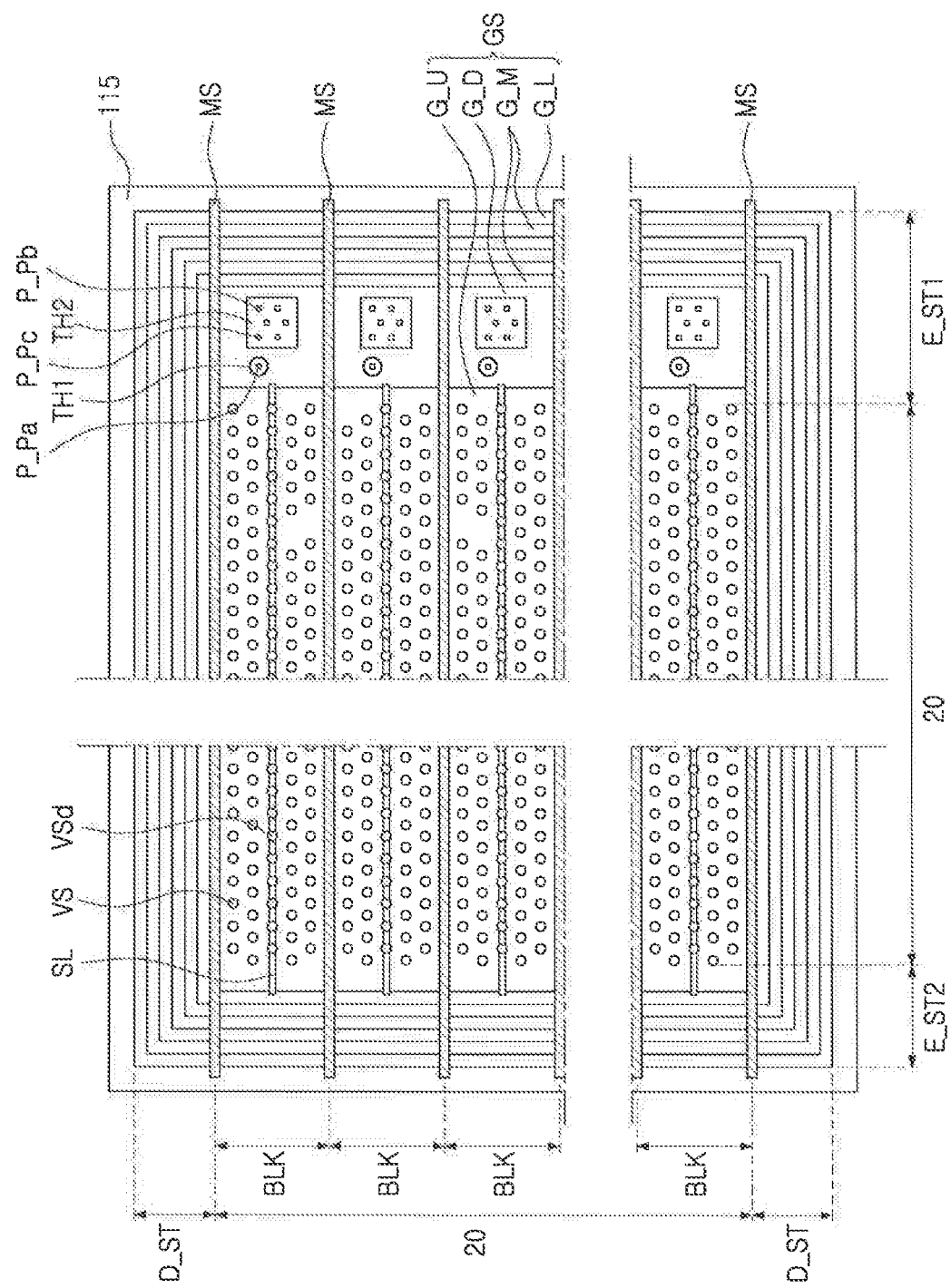
FIG. 18 is a plan view illustrating a modified example of a three-dimensional semiconductor device according to an exemplary embodiment of the present inventive concept.

In another modified example, referring to FIG. 17, the first through region TH1 may include a plurality of portions spaced apart from each other in the first extension area E_ST1 and a plurality of portions spaced apart from each other in the second extension area E_ST2. In other words, the plurality of portions of the first through region TH1 may not form a single continuous shape. The plurality of portions of the first through region TH1 may be arranged in a zigzag form with the memory cell array region 20 therebetween. The first through region TH1 may have a bar shape.

In another modified example, referring to FIG. 18, the first through region TH1 may include a plurality of portions disposed between the second through region TH2 and the memory cell array region 20 and spaced apart from each other. Each of the plurality of portions of the first through region TH1 may have a circular shape in a plan view. As shown in FIG. 18, the plurality of portions of the first through region TH1 may be circular in form.

Figure 19A:
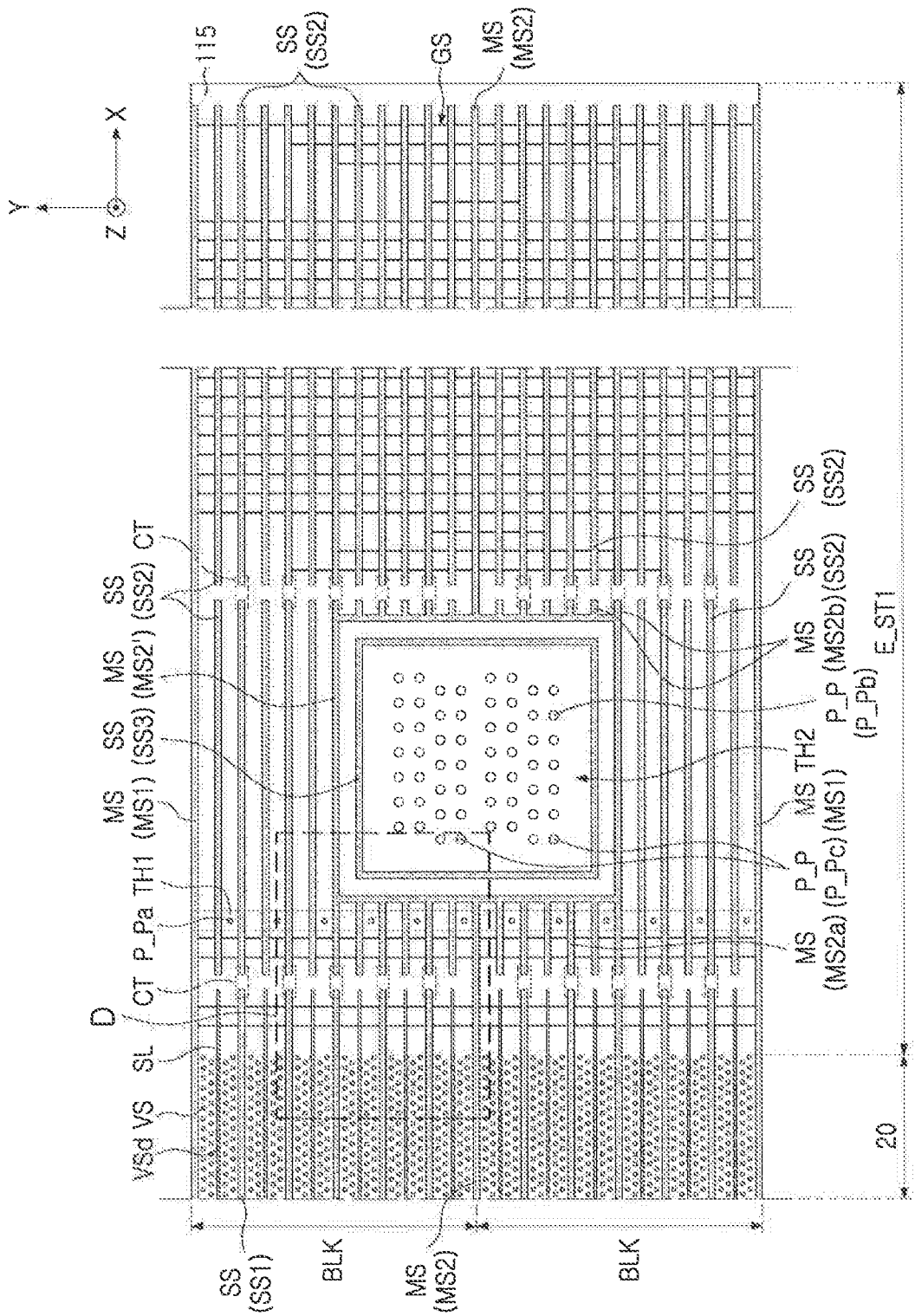
FIGS. 19A and 19B and FIGS. 20A and 20B are diagrams illustrating a modified example of a three-dimensional semiconductor device according to an exemplary embodiment the present inventive concept.
Figure 19B:
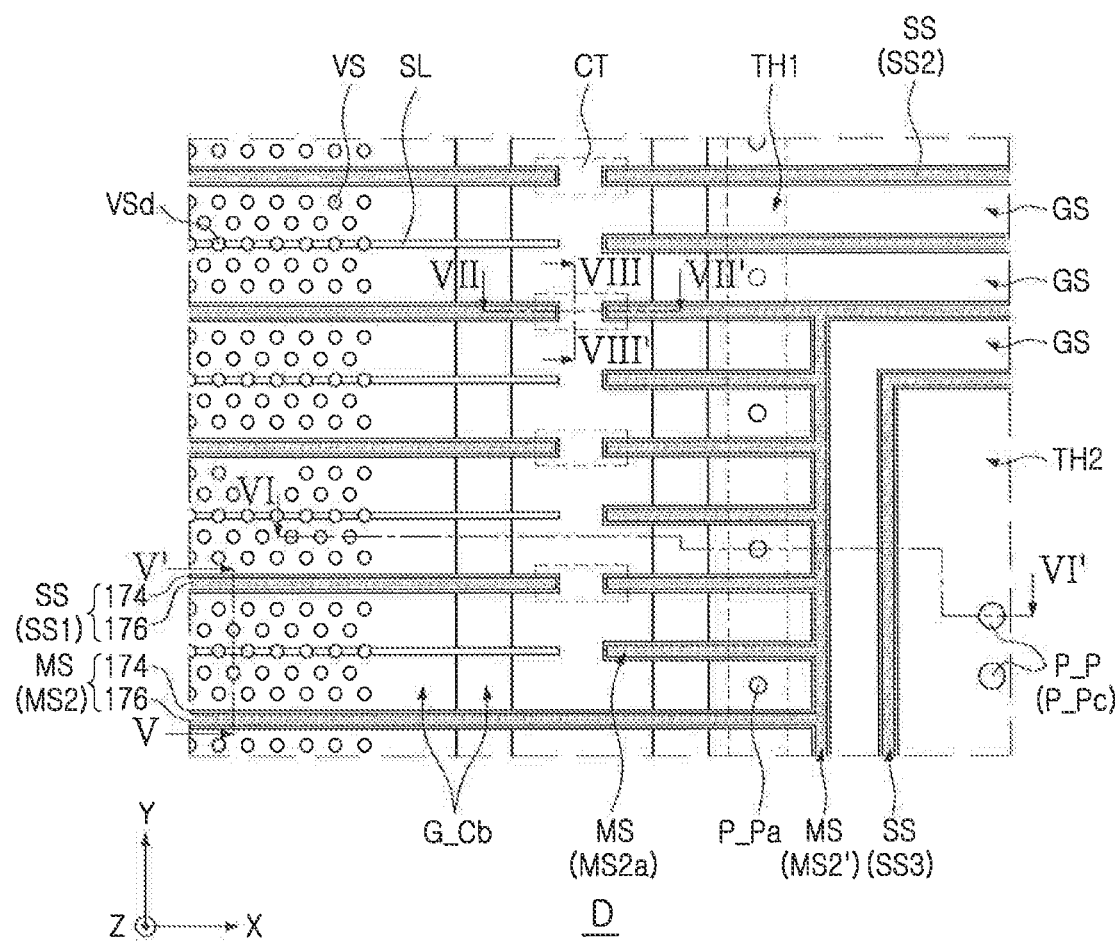
Figure 20A:
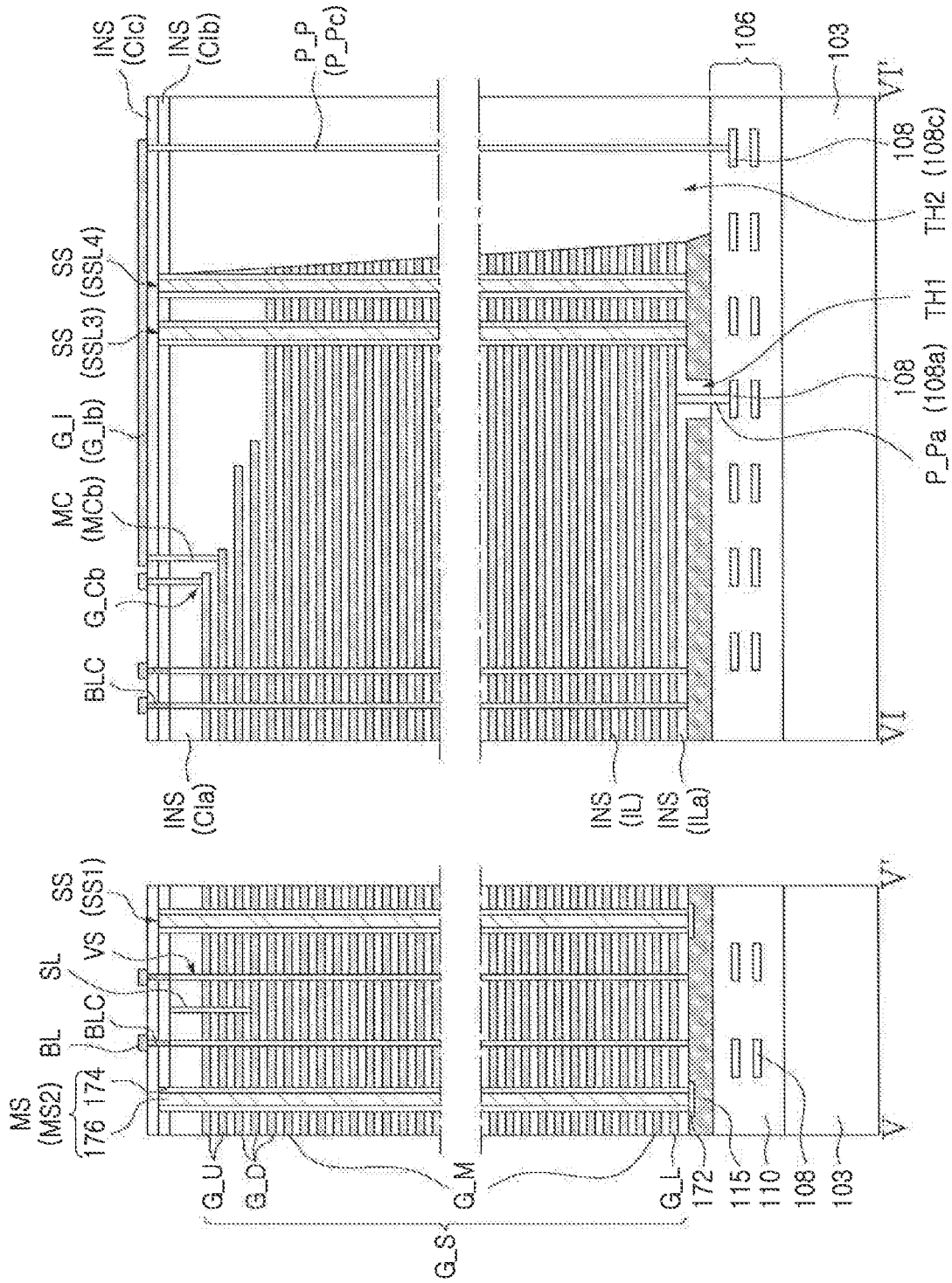
Figure 20B:
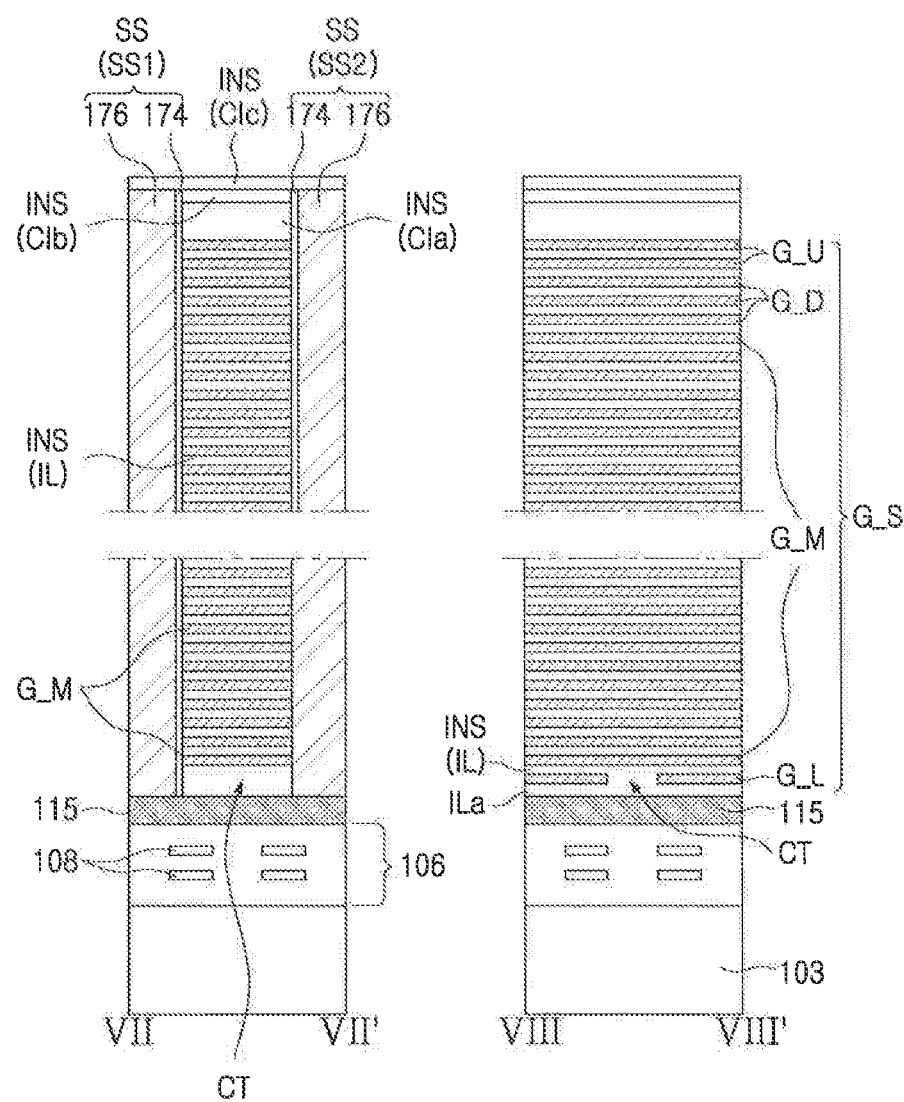

In a three-dimensional semiconductor device according to an exemplary embodiment of the present inventive concept, the gate electrodes may have various staircase forms as the number of gate electrodes stacked in a gate-stack structure increases. Examples of the staircase forms of the gate electrodes stacked in the gate-stack structure in a three-dimensional semiconductor device according to an exemplary embodiment of the present inventive concept will be described with reference to FIGS. 19A and 19B and FIGS. 20A and 20B. In FIGS. 19A to 20B, FIG. 19A is a plan view illustrating a three-dimensional semiconductor device according to an exemplary embodiment of the present inventive concept, FIG. 19B is a partially enlarged view illustrating part 'D' in FIG. 19A, FIG. 20A is a schematic cross-sectional view illustrating regions taken along lines V-V' and VI-VI' of FIG. 19B, and FIG. 20B is a schematic cross-sectional view illustrating regions taken along lines VII-VII' and VIII-VIII' of FIG. 19B.

Referring to FIGS. 19A and 19B and FIGS. 20A and 20B, the three-dimensional semiconductor device according to the present embodiment may include the lower substrate 103, the peripheral circuit structure 106, and the upper substrate 115, as described with reference to FIGS. 4 to 6. The peripheral circuit structure 106 may include the peripheral interconnections 108 and the lower insulating layer 110 covering the peripheral interconnections 108, as described with reference to FIGS. 4 to 6. The peripheral interconnections 108 may include the first peripheral interconnection 108a, the second peripheral interconnection 108b, and the third peripheral interconnection 108c.

The three-dimensional semiconductor device according to the present embodiment may include a gate-stack structure GS including the plurality of gate electrodes, a plurality of separation structures MS and SS, a first through region TH1, a second through region TH2, a plurality of peripheral connection plugs P_Pa, P_Pb, and P_Pc, an insulating separation line SL, a plurality of gate interconnections G_I, a bit line BL, a bit-line contact plug BLC, a plurality of gate contact plugs MCa and MCb, a vertical channel structure VS, and a dummy vertical structure VSd.

The three-dimensional semiconductor device according to the present embodiment of the present inventive concept may include an insulating structure INS. The insulating structure INS may include a lowest interlayer insulating layer ILa disposed between the gate-stack structure GS and the upper substrate 115, an interlayer insulating layer IL between the plurality of gate electrodes of the gate-stack structure GS, a first capping insulating layer CIa, a second capping insulating layer CIb, and a third capping insulating layer CIc sequentially covering the gate-stack structure S.

The plurality of gate electrodes of the gate-stack structure GS may include a lower gate electrode G_L, a plurality of intermediate gate electrodes G_M disposed on the lower gate electrode G_L, at least one dummy gate electrode G_D disposed on the plurality of intermediate gate electrodes G_M, and at least one upper gate electrode G_U disposed on the dummy gate electrode G_D. Some of the plurality of intermediate gate electrodes G_M may be dummy gate electrodes, and other intermediate gate electrode G_M may be word lines. The upper gate electrode G_U may be a string select line. The lower gate electrode G_L may be a ground select line.

Figure 21:
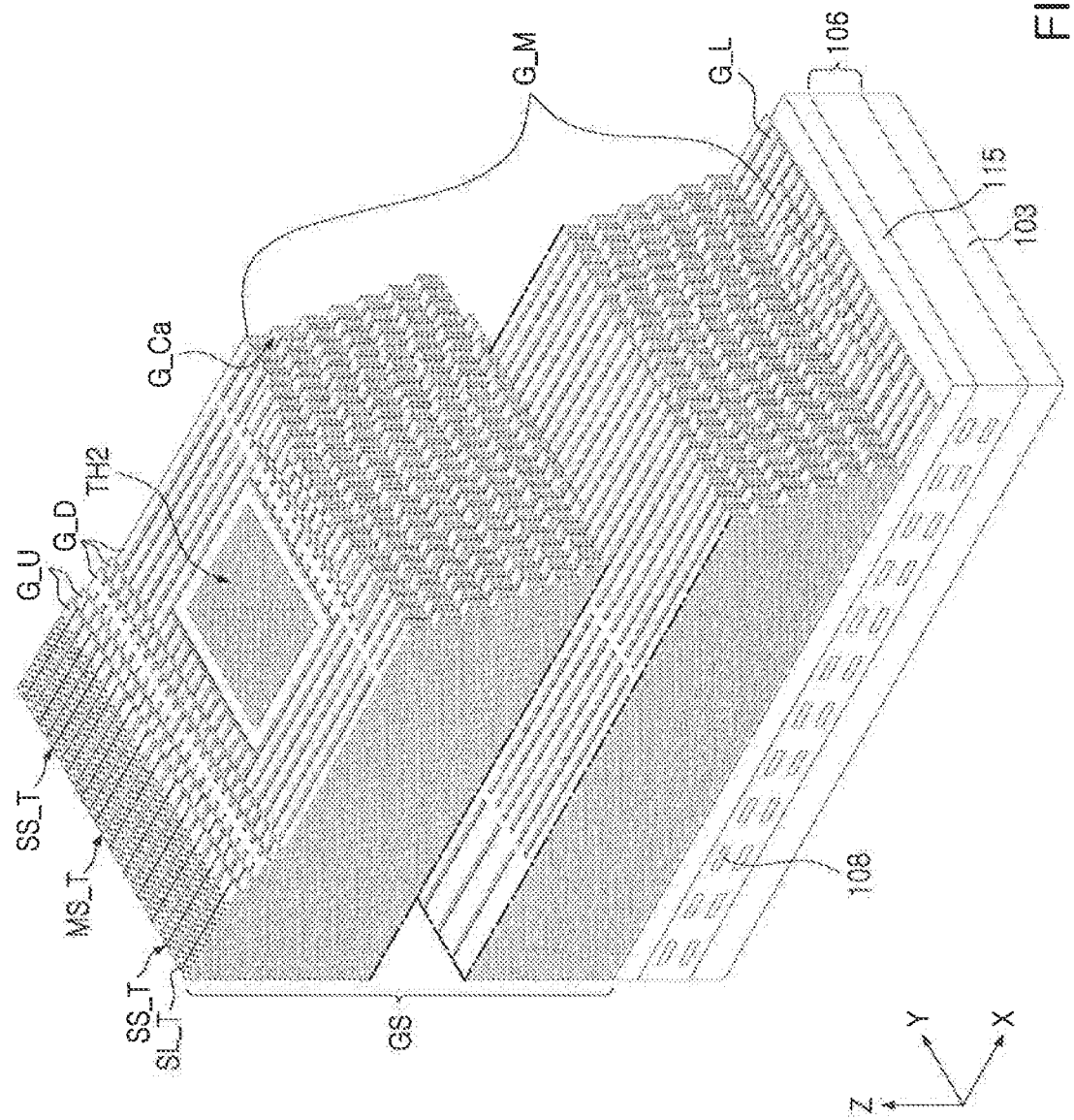
FIG. 21 is a perspective view schematically illustrating a modified example of a three-dimensional semiconductor device according to an exemplary embodiment of the present inventive concept.
Figure 22:
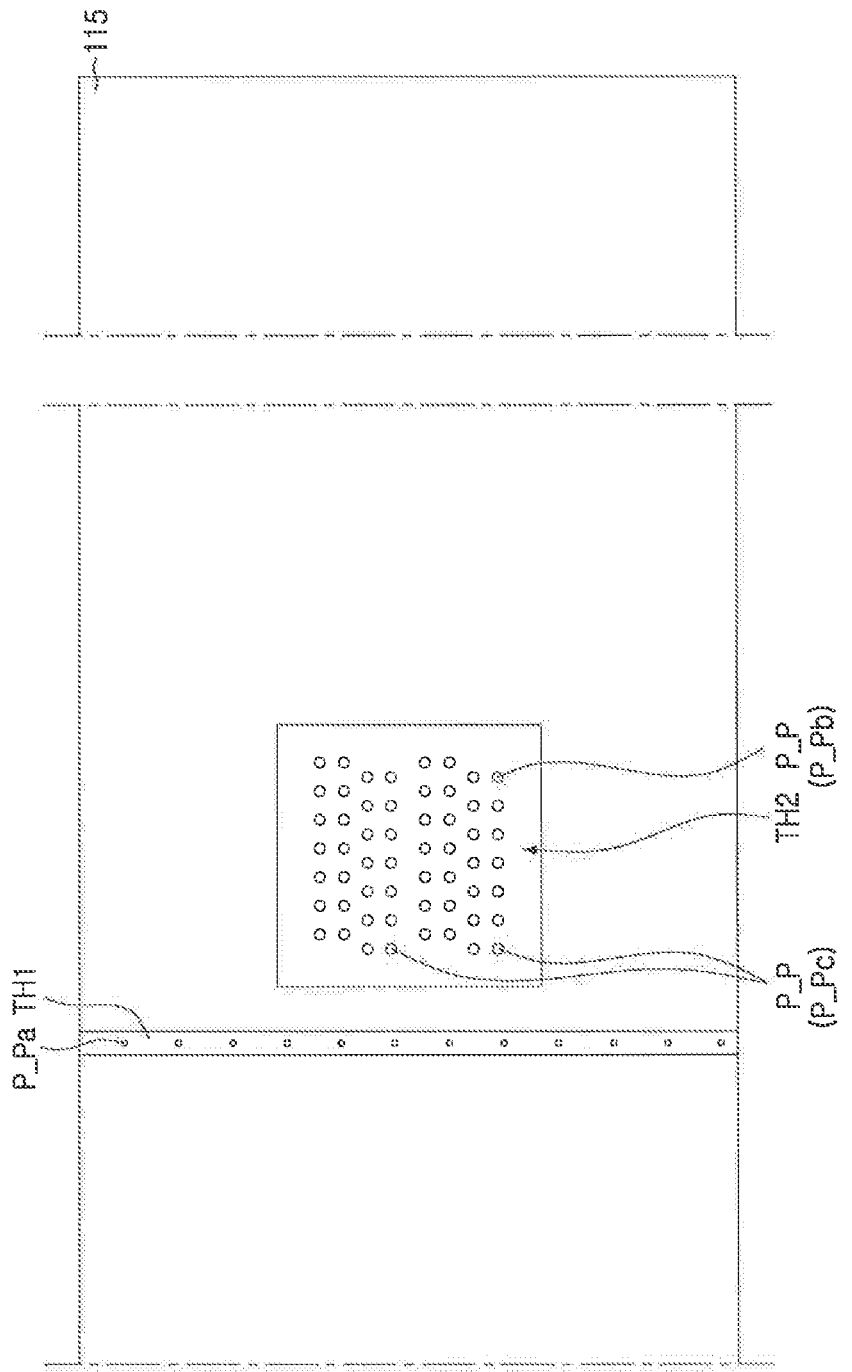
FIG. 22, FIGS. 23A and 23B, FIGS. 24A and 24B, 25A and 25B are plan views schematically illustrating a modified example of a three-dimensional semiconductor device according to an exemplary embodiment of the present inventive concept.
Figure 23A:
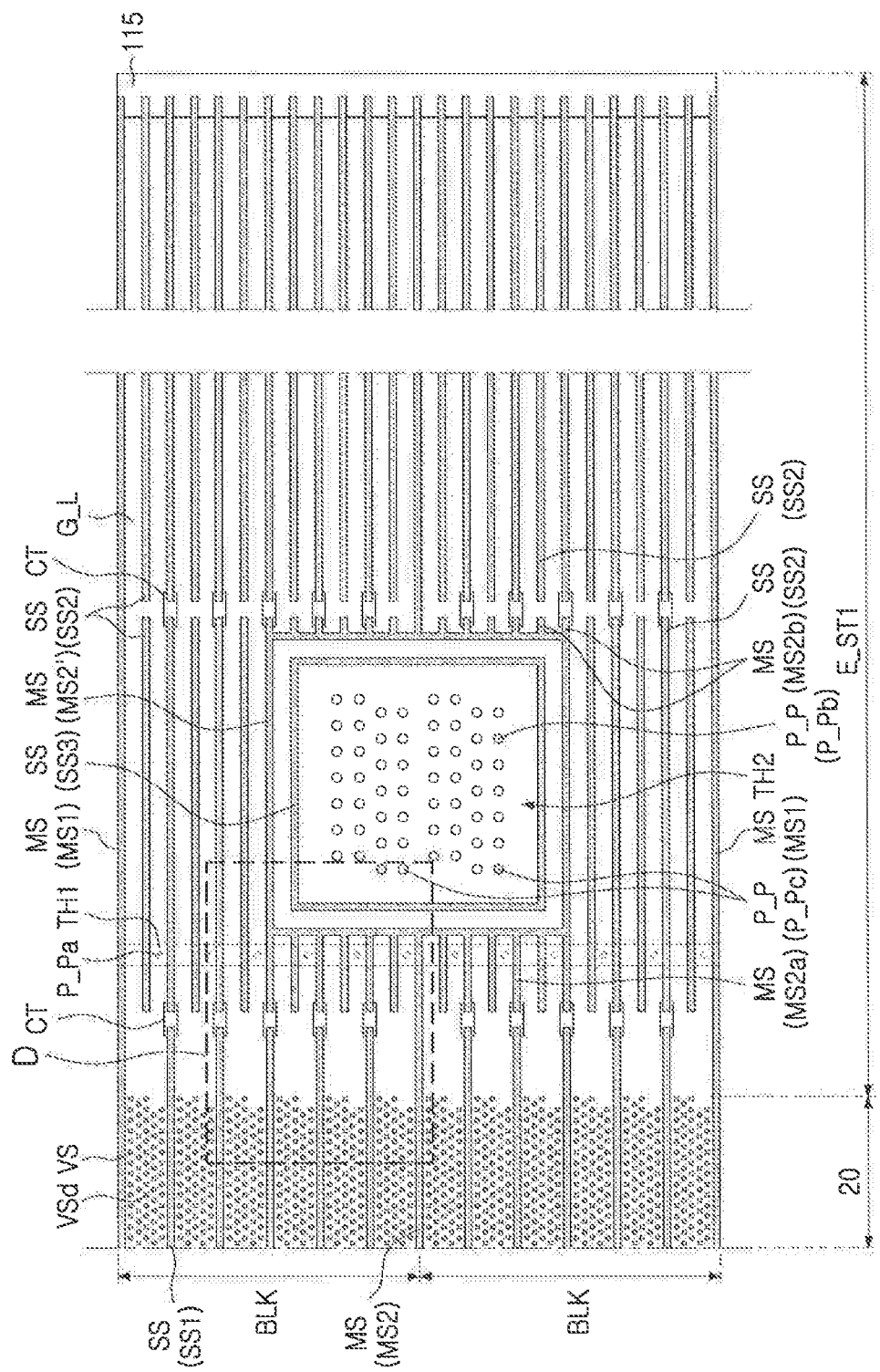
Figure 23B:
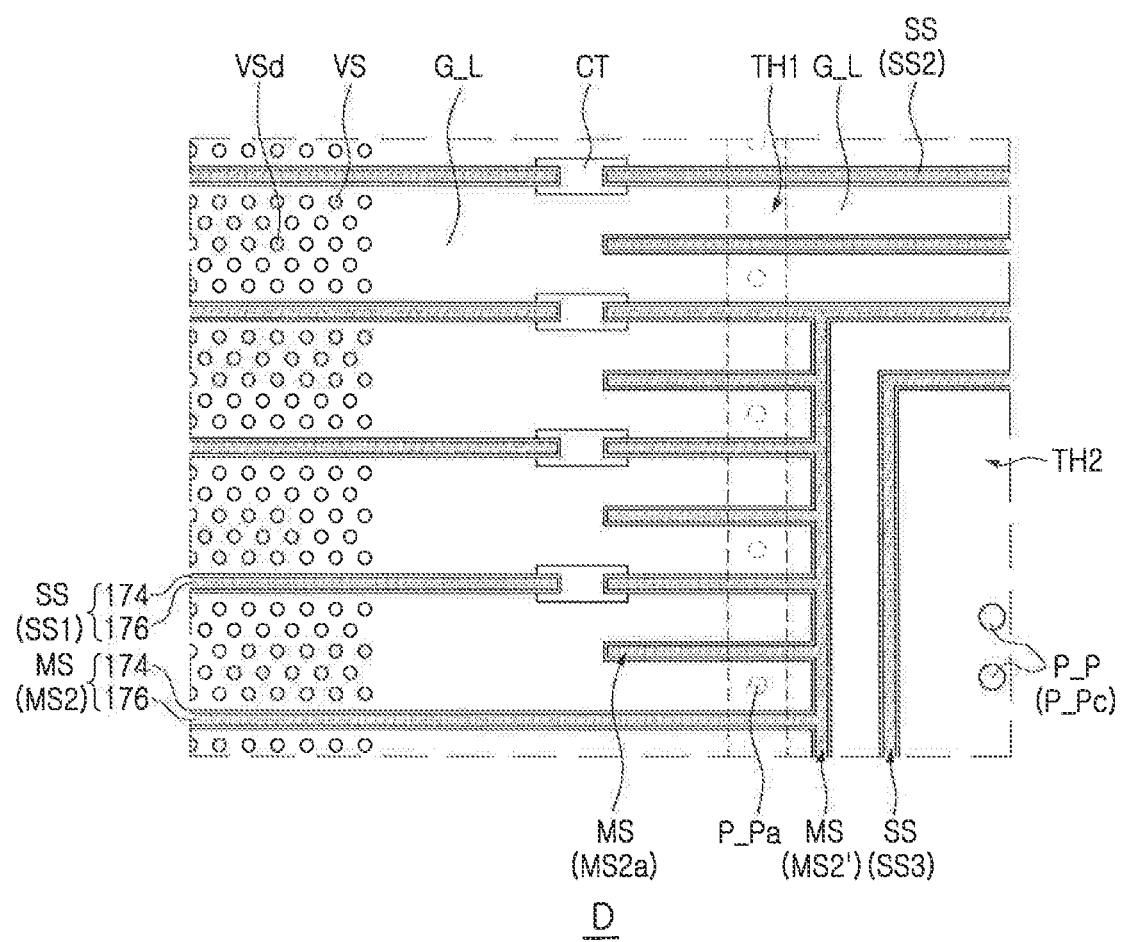
Figure 24A:
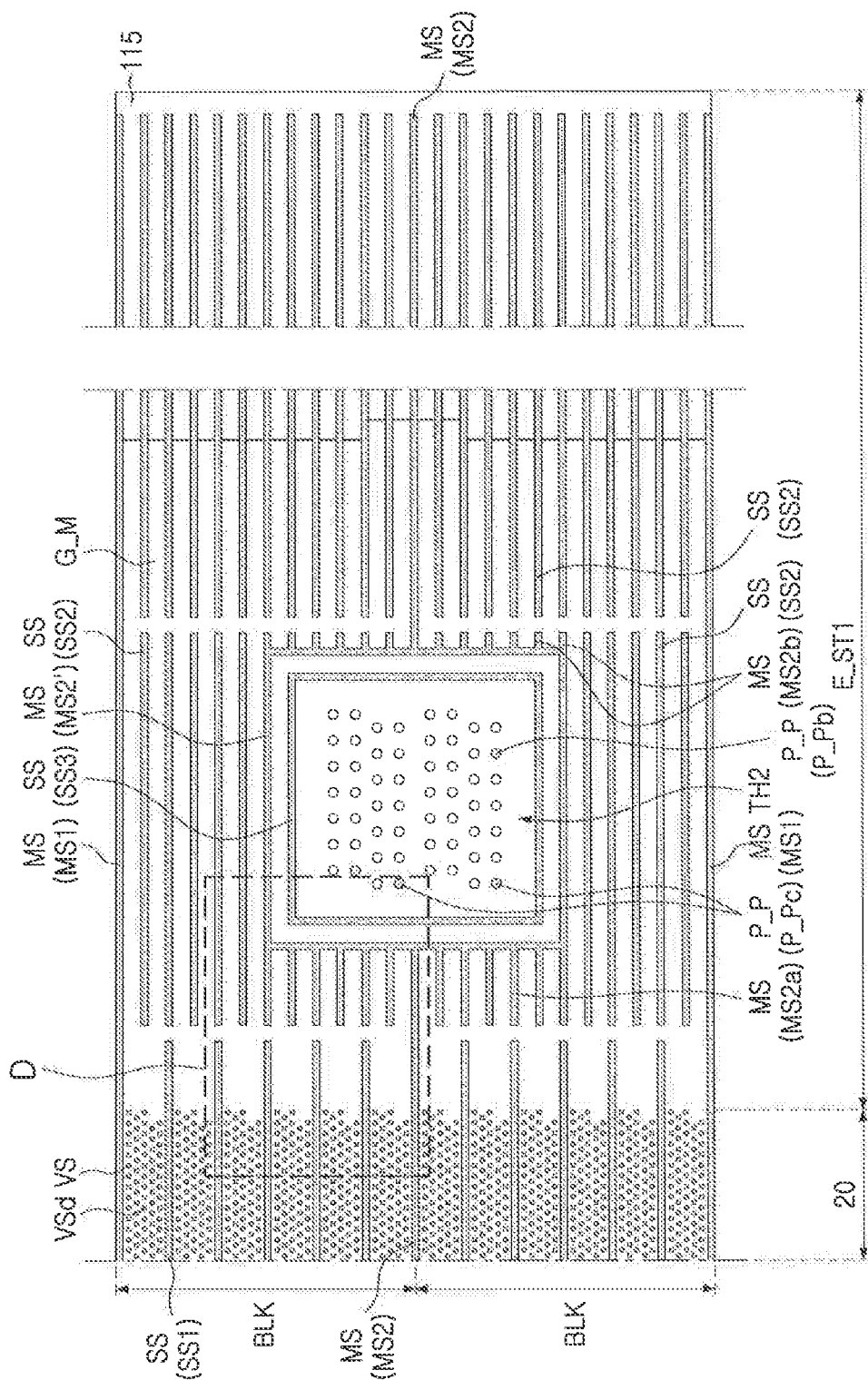
Figure 24B:
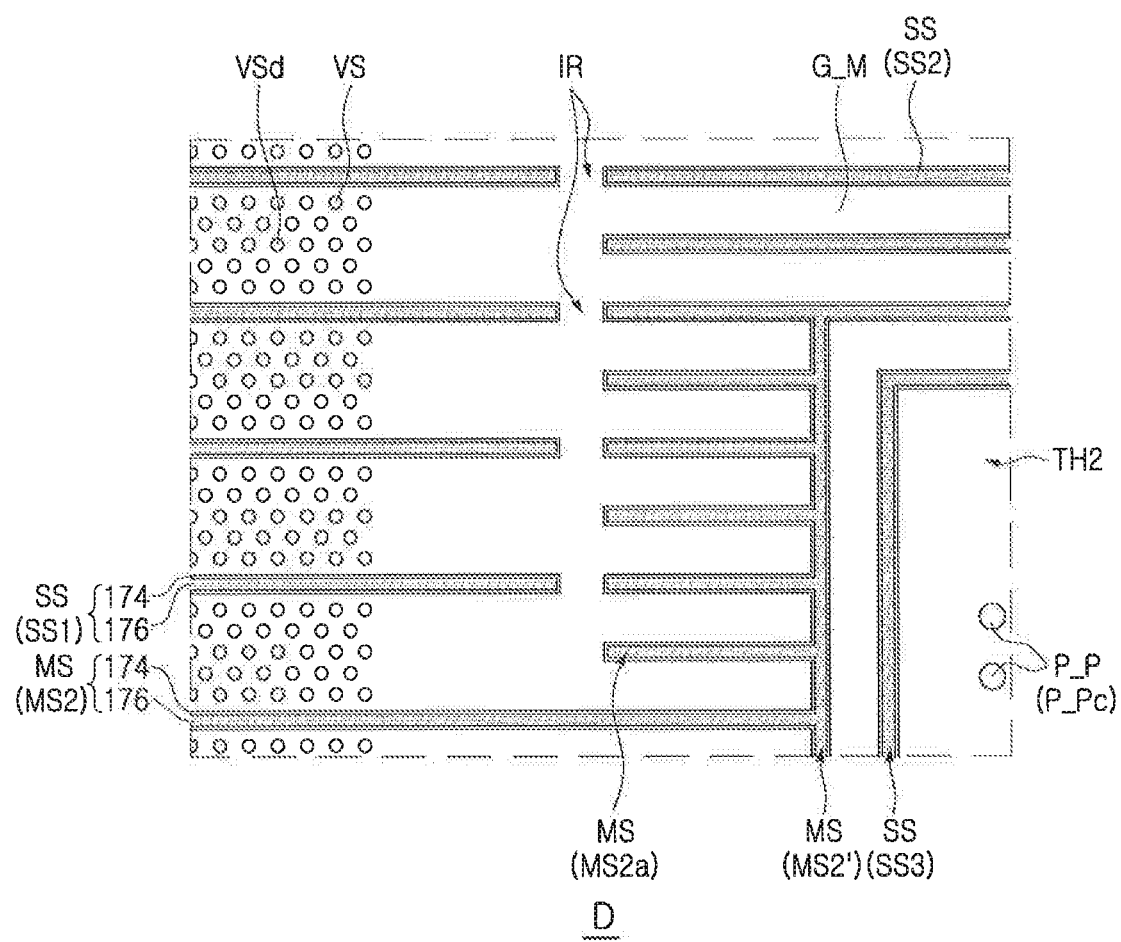
Figure 25A:
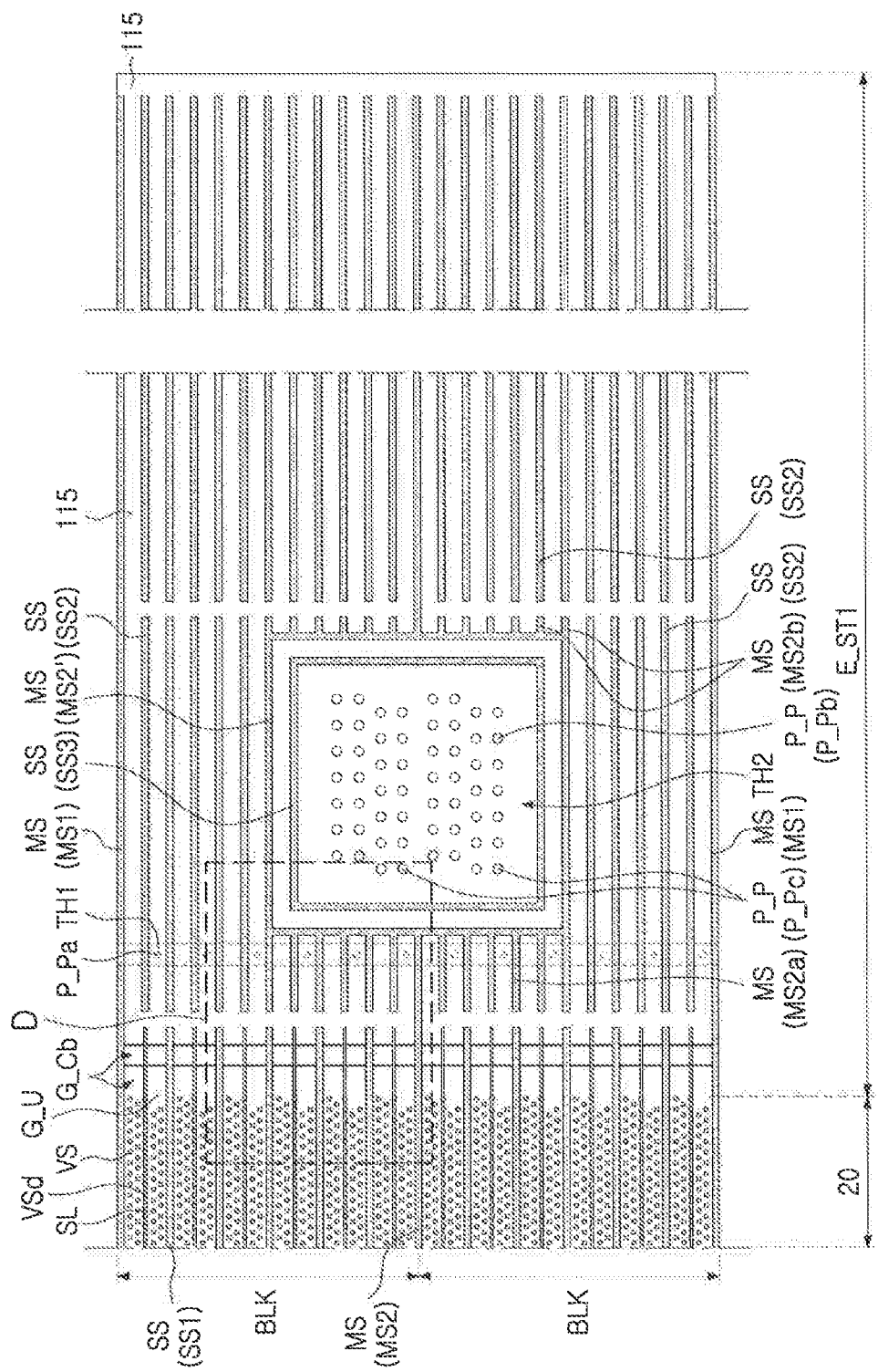
Figure 25B:
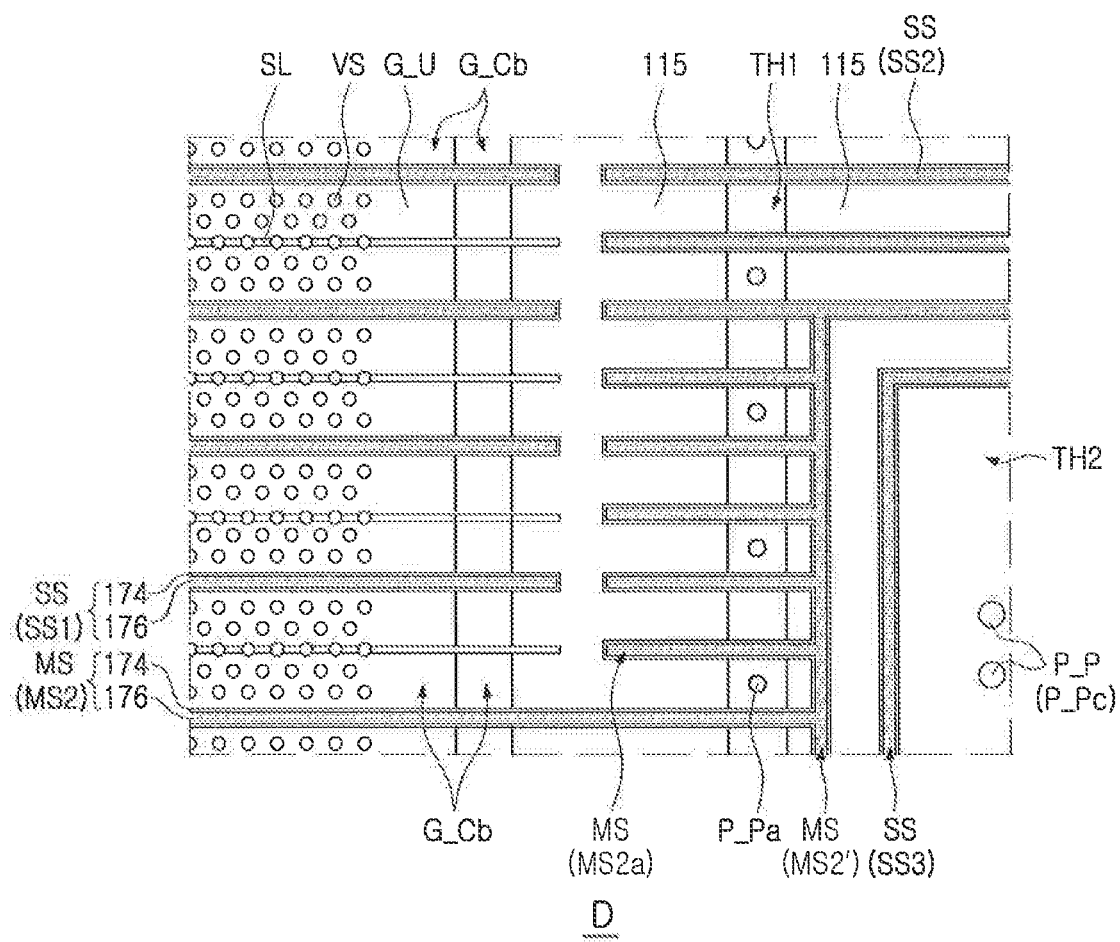

FIG. 21 is a three-dimensional perspective view illustrating a plurality of gate electrodes of the gate-stack structure GS disposed on the upper substrate 115, according to an exemplary embodiment of the present inventive concept. FIG. 22, FIGS. 23A, 24A, and 25A are plan views illustrating a portion of components, provided so that the components illustrated in the plan view of FIG. 19A may be more easily understood, and FIGS. 23B, 24B, and 25B are partially enlarged views respectively illustrating part 'D' in FIGS. 23A, 24A, and 25A. In FIGS. 22 to 25B, FIG. 22 is a plan view illustrating the upper substrate 115, the first through region TH1, the second through region TH2, and the first, second, and third peripheral connection plugs P_Pa, P_Pb, and P_Pc, FIGS. 23A and 23B illustrate the lower gate electrode G_L., a lower gate cut region CT, the separation structures MS and SS, and the vertical channel structure VS, disposed on the upper substrate 115 in a plan view of FIG. 22, FIGS. 24A and 24B illustrate the separation structures MS and SS, the vertical channel structure VS, the second through region TH2, the second and third peripheral connection plugs P_Pb and P_Pc, and one of the intermediate gate electrodes G_M, and FIGS. 25A and 25B illustrate the upper substrate 115, the first through region TH1, the second through region TH2, the first, second, and third peripheral connection plugs P_Pa, P_Pb, and P_Pc, the insulating separation line SL, and the upper gate electrode G_U. Accordingly, FIGS. 22 to 25B are plan views provided to clearly illustrate the components described with reference to FIGS. 19A and 19B and FIGS. 20A and 20B.

Referring to FIGS. 21 to 25B together with FIGS. 19A and 19B and FIGS. 20A and 20B, the gate electrodes of the gate-stack structure GS may be disposed in the memory cell array region 20 disposed on the upper substrate 115 to extend into an extension area E_ST1 on the upper substrate 115. Contact areas G_Ca and G_Cb of the intermediate and upper gate electrodes G_M and G_U to of the gate-stack structure GS may be arranged in a staircase form in the extension area E_ST1. The extension area E_ST1 may correspond to the first extension area described with reference to FIG. 4.

The plurality of gate electrodes of the gate-stack structure GS may be stacked and spaced apart from each other in the third direction Z, perpendicular to the upper surface of the upper substrate 115, and may extend in the first direction X parallel to the upper surface of the upper substrate 115. A plurality of vertical channel structures VS may pass through the gate-stack structure GS of the memory cell array region 20. The vertical channel structure VS may be the same as that described with reference to FIG. 7 or 10. The first through region TH1 may pass through the upper substrate 115. The first peripheral connection plug P_Pa may be disposed on the first peripheral interconnection 108a. The first peripheral connection plug P_Pa may extend in the third direction Z and pass through the first through region TH1 to be electrically connected to the lower gate electrode G_L.

In exemplary embodiments of the present inventive concept, structures of the lower gate electrode G_L, the first through region TH1, and the first peripheral connection plug P_Pa may be the same as those of the lower gate electrode G_L, the first through region TH1, and the first peripheral connection plug P_Pa described with reference to FIG. 8 and FIGS. 9A to 9D.

In a modified example, the structures of the lower gate electrode G_L, the first through region TH1, and the first peripheral connection plug P_Pa may be the same as those of the lower gate electrode G_L, the first through region TH1, and the first peripheral connection plug P_Pa described with reference to FIG. 11 and FIGS. 12A and 12B.

Accordingly, since the structures of the lower gate electrode G_L, the first through region TH1, and the first peripheral connection plug P_Pa are similar to those described with reference to FIG. 8 and FIGS. 9A to 9D or with reference to FIG. 11 and FIGS. 12A and 12B, detailed descriptions thereof may be omitted.

The second through region TH2 may pass through the upper substrate 115 and the gate-stack structure GS. A peripheral connection plug P_P passing through the second through region TH2 and extending to the peripheral interconnections 108 may be provided. The peripheral connection plug P_P may include the second peripheral connection plug P_Pb electrically connected to the second peripheral interconnection 108b and the third peripheral connection plug P_Pc electrically connected to the third peripheral interconnection 108c.

The dummy vertical structure VSd may pass through the insulating separation line SL and the gate-stack structure GS disposed below the insulating separation line SL. The dummy vertical structure VSd may have the same structure as the vertical channel structure VS, and may be electrically isolated from the bit line BL.

The bit-line contact plug BLC may be interposed between the bit line BL and the vertical channel structure VS to electrically connect the bit line BL to the vertical channel structure VS.

The plurality of separation structures MS and SS may pass through the gate-stack structure GS. The separation structures MS and SS may include a main separation structure MS and an auxiliary separation structure SS. The main separation structure MS may separate the gate-stack structure GS in the second direction Y. The second direction Y may be parallel to the upper substrate 115 and, perpendicular to the first direction X.

The main separation structure MS may cross the gate-stack structure GS in the first direction X and separate the gate-stack structure GS in the second direction Y. The main separation structure MS may include a first main separation structure MS1 and a second main separation structure MS2. The first main separation structure MS1 may cross the memory cell array region 20 and the extension area E_ST1. In the main separation structure MS, one first main separation structure MS1 and one second main separation structure MS2, adjacent to each other, may define a single memory block BLK. For example, the one first main separation structure MS1 and the one second main separation structure MS2 may be disposed around or form the border of the single memory block BLK.

The second main separation structure MS2 may be disposed between a pair of the first main separation structures MS1 parallel to each other. The second main separation structure MS2 may include a portion MS2' surrounding the second through region TH2.

In a plan view, the second main separation structure MS2 may include first extending portions MS2a extending toward the memory cell array region 20 from the portion MS2' surrounding the second through region TH2, and second extending portions MS2b extending in a direction away from the memory cell array region 20 from the portion MS2' surrounding the second through region TH2. In other words, the first extending portions MS2a may extend in a direction opposite from a direction in which the second extending portions MS2b extend.

At least a portion of the auxiliary separation structure SS may have ending portions facing each other in the first direction X between a pair of the first and second main separation structures MS1 and MS2 adjacent to each other.

The auxiliary separation structure SS may include a first auxiliary separation structure SS1 crossing the memory cell array region 20 and extending into a portion of the extension area E_ST1. The first auxiliary separation structure 551 may cross the upper gate electrode G_U to be spaced apart from the intermediate gate contact areas G_Ca of the intermediate gate electrodes G_M, in a plan view.

The auxiliary separation structure SS may include a second auxiliary separation structure SS2 and a third auxiliary separation structure SS3 disposed in the extension area E_ST1. The third auxiliary separation structure SS3 may be surrounded by the portion MST' of the second main separation structure MS2 surrounding the second through region TH2, and may surround the second through region TH2.

An insulating separation line SL may be disposed to cross and pass through the upper date electrode G_U penetrated by the separation structures and SS, in the first direction X.

The main separation structure MS may fill a main separation trench denoted by a reference numeral MS_T in FIG. 21, the auxiliary separation structure SS may fill an auxiliary separation trench denoted by a reference numeral SS_T in FIG. 21, and the insulating separation line SL may fill an insulating separation trench denoted by a reference numeral SL_T in FIG. 21.

The upper gate electrode G_U may include an upper gate contact area G_Cb. When a plurality of the upper gate electrodes G_U are arranged in the third direction Z, the upper gate contact area G_Cb may be arranged in a staircase form sequentially stepping down in the first direction X away from the memory cell array region 20.

A plurality of the intermediate gate electrodes G_M may be provided. At least a portion of the plurality of intermediate gate electrodes G_M may function as word lines WL. The intermediate gate electrodes G_M may include a plurality of intermediate gate contact areas G_Ca arranged in staircase form. The intermediate gate contact areas G_Ca may be arranged to step down with a first gradient in the first direction X, and a second gradient less than the first gradient in the second direction Y.

Intermediate gate contact plugs MCa may be arranged on the intermediate gate contact areas G_Ca of the intermediate gate electrodes G_M, and an upper gate contact plug MCb may be arranged on the upper gate contact area G_Cb of the upper gate electrode G_U.

The gate interconnections G_I may include an intermediate gate interconnection G_Ia electrically connecting the second peripheral connection plug P_Pb to the intermediate gate contact plugs MCa, and an upper gate interconnection G_Ib electrically connecting the third peripheral connection plug P_Pc to the upper gate contact plug MCb.

The plurality of intermediate gate electrodes G_M may include a gate connecting area (reference numeral IR in FIG. 24B) disposed between end portions of the separation structures MS and SS facing each other in the first direction X. For example, the plurality of intermediate gate electrodes G_M may include a gate connecting area (reference numeral IR in FIG. 24B) disposed between end portions of the first auxiliary separation structure SS1 and the second auxiliary separation structure SS2 facing each other, and a gate connecting area (reference numeral IR in FIG. 24B) disposed between end portions of the first auxiliary separation structure SS1 and a first extending portion MS2a of the second main separation structure MS2. Between the pair of the first main separation structure MS1 and the second main separation structure MS2 adjacent to each other, the intermediate gate electrodes G_M disposed on the same plane may be an electrically connected to a single gate electrode.

Between the first main separation structure MS1 and the second main separation structure MS2, the lower gate electrode G_L disposed on the same plane may be separated by the gate cut region CT. The gate cut region CT may overlap the gate connecting area (reference numeral IR in FIG. 24B). Accordingly, the gate cut region CT may be disposed between the end portions of the first auxiliary separation structure SS1 and the second auxiliary separation structure SS2 facing each other, and between the end portions of the first auxiliary separation structure SS1 and the first extending portion MS2a of the second main separation structure MS2.

In exemplary embodiments of the present inventive concept, between the pair of the first and second main separation structures MS1 and MS2 adjacent to each, the gate-stack structure GS may include a plurality of lower gate electrodes G_L disposed on the same plane and spaced apart from each other in the second direction Y, an intermediate gate electrode G_M disposed on the plurality of lower gate electrodes G_L to be electrically connected on the same plane, and a plurality of upper gate electrodes G_U disposed on the intermediate gate electrode G_M and spaced apart from each other in the second direction Y. The number of the upper gate electrodes G_U spaced apart from each other in the second direction Y may be greater than the number of the lower gate electrodes G_L spaced apart from each other in the second direction Y.

Next, a method of forming a semiconductor device according to an exemplary embodiment of the present inventive concept will be described.

Figure 26A:
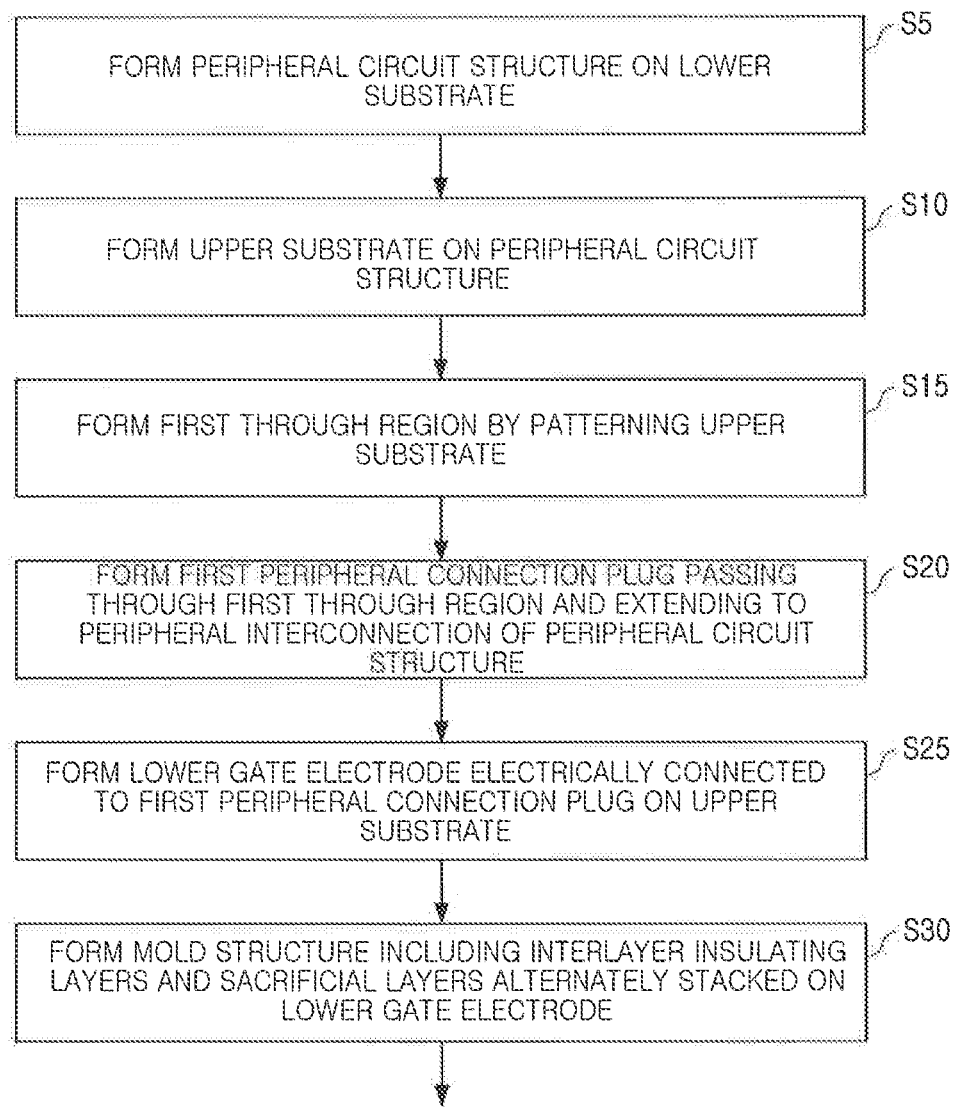
FIGS. 26A and 26B are process flowcharts illustrating a method of forming a three-dimensional semiconductor device according to an exemplary embodiment of the present inventive concept.
Figure 26B:
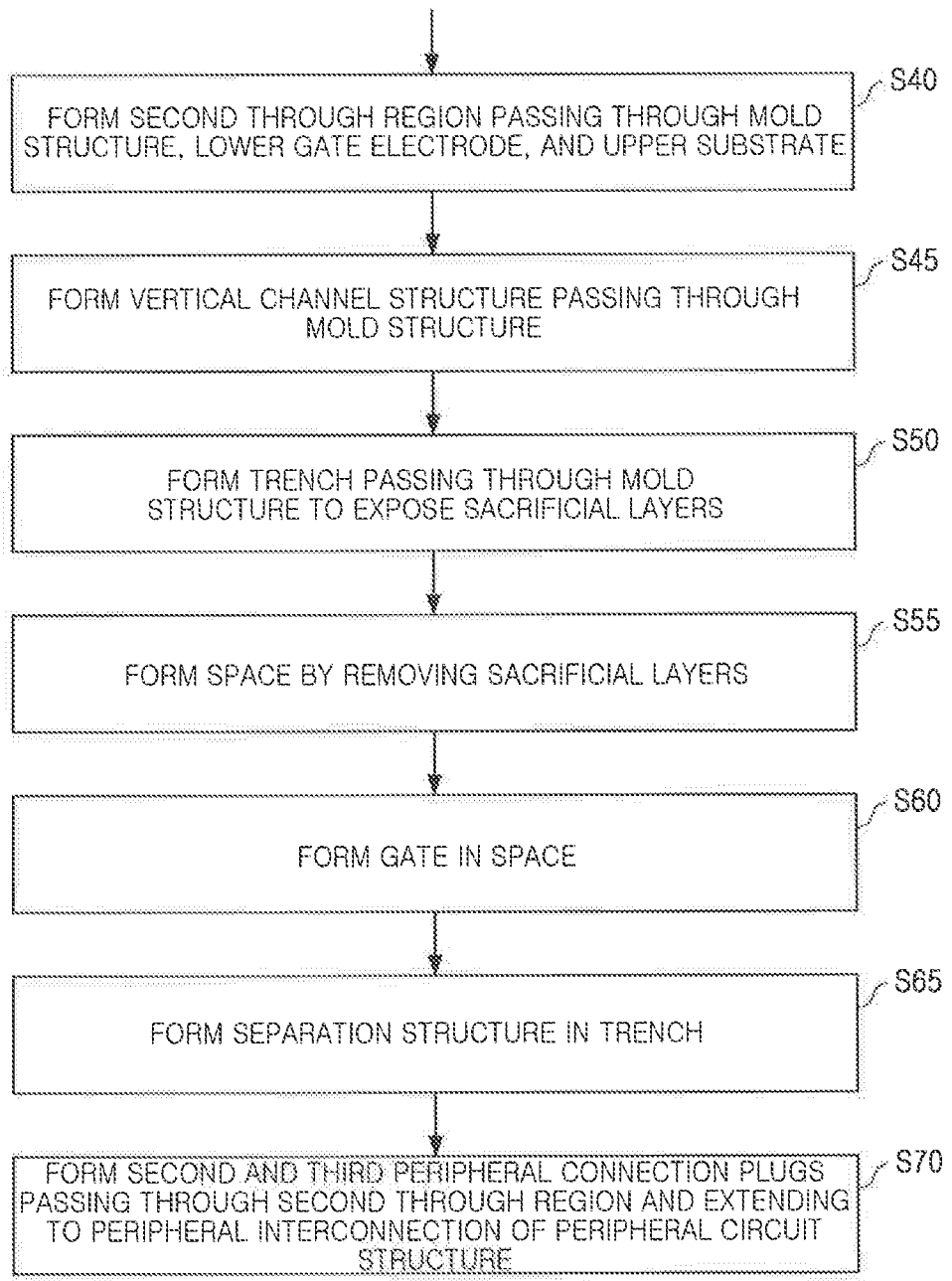
Figure 31A:
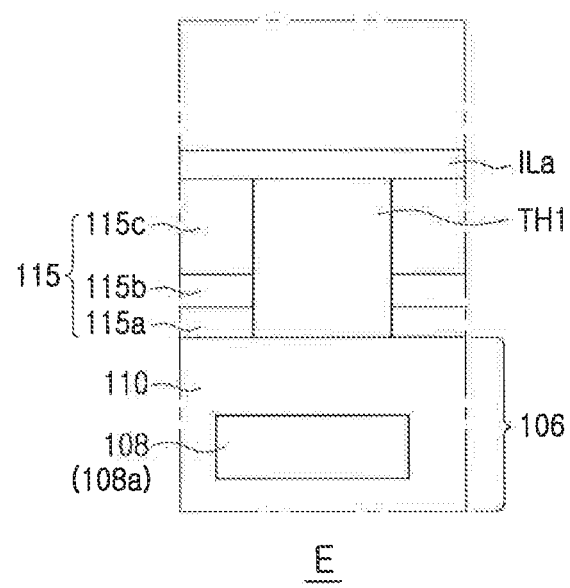
FIGS. 31A, 31B and 31C are cross-sectional views illustrating a method of forming a three-dimensional semiconductor device according to a modified exemplary embodiment of the present inventive concept.
Figure 31B:
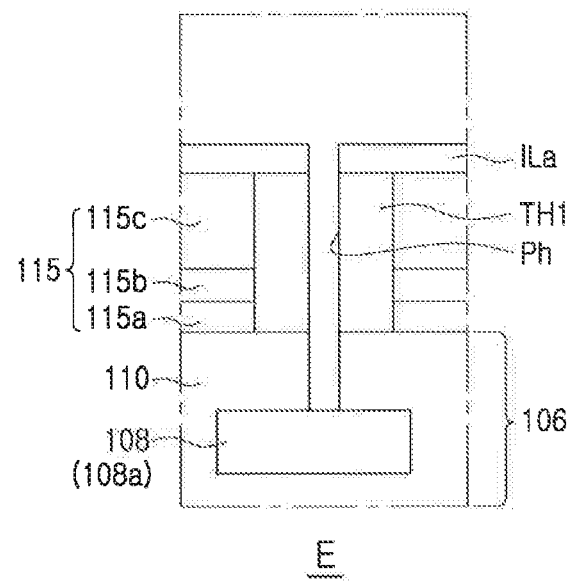
Figure 31C:
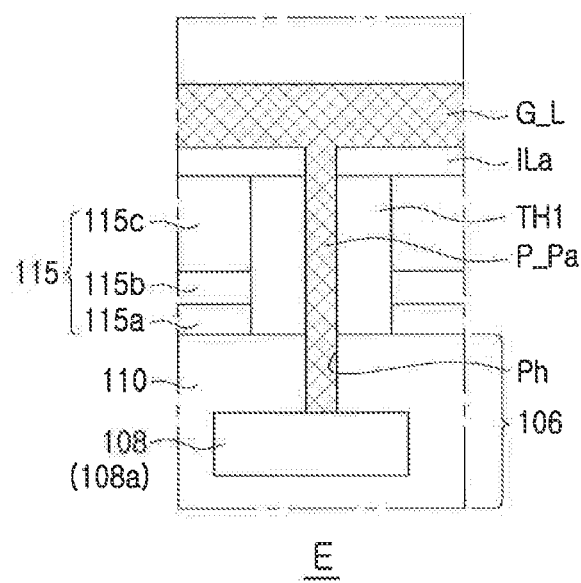
Figure 32A:
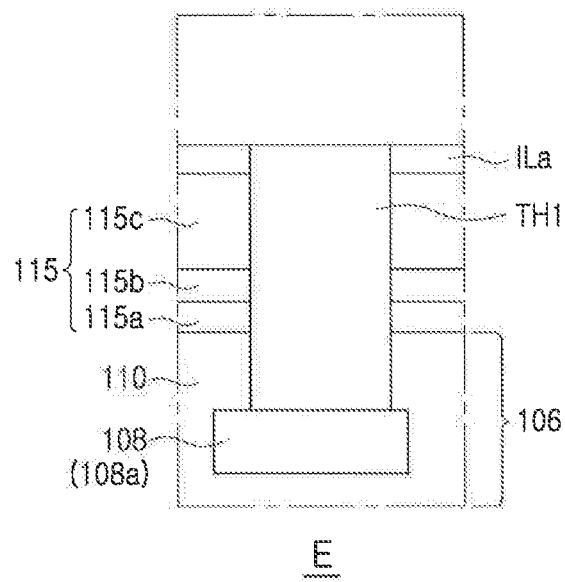
FIGS. 32A and 32B are cross-sectional views illustrating a method of forming a three-dimensional semiconductor device according to a modified exemplary embodiment of the present inventive concept.
Figure 32B:
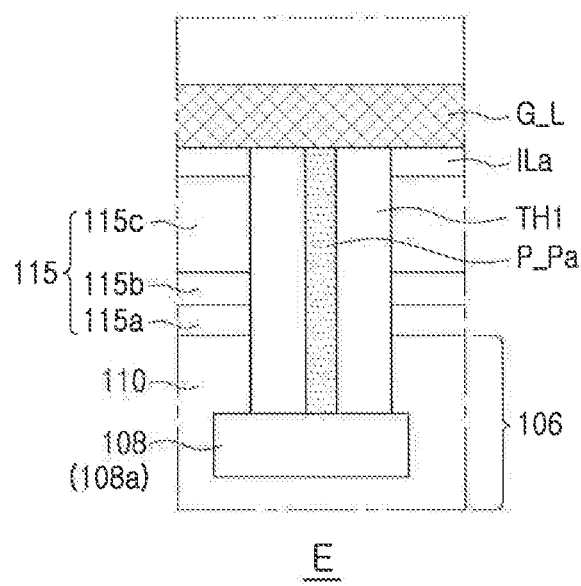
Figure 33A:
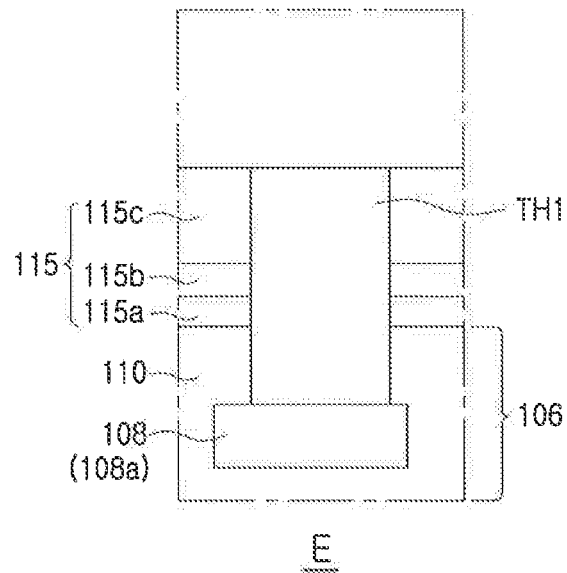
FIGS. 33A and 33B are cross-sectional views illustrating a method of forming a three-dimensional semiconductor device according to a modified exemplary embodiment of the present inventive concept.
Figure 33B:
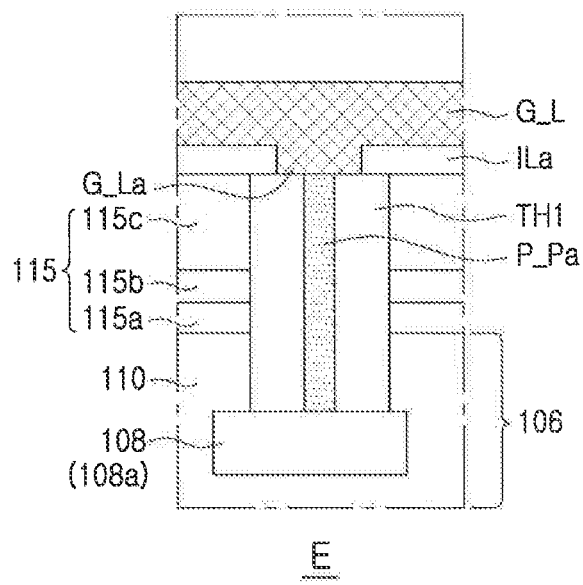

FIGS. 26A and 26B are process flowcharts illustrating a method of forming a semiconductor device according to an exemplary embodiment of the present inventive concept, and FIGS. 27 and 28, and FIGS. 34 to 37 are cross-sectional views illustrating a method of forming a semiconductor device according to an exemplary embodiment of the present inventive concept. FIGS. 27 and 28, and FIGS. 34 to 37 are cross-sectional views taken along lines I-I' and II-II' in FIG. 4. FIGS. 29A to 33B are partially enlarged views illustrating part 'E' of FIG. 28. In FIGS. 29A to 33B, FIGS. 29A to 29D are partially enlarged views illustrating a method of forming a semiconductor device according to an exemplary embodiment of the present inventive concept, FIGS. 30A to 30D are partially enlarged views illustrating a method of forming a semiconductor device according to a modified exemplary embodiment of the present inventive concept, FIGS. 31A to 31C are partially enlarged views illustrating a method of forming a semiconductor device according to another modified exemplary embodiment of the present inventive concept, FIGS. 32A and 32B are partially enlarged views illustrating a method of forming a semiconductor device according to another modified exemplary embodiment of the present inventive concept, and FIGS. 33A and 33B are partially enlarged views illustrating a method of forming a semiconductor device according to another modified exemplary embodiment of the present inventive concept.

Figure 27:
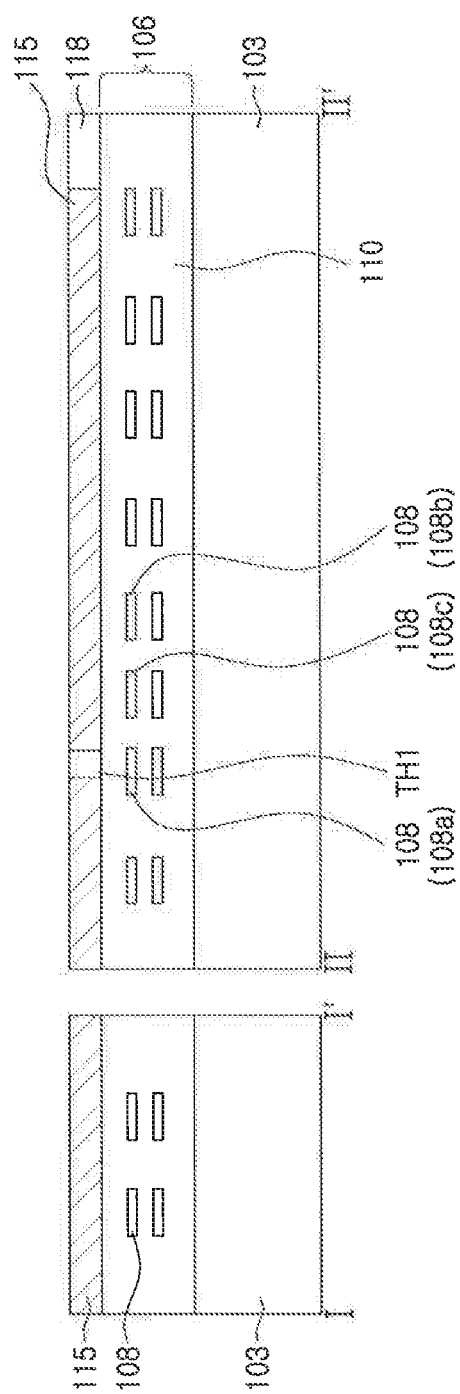
FIGS. 27 and 28, and FIGS. 34, 35, 36 and 37 are cross-sectional views illustrating a method of forming a three-dimensional semiconductor device according to an exemplary embodiment of the present inventive concept.

Referring to FIGS. 26A and 26B and FIG. 27, a peripheral circuit structure 106 may be formed on a lower substrate 103 in the process step S5. The lower substrate 103 may be a single crystalline semiconductor substrate formed of a semiconductor material such as silicon. The peripheral circuit structure 106 may include peripheral interconnections 108 and a lower insulating layer 110 covering the peripheral interconnections 108. The peripheral interconnections 108 may include a first peripheral interconnection 108a, a second peripheral interconnection 108b, and a third peripheral interconnection 108c.

An upper substrate 115 may be formed on the peripheral circuit structure 106 in the process step S10. The upper substrate 115 may be formed of polysilicon.

A first through region TH1 may be formed by patterning the upper substrate 115 in the process step S15. The formation of the first through region TH1 may include performing a photolithography and etching process to form an opening passing through the upper substrate 115 and performing a deposition and planarization process to form an insulating material filling the opening passing through the upper substrate 115. Accordingly, the first through region TH1 may be formed of an insulating material such as silicon oxide.

In exemplary embodiments of the present inventive concept, an intermediate insulating layer 118 surrounding an outer side surface of the upper substrate 115 may also be formed while the first through region TH1 is formed.

Figure 28:
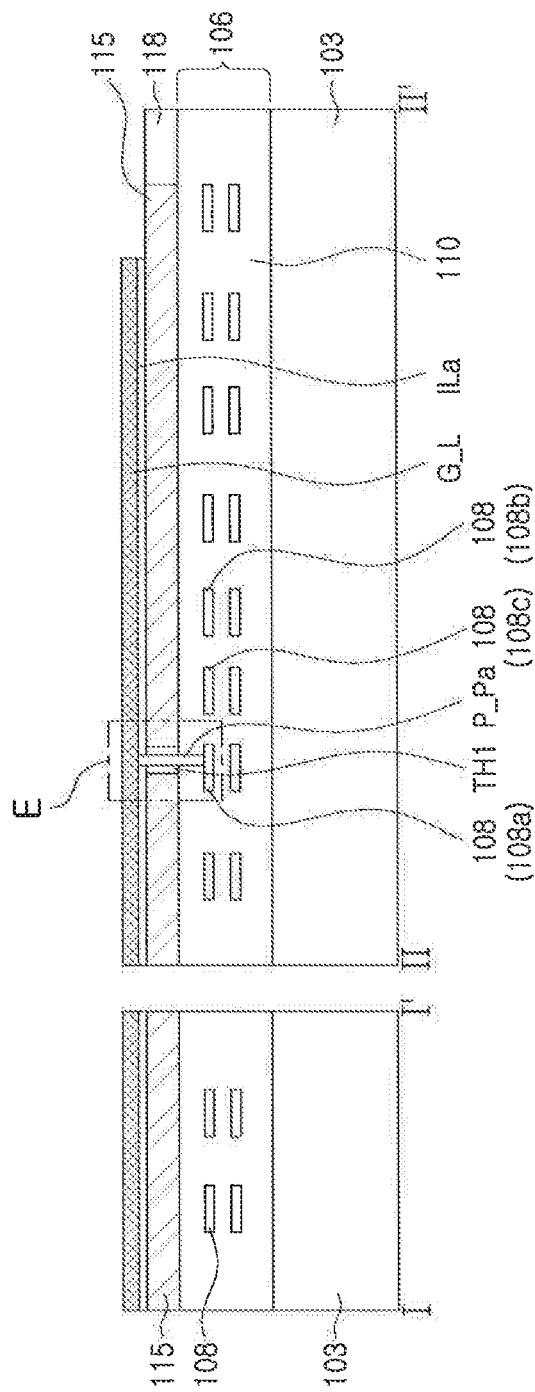

Referring to FIGS. 26A and 26B, and FIG. 28, a first peripheral connection plug P_Pa passing through the first through region TH1 and extending onto the peripheral interconnections 108 of the peripheral circuit structure 106 may be formed in the process step S20. The first peripheral connection plug P_Pa may be electrically connected to a first peripheral interconnection 108a of the peripheral interconnections 109.

A lower gate electrode G_L electrically connected to the first peripheral connection plug P_Pa may be formed on the upper substrate 115 in the process step S25. Before the lower gate electrode G_L is formed, the lowest interlayer insulating layer ILa may be formed on the upper substrate 115.

An example a method of forming the upper substrate 115, the first through region TH1, the first peripheral connection plug P_Pa, the lowest interlayer insulating layer ILa, and the lower gate electrode G_L will be described with reference to FIGS. 29A to 29D.

Figure 29A:
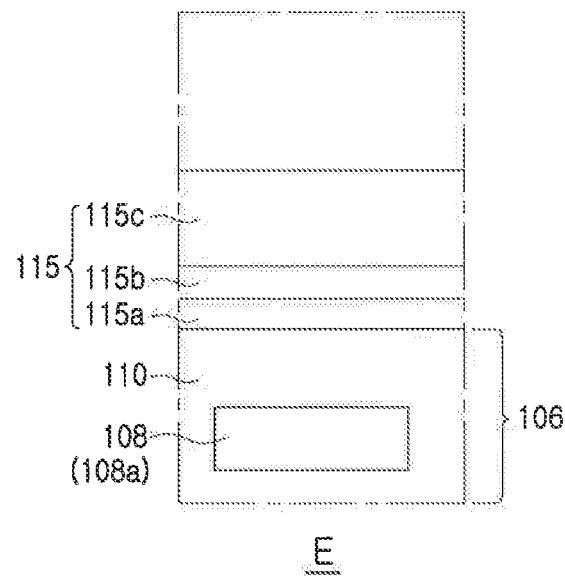
FIGS. 29A, 29B, 29C and 29D are cross-sectional views illustrating a method of forming a three-dimensional semiconductor device according to an exemplary embodiment of the present inventive concept.

Referring to FIG. 29A, the upper substrate 115 may include a first area 115a, a second area 115b disposed on the first area 115a, and a third area 115c disposed on the second area 115b. The second area 115b may include a greater amount of carbon than the third area 115c, and the first area 115a may have a higher p-type impurity concentration than the third area 115c.

Figure 29B:
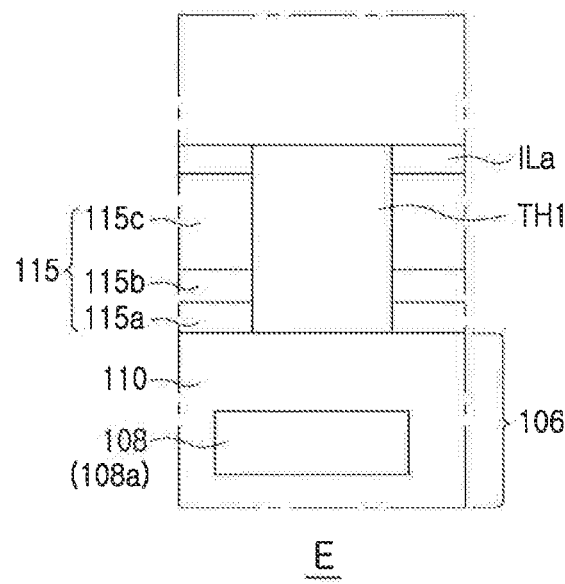

Referring to FIG. 29B, the lowest interlayer insulating layer ILa may be formed on the upper substrate 115. The first through region TH1 passing through the lowest interlayer insulating layer ILa and the upper substrate 115 may also be formed.

Figure 29C:
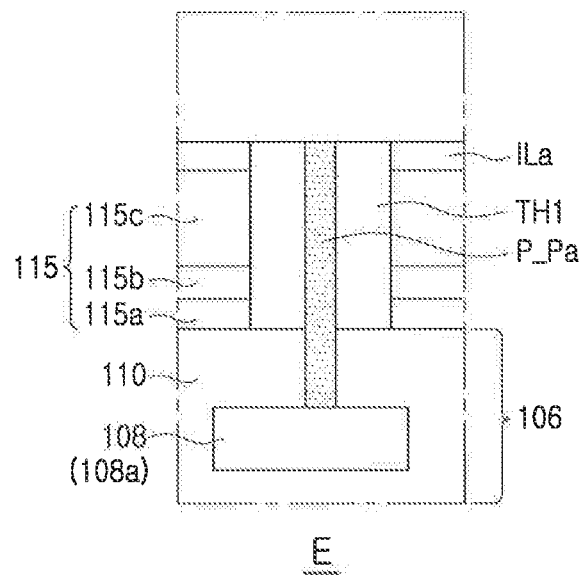

Referring to FIG. 29C, the first peripheral connection plug P_Pa passing through the first through region TH1 and electrically connected to the first peripheral interconnection 108a via a portion of the lower insulating layer 110 may be formed. Accordingly, the first peripheral connection plug P_Pa may have an upper surface higher than an upper surface of the upper substrate 115. For example, the upper surface of the first peripheral connection plug P_Pa may coincide with an upper surface of the lowest insulating layer ILa.

Figure 29D:
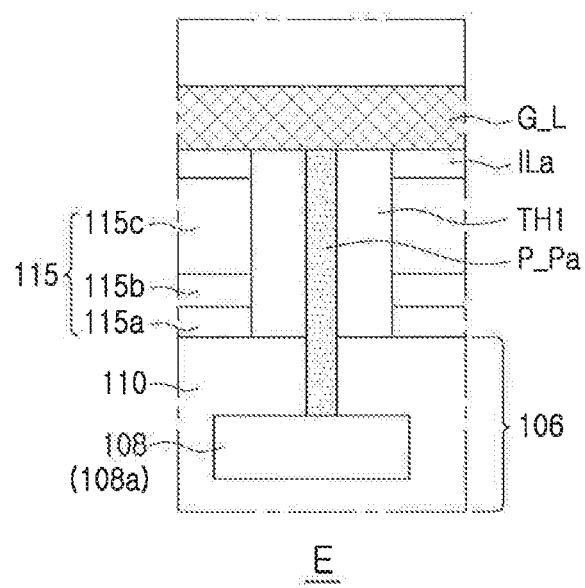

Referring to FIG. 29D, the lower gate electrode G_L may be formed on the lowest interlayer insulating layer ILa and the first peripheral connection plug P_Pa.

Next, a modified example of a method of forming the upper substrate 115, the first through region TH1, the first peripheral connection plug P_Pa, the lowest interlayer insulating layer ILa, and the lower gate electrode G_L will be described with reference to FIGS. 30A to 30D.

Figure 30A:
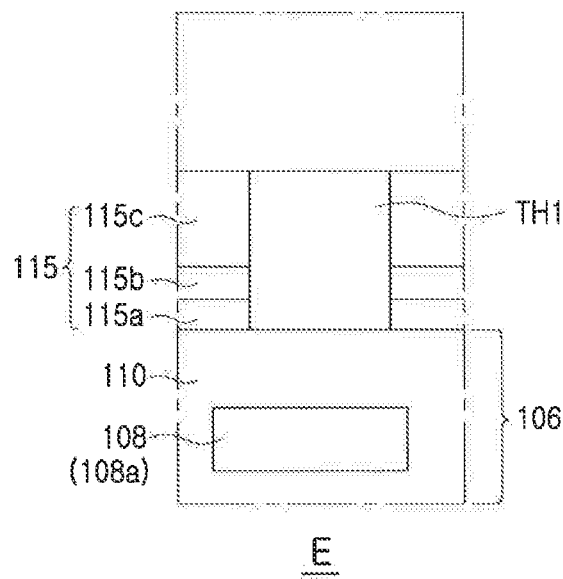
FIGS. 30A, 30B, 30C and 30D are cross-sectional views illustrating a method of forming a three-dimensional semiconductor device according to a modified exemplary embodiment of the present inventive concept.

Referring to FIG. 30A, the upper substrate 115 as illustrated in FIG. 29A may be provided. The first through region TH1 passing through the upper substrate 115 may be formed.

Figure 30B:
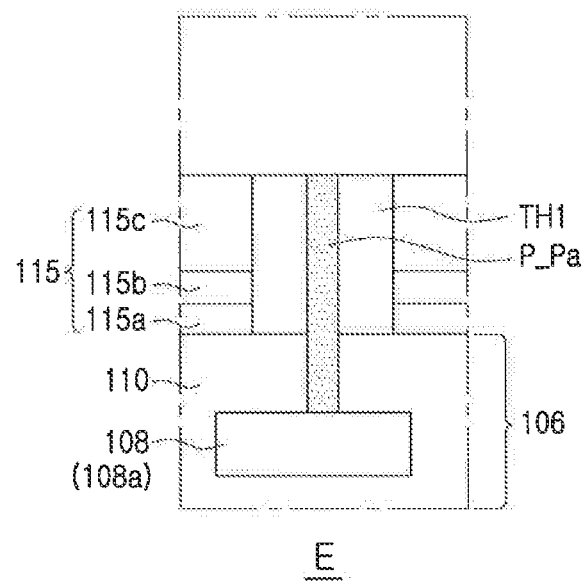

Referring to FIG. 30B, the first peripheral connection plug P_Pa passing through the first through region TH1 and electrically connected to the first peripheral interconnection 108a via a portion of the lower insulating layer 110 may be formed. Accordingly, the first peripheral connection plug P_Pa may have an upper surface coplanar with an upper surface of the upper substrate 115.

Figure 30C:
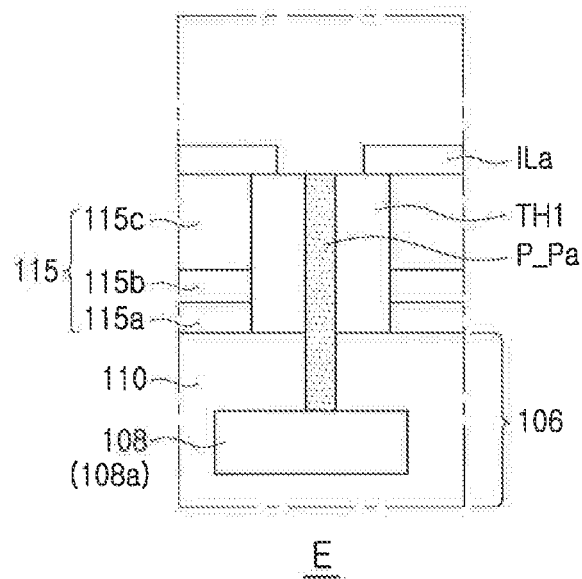

Referring to FIG. 30C, the lowest interlayer insulating layer ILa may be formed on the upper substrate 115, and the lowest interlayer insulating layer ILa may be patterned to expose the first peripheral connection plug P_Pa. For example, the first peripheral connection plug P_Pa may be exposed by an opening in the lowest interlayer insulating layer ILa.

Figure 30D:
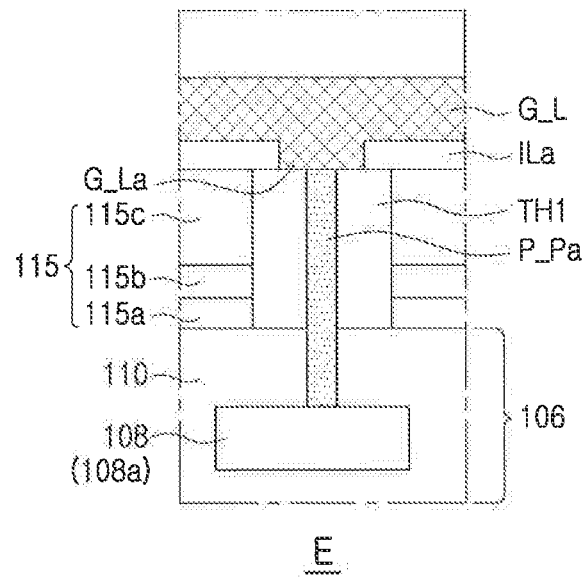

Referring to FIG. 30D, the lower gate electrode G_L may be formed on the lowest interlayer insulating layer ILa and the first peripheral connection plug P_Pa. Accordingly, the lower gate electrode G_L may include a lower protrusion G_La extending downward and passing through the lowest interlayer insulating layer ILa to be electrically connected to the first peripheral connection plug P_Pa. For example, the lower protrusion G_La may contact the first peripheral connection plug P_Pa via the opening in the lowest interlayer insulating layer ILa.

Next, another modified example of a method of forming the upper substrate 115, the first through region TH1, the first peripheral connection plug P_Pa, the lowest interlayer insulating layer ILa, and the lower gate electrode G_L will be described with reference to FIGS. 31A to 31C.

Referring to FIG. 31A, the upper substrate 115 and the first through region TH1 as illustrated in FIG. 30A may be provided. The lowest interlayer insulating layer ILa may be formed on the upper substrate 115 and the first through region TH1.

Referring to FIG. 31B, a hole Ph passing through the lowest interlayer insulating layer ILa, the first through region TH1, and a portion of the lower insulating layer 110 and exposing the first peripheral interconnection 108a may be formed.

Referring to FIG. 31C, a conductive layer filling the hole Ph and covering the lowest interlayer insulating layer ILa may be formed, and then, the conductive layer may be patterned. Accordingly, the lower gate electrode G_L may be formed on the lowest interlayer insulating layer ILa, and the first peripheral connection plug P_Pa may be formed in the hole Ph. Accordingly, the lower gate electrode G_L and the first peripheral connection plug P_Pa may be integrally formed and may have the same conductive material such as polysilicon.

Next, another modified example of a method of forming the upper substrate 115, the first through region TH1, the first peripheral connection plug P_Pa, the lowest interlayer insulating layer and the lower gate electrode G_L will be described with reference to FIGS. 32A and 32B.

Referring to FIG. 32A, the upper substrate 115 as illustrated in FIG. 29A may be provided. The lowest interlayer insulating layer ILa may be formed on the upper substrate 115. The first through region TH1 sequentially passing through the lowest interlayer insulating layer ILa and the upper substrate 115 and extending into the lower insulating layer 110 to overlap the first peripheral interconnection 108a may be formed. The first through region TH1 may contact the first peripheral interconnection 108a.

Referring to FIG. 32B, the first peripheral connection plug passing through the first through region TH1 to be electrically connected to the first peripheral interconnection 108a may be formed. The lower gate electrode G_L may be formed on the lowest interlayer insulating layer ILa and the first peripheral connection plug P_Pa.

Next, another modified example of a method of forming the upper substrate 115, the first through region TH1, the first peripheral connection plug P_Pa, the lowest interlayer insulating layer ILa, and the lower gate electrode G_L will be described with reference to FIGS. 33A to 33B.

Referring to FIG. 33A, the upper substrate 115 as illustrated in FIG. 29A may be provided. The first through region TH1 passing through the upper substrate 115 and extending into the lower insulating layer 110 to overlap the first peripheral interconnection 108a may be formed.

Referring to FIG. 33B, the lowest interlayer insulating layer ILa may be formed on the upper substrate 115 and the first through region TH1. The lowest interlayer insulating layer ILa may be patterned to expose the first peripheral connection plug P_Pa, and the lower gate electrode G_L may be formed on the lowest interlayer insulating layer ILa and the first peripheral connection plug P_Pa. Accordingly, the lower gate electrode G_L may include the lower protrusion G_La extending downward to pass through the lowest interlayer insulating layer ILa and be electrically connected to the first peripheral connection plug P_Pa.

Figure 34:
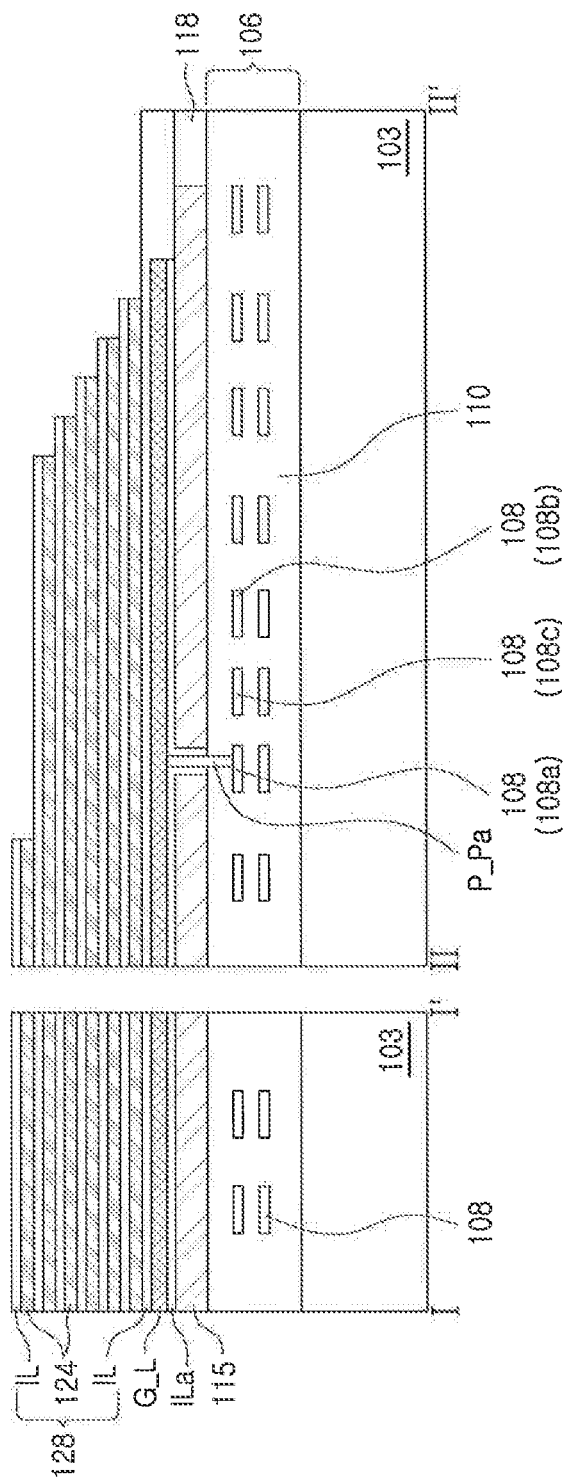

Next, referring to FIG. 34 together with FIGS. 26A and 26B, a mold structure 128 including interlayer insulating layers IL and sacrificial layers 124 alternately and repeatedly stacked on the upper substrate 115 having the lower gate electrode G_L may be formed in the process step S30. The interlayer insulating layer IL may be formed of silicon oxide, and the sacrificial layers 124 may be formed of silicon nitride. The uppermost and the lowermost layers in the mold structure 128 may be interlayer insulating layers IL. The mold structure 128 may be patterned to have a staircase form.

Figure 35:
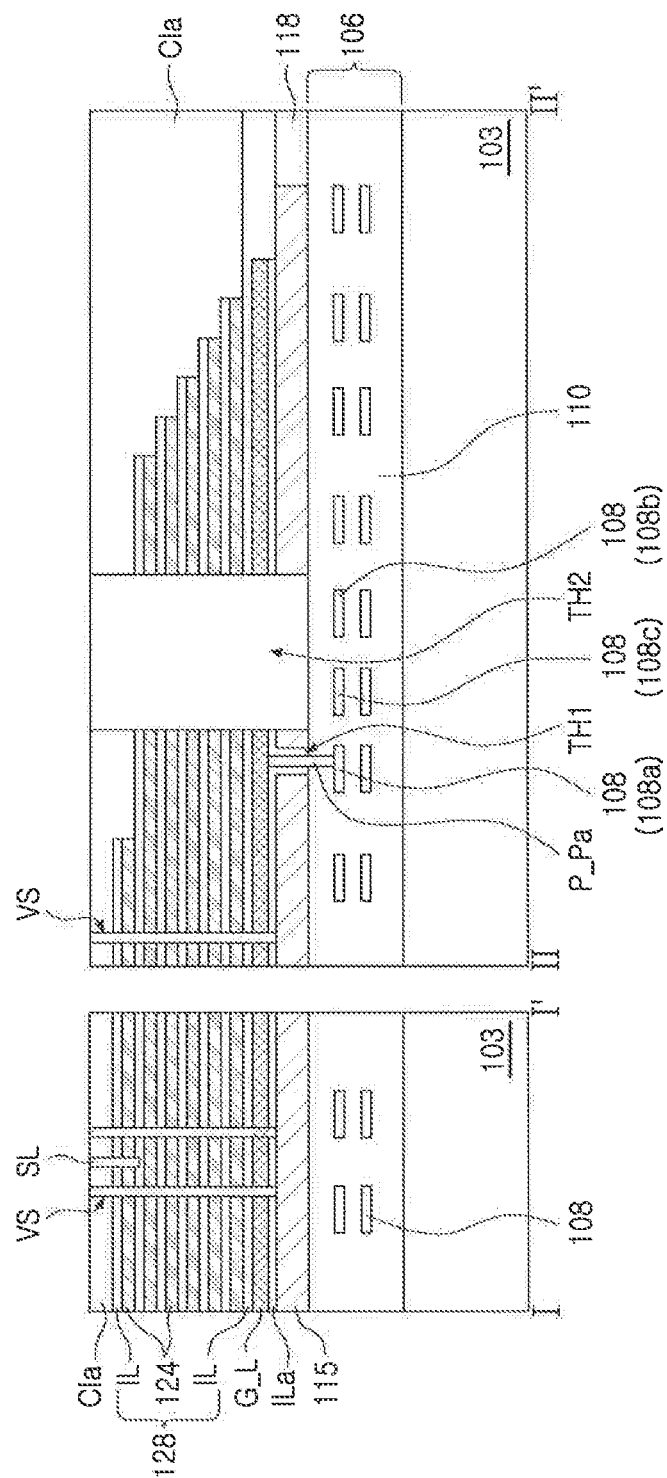

Referring to FIG. 35 together with FIGS. 26A and 26B, a first capping insulating layer CIa having a flat upper surface may be formed on the mold structure 128. For example, the formation of the first capping insulating layer CIa may include depositing an insulating material layer on the upper substrate 115 having the mold structure 128 and planarizing the insulating material layer using a planarization process such as chemical-mechanical planarization (CMP).

In exemplary embodiments of the present inventive concept, the method may further include etching and removing the interlayer insulating layer IL exposed on the mold structure 128, before forming the first capping insulating layer CIa.

A second through region TH2 passing through the first capping insulating layer CIa, the mold structure 128, and the upper substrate 115 may be formed in the process step S40. The formation of the second through region TH2 may include forming a hole or opening passing through the first capping insulating layer CIa, the mold structure 128, and the upper substrate 115 and depositing an insulating material, such as silicon oxide, to fill the hole or the opening.

An insulating separation line SL passing through an upper sacrificial layer among the sacrificial layers 124 of the mold structure 128 may be formed.

A vertical channel structure VS passing through the first capping insulating layer CIa, the mold structure 128, and the lower gate electrode G_L to be connected to the upper substrate 115 may be formed in the process step S45. The vertical channel structure VS may have the same structure as that described with reference to FIG. 7 or 10. For example, a channel hole passing through the first capping insulating layer CIa, the mold structure 128, and the lower gate electrode G_L to expose the upper substrate 115 may be formed, and then, the vertical channel structure VS having the same structure as that described with reference to FIG. 7 or 10 may be formed in the channel hole.

Figure 36:
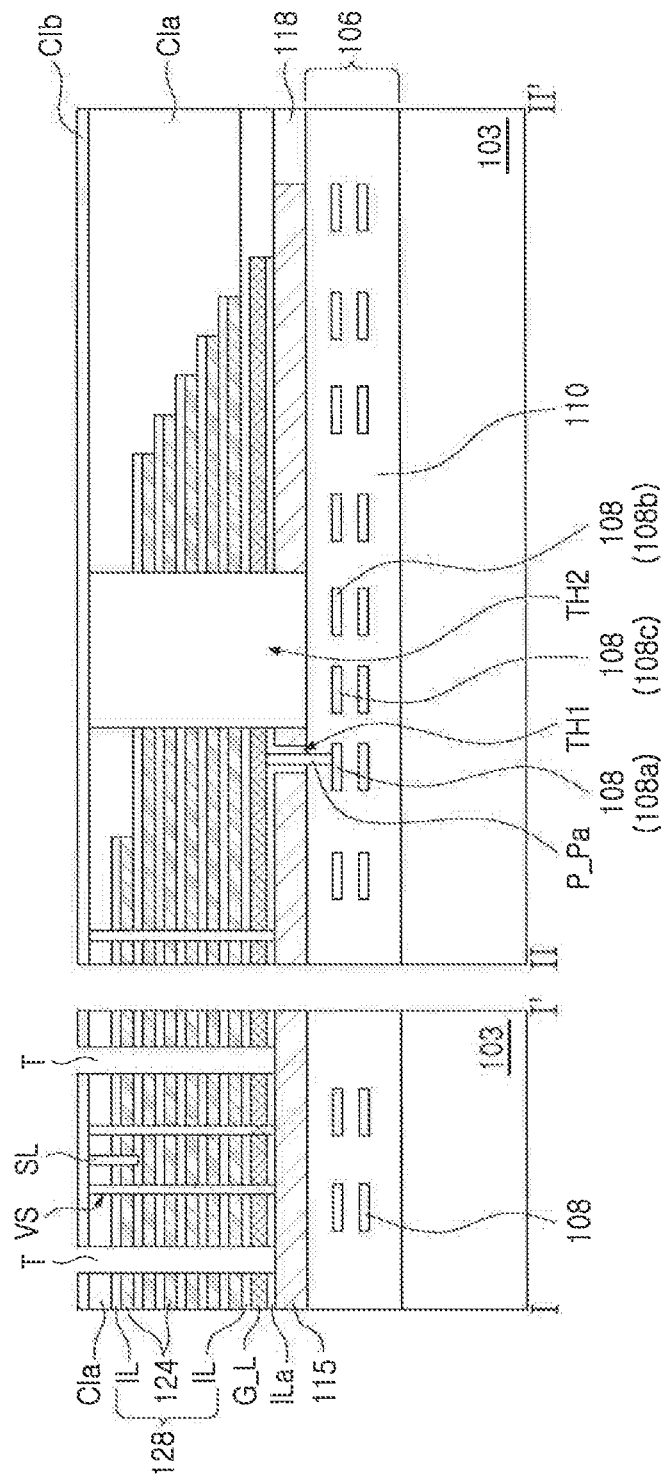

Referring to FIG. 36 together with FIGS. 26A and 26B, a second capping insulating layer CIb may be formed on the first capping insulating layer CIa. A trench T passing through the mold structure 128 to expose the sacrificial layers 124 may be formed in the process step S50. The trench T may sequentially pass through the second capping insulating layer CIb, the first capping insulating layer CIa, the mold structure 128, and the lower gate electrode G_L to expose the upper substrate 115. A plurality of trenches T may be formed.

Figure 37:
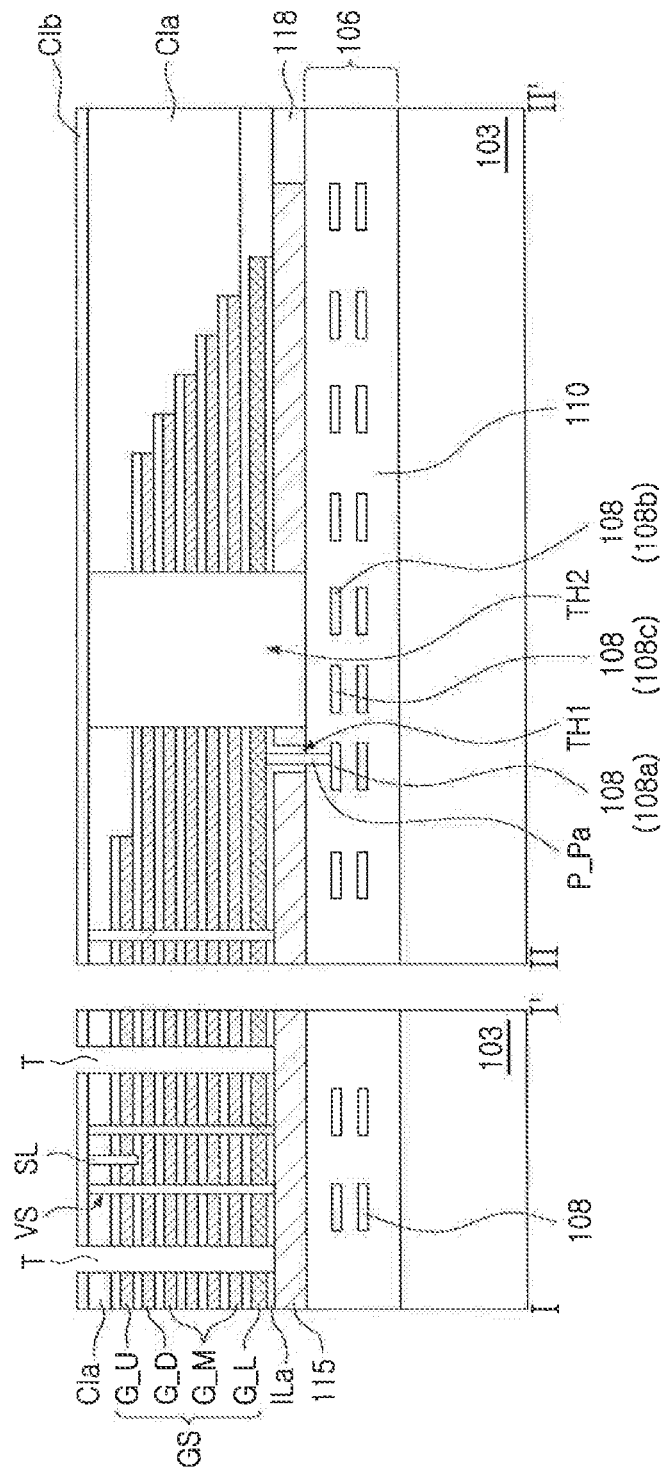

Referring to FIG. 37 together with FIGS. 26A and 26B, a space may be formed by removing the sacrificial layers 124 in the process step S55. A gate may be formed in the space in the process step S60. The gate formed in the space may include a plurality of intermediate gate electrodes G_M, a dummy gate electrode G_D disposed on the intermediate gate electrodes G_M, and an upper gate electrode G_U disposed on the dummy gate electrode G_D. The intermediate gate electrodes G_M may be formed on the lower gate electrode G_L. The lower gate electrode G_L, the intermediate gate electrodes G_M, the dummy gate electrode G_D, and the upper gate electrode G_U may configure a gate structure GS.

Referring to FIGS. 26A and 26B together with FIG. 6, a separation structure MS may be formed in the trench (T in FIG. 37) in the process step S65. Second and third peripheral connection plugs P_Pb and P_Pc passing through the second through region TH2 and extending to the peripheral interconnections 108 of the peripheral circuit structure 106 may be formed in the process step S70.

Figure 38A:
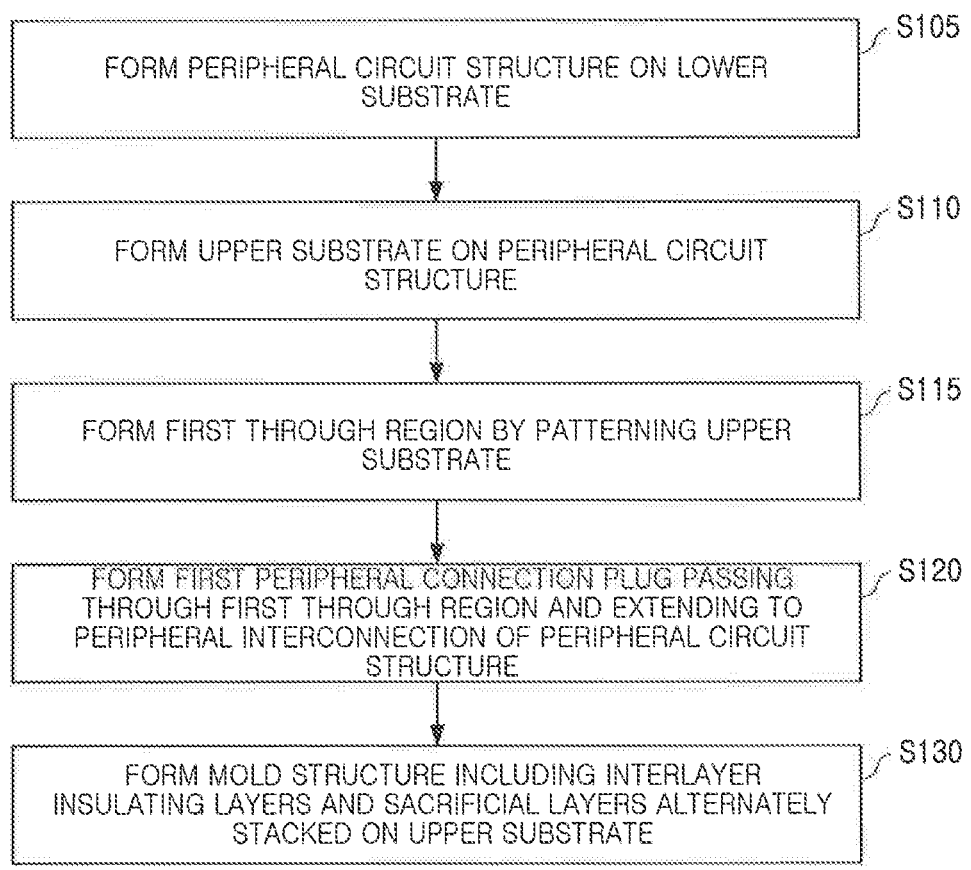
FIGS. 38A and 38B are process flowcharts illustrating a method of forming a three-dimensional semiconductor device according to a modified exemplary embodiment of the present inventive concept.
Figure 38B:
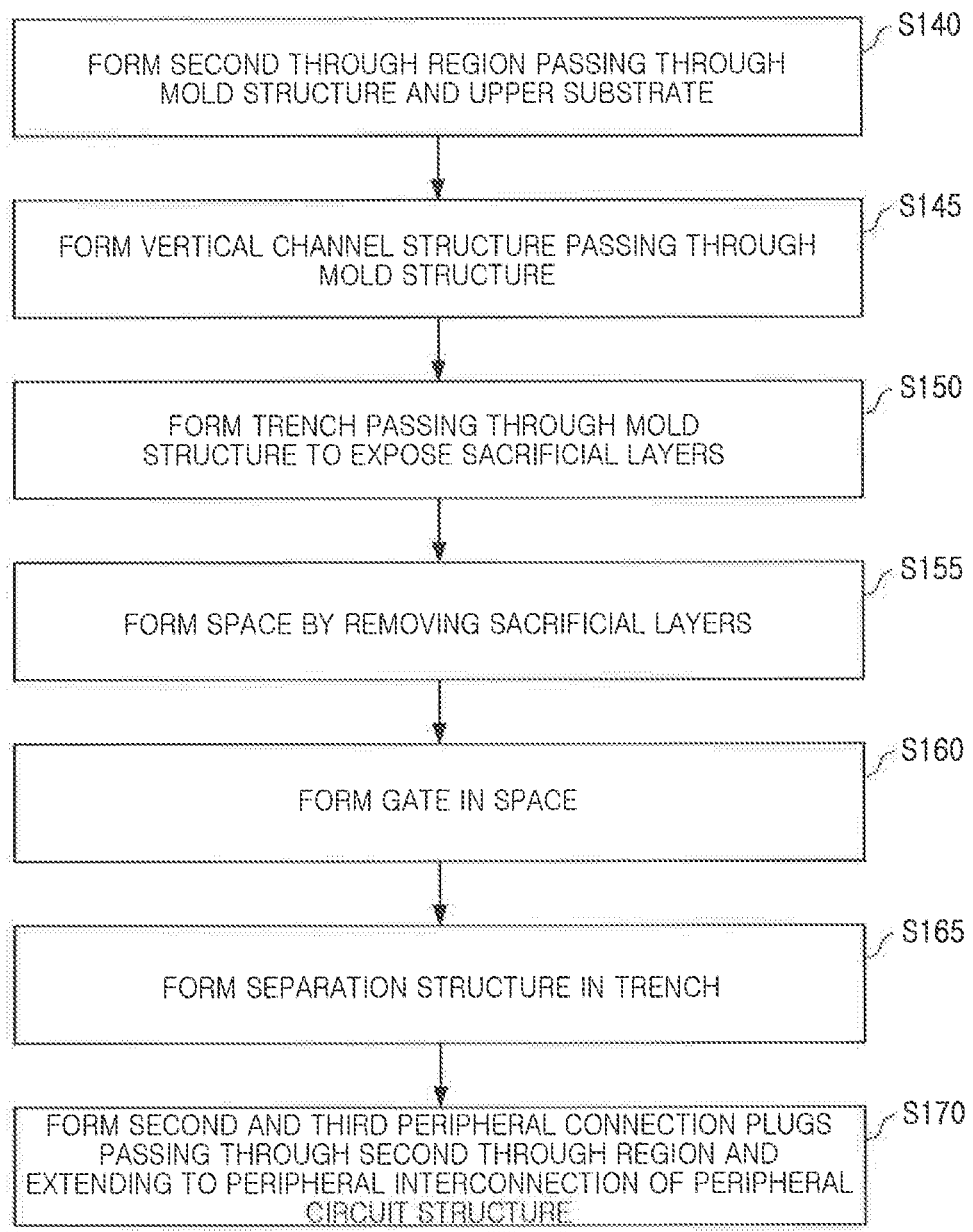

Methods of forming a semiconductor device according to exemplary embodiments of the present inventive concept are not limited to those described with reference to FIGS. 26A to 37. A method of forming a semiconductor device according to a modified exemplary embodiment of the present inventive concept will be described with reference to FIGS. 38A and 38B and FIG. 39. FIGS. 38A and 38B are process flowcharts illustrating a method of forming a semiconductor device according to a modified exemplary embodiment of the present inventive concept, and FIG. 39 is a cross-sectional view illustrating a method of forming a semiconductor device according to a modified exemplary embodiment of the present inventive concept.

Figure 39:
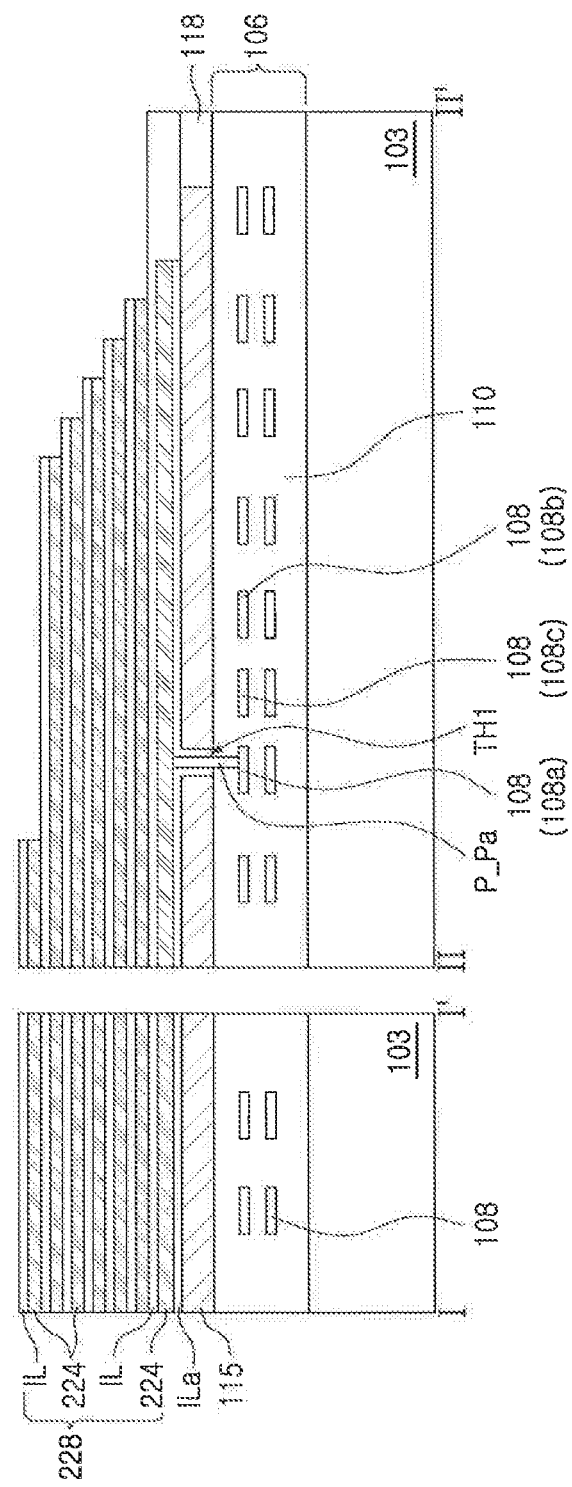
FIG. 39 is a cross-sectional view illustrating a method of forming a three-dimensional semiconductor device according to a modified exemplary embodiment of the present inventive concept.

Referring to FIGS. 38A and 38B and FIG. 39, a peripheral circuit structure 106 including peripheral interconnections 108 may be formed on a lower substrate 103 in the process step S105. An upper substrate 115 may be formed on the peripheral circuit structure 106 in the process step S110. Process steps S105 and S110 may be the same as the process steps S5 and S10 in FIGS. 26A and 26B. A first through region TH1 may be formed by patterning the upper substrate 115 in the process step S115. A first peripheral connection plug P_Pa passing through the first through region TH1 and extending onto the peripheral interconnections 108 of the peripheral circuit structure 106 may be formed in the process step S120.

A mold structure 228 including interlayer insulating layers IL and sacrificial layers 224 alternately and repeatedly stacked on the upper substrate 115 may be formed in the process step S130. The lowermost sacrificial layer among the plurality of sacrificial layers 224 formed in the mold structure 228 may be in contact with the first peripheral connection plug P_Pa.

Referring again to FIG. 6 together with FIGS. 38A and 38B, a second through region TH2 passing through the mold structure (reference numeral 228 in FIG. 39) and the upper substrate 115 may be formed in the process step S140. A vertical channel structure VS passing through the mold structure (reference numeral 228 in FIG. 39) may be formed in the process step S145. Next, processes respectively corresponding to the process steps S50, S55, S60, S65, and S70 of FIG. 26B may be performed. For example, a trench corresponding to T of FIG. 36 passing through the mold structure (reference numeral 228 in FIG. 39) to expose the sacrificial layers (reference numeral 224 in FIG. 39) may be formed in the process step S150, a space may be formed by removing the sacrificial layers (reference numeral 224 in FIG. 39) in the process step S155, a gate may be formed in the space in the process step S160, a separation structure MS may be formed in the trench in the process step S165, and second and third peripheral contact plugs P_Pb and P_Pc passing through the second through region TH2 and extending to the peripheral interconnections 108 of the peripheral circuit structure 106 may be formed in the process step S170.

According to exemplary embodiments of the present inventive concept, the lower, intermediate, and upper gate electrodes G_L, G_M, and G_U of the gate-stack structure GS may be electrically connected to the first, second, and third peripheral interconnections 108a, 108b, and 108c of the peripheral circuit structure 106 using the first, second, and third peripheral connection plugs P_Pa, P_Pb, and P_Pc, thereby increasing a degree of integration.

According to exemplary embodiments of the present inventive concept, a plurality of the lower gate electrodes G_L arranged to be spaced apart from each other in the second direction Y may be formed in the memory block BLK. This plurality of lower gate electrodes G_L may be a plurality of ground select lines. Accordingly, one memory block BLK may be operated using the plurality of ground select lines, thereby increasing the performance of a three-dimensional semiconductor device.

As set forth above, according to exemplary embodiments of the present inventive concept, a three-dimensional semiconductor device including a gate-stack structure disposed on a peripheral circuit structure may be formed. The gate-stack structure may include a plurality of gate electrodes, and the plurality of gate electrodes may include a lower gate electrode, an intermediate gate electrode disposed on the lower gate electrode, and an upper gate electrode disposed on the intermediate gate electrode. The lower gate electrode may be electrically connected to a first peripheral interconnection of the peripheral circuit structure through a first peripheral connection plug interposed between a lower surface of the lower gate electrode and an upper surface of the first peripheral interconnection. The intermediate and upper gate electrodes may be electrically connected to second and third peripheral interconnections through second and third peripheral connection plugs passing through a through region in the gate-stack structure. In other words, since the lower, intermediate, and upper gate electrodes of the gate-stack structure are electrically connected to the first, second, and third peripheral interconnections of the peripheral circuit structure by using the first, second, and third peripheral connection plugs, the degree of integration can be increased.

While the present inventive concept has been described with reference to exemplary embodiments thereof, it will be apparent to those skilled in the art that modifications and variations could be made thereto without departing from the scope of the present inventive concept as defined by the appended claims.

What is claimed is:

1. A three-dimensional semiconductor device, comprising:
   a peripheral circuit structure disposed between a first substrate and a second substrate and including a plurality of peripheral interconnections;
   a gate-stack structure disposed on the second substrate and including a plurality of flaw electrodes stacked and spaced apart from each other in a direction perpendicular to an upper surface of the second substrate, wherein the plurality of gate electrodes include a lower gate electrode, a plurality of intermediate gate electrodes disposed on the lower gate electrode, and an upper gate electrode disposed on the plurality of intermediate gate electrodes;
   a first through region passing through the second substrate and disposed below the gate-stack structure;
   a second through region passing through the second substrate and the gate-stack structure; and
   a first peripheral connection plug passing through the first through region and electrically connecting the lower gate electrode to a first peripheral interconnection of the peripheral interconnections,
   wherein a top surface of the first peripheral connection plug is disposed below a top surface of the lower gate electrode, the three-dimensional semiconductor device further comprising:
   a second peripheral connection plug disposed on a second peripheral it of the peripheral interconnections and passing through the second through region;
   an intermediate gate contact plug disposed on an intermediate gate contact area of the intermediate gate electrodes;
   an intermediate gate interconnection connecting the intermediate gate contact plug to the second peripheral connection plug;
   a third peripheral connection plug disposed on a third peripheral interconnection of the peripheral interconnections and passim; through the second through region;
   an upper gate contact plug disposed on an upper gate contact area of the upper gate electrode; and
   an upper gate interconnection connecting the upper gate contact plug to the third peripheral connection plug.

2. The three-dimensional semiconductor device of claim 1, wherein the first peripheral connection plug is disposed between a lower surface of the lower gate electrode and an upper surface of the first peripheral interconnection,
   wherein the top surface of the first peripheral connection plug is in contact with the lower gate electrode, and
   wherein a bottom surface of the first peripheral connection plug is in contact with the first peripheral interconnection.

3. The three-dimensional semiconductor device of claim 1, further comprising:
   an interlayer insulating layer disposed between the lower gate electrode and the second substrate.

4. The three-dimensional semiconductor device of claim 3, wherein the first peripheral connection plug passes through the second substrate and the interlayer insulating layer to be electrically connected to the lower gate electrode.

5. The three-dimensional semiconductor device of claim 3, wherein the lower gate electrode includes a protrusion passing through the interlayer insulating layer to be electrically connected to the first peripheral connection plug.

6. The three-dimensional semiconductor device of claim 1, further comprising:
   a vertical channel structure passing through the gate-stack structure;
   a bit-line contact plug on the vertical channel structure; and
   a bit line on the bit-line contact plug.

7. The three-dimensional semiconductor device of claim 6, wherein the intermediate gate electrodes include the intermediate gate contact area,
   the upper gate electrode includes the upper gate contact area,
   the upper gate contact area is closer to the vertical channel structure than the intermediate gate contact area; and
   the second through region is disposed between the intermediate gate contact area and the upper gate contact area.

8. The three-dimensional semiconductor device of claim 6, wherein the first through region is disposed between the vertical channel structure and the second through region.

9. The tree-dimensional semiconductor device of claim 1, further comprising:

a tunneling dielectric, layer disposed between a lower surface of the lower gate electrode and the first peripheral connection plug.

10. A three-dimensional semiconductor device, comprising:
a peripheral circuit structure disposed on a first substrate;
a second substrate disposed on the peripheral circuit structure;
a gate-stack structure disposed on the second substrate;
a plurality of main separation structures crossing the gate-stack structure in a first direction, separating the gate-stack structure in a second direction, and passing through the gate-stack structure in a third direction, wherein the first direction and the second direction intersect each other and are parallel to an upper surface of the second substrate, and the third direction is perpendicular to the upper surface of the second substrate;
a first through region passing through the second substrate and disposed below the gate-stack structure;
a second through region passing through the second substrate and the gate-stack structure;
a first peripheral connection plug disposed in the first through region; and
a second peripheral connection plug disposed in the second through region,
wherein the first peripheral connection plug has a first end in direct contact with a lowermost portion of the gate-stack structure and a second end in direct contact with a peripheral interconnection of the peripheral circuit structure,
wherein the gate-stack structure includes a plurality of lower gate electrodes disposed on the same plane and spaced apart from each other in the second direction, intermediate gate electrodes disposed on the plurality of lower gate electrodes, and a plurality of upper gate electrodes disposed on the intermediate gate electrodes and spaced apart front each other in the second direction,
wherein the lower gate electrodes, the intermediate gate electrodes and the upper gate electrodes are disposed between a pair of main separation structures adjacent to each other among the plurality of main separation structures,
wherein the plurality of lower gate electrodes are electrically connected to a plurality of first peripheral connection plugs, the three-dimensional semiconductor device further comprising a plurality of auxiliary separation structures having end portions facing each other in the first direction between the pair of main separation structures adjacent to each other,
wherein the plurality of auxiliary separation structures pass through the gate-stack structure in the third direction.

11. The three-dimensional semiconductor device of claim 10, wherein each of the intermediate gate electrodes includes a gate connection area disposed between the end portions of the plurality of auxiliary separation structures that face each other.

12. The three-dimensional semiconductor device of claim 11, further comprising:
a gate cut region cutting the lower gate electrodes disposed between the end portions of the plurality of auxiliary separation structures that face each other.

13. The three-dimensional semiconductor device of claim 10, wherein a number of the upper gate electrodes spaced apart from each other in the second direction is greater than a number of the lower gate electrodes spaced apart from each other in the second direction, between the pair of main separation structures adjacent to each other.

14. A three-dimensional semiconductor device, comprising:
a peripheral circuit structure disposed on a first substrate, wherein the peripheral circuit structure includes a plurality of peripheral interconnections;
a second substrate disposed on the peripheral circuit structure;
a gate stack structure disposed on the second substrate and including a plurality of gate electrodes stacked in a direction perpendicular to an upper surface of the second substrate;
a first through region provided in the second substrate and located between the gate stack structure and the first substrate;
a second through region provided in the second substrate and the gate stack structure and located between the peripheral circuit structure and a gate interconnect; and
a first peripheral connection plug disposed in the first through region and connecting the gate stack structure to a first peripheral interconnection of the peripheral interconnections,
wherein a distance between the upper surface of the second substrate and a top surface of the first peripheral connection plug is smaller than a distance between an upper surface of a lowermost gate electrode among the gate electrodes and the upper surface of the second substrate, the three-dimensional semiconductor device further comprising a second peripheral connection plug disposed in the second through region and connecting the gate stack structure to a second peripheral interconnection of the peripheral interconnections,
wherein the first peripheral connection plug is connected to the lowermost gate electrode of the gate stack structure, and
wherein the second peripheral connection plug is connected to an uppermost gate electrode of the gate stack structure.

* * * * *